(12) United States Patent
Toyama

(10) Patent No.: US 12,255,275 B2
(45) Date of Patent: Mar. 18, 2025

(54) SEMICONDUCTOR LIGHT EMITTING DEVICE

(71) Applicant: ROHM CO., LTD., Kyoto (JP)

(72) Inventor: Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 697 days.

(21) Appl. No.: 17/455,141

(22) Filed: Nov. 16, 2021

(65) Prior Publication Data

US 2022/0158055 A1 May 19, 2022

(30) Foreign Application Priority Data

Nov. 19, 2020 (JP) .................. 2020-192749

(51) Int. Cl.
| | |
|---|---|
| *H01L 33/62* | (2010.01) |
| *H01L 23/00* | (2006.01) |
| *H01L 25/075* | (2006.01) |
| *H01L 33/54* | (2010.01) |
| *H01S 5/023* | (2021.01) |

(52) U.S. Cl.
CPC ............. *H01L 33/62* (2013.01); *H01S 5/023* (2021.01); *H01L 24/32* (2013.01); *H01L 24/48* (2013.01); *H01L 24/73* (2013.01); *H01L 25/0753* (2013.01); *H01L 33/54* (2013.01); *H01L 2224/32225* (2013.01); *H01L 2224/48225* (2013.01); *H01L 2224/73265* (2013.01); *H01L 2924/12041* (2013.01); *H01L 2924/12042* (2013.01)

(58) Field of Classification Search
CPC ....................................... H01S 5/023
See application file for complete search history.

(56) References Cited

U.S. PATENT DOCUMENTS

2015/0302974 A1* 10/2015 Zhao ................ H01F 41/046
336/200
2016/0099387 A1 4/2016 Tsutsui et al.

FOREIGN PATENT DOCUMENTS

| JP | 2003007911 A | 1/2003 | |
|---|---|---|---|
| JP | 2020161697 A | 10/2020 | |
| WO | WO-2010140604 A1 * | 12/2010 | ........... G02B 6/4201 |

OTHER PUBLICATIONS

Office Action and Search Report issued in Japanese Application No. 2020-192749, dated Jun. 4, 2024, with English translation.

* cited by examiner

*Primary Examiner* — Tuan N Nguyen
(74) *Attorney, Agent, or Firm* — HSML P. C.

(57) ABSTRACT

The present disclosure provideds a side-view type semiconductor light emitting device of the disclosure includes a multilayer substrate having a plurality of substrates, a plurality of conductive layers, and a plurality of semiconductor light emitting elements. The multilayer substrate has a main surface on which the semiconductor light emitting elements are mounted, a back surface facing an opposite side of the main surface and having external electrodes formed thereon, and a mounting surface intersecting both the main surface and the back surface. The plurality of conductive layers have conductive exposed portions exposed from the mounting surface.

17 Claims, 40 Drawing Sheets

SEMICONDUCTOR LIGHT EMITTING DEVICE

BACKGROUND

Field of the Disclosure

The present disclosure relates to a semiconductor light emitting device.

Description of the Prior Art

Regarding a semiconductor light emitting device mounted with a semiconductor light emitting element, a so-called side-view type semiconductor light emitting device that emits light parallel to a mounted circuit substrate is known in the prior art (for example, referring to patent publication 1). The semiconductor light emitting device above includes a plate-shaped substrate, a semiconductor light emitting element mounted on a main surface electrode formed on a main surface of the substrate, a back surface electrode formed on a back surface of the substrate, a through electrode configured in a groove formed as penetrating the substrate in a thickness direction of the substrate, and a sealing resin that seals the light emitting element.

PRIOR ART DOCUMENT

[Patent Publication]
[Patent document 1] Japan Patent Publication No. 2020-161697

SUMMARY

Problems to be Solved by the Disclosure

However, in the step of forming the sealing resin in the manufacturing process of a semiconductor light emitting device, when the positioning at which the sealing resin is formed is shifted relative to the substrate, there is a concern that the sealing resin may cover the through electrode. Thus, it is considered that the through electrode be arranged by way of not exposing the through electrode from the substrate. As a result, the sealing resin can be inhibited from covering the through electrode.

In a conventional side-view type semiconductor light emitting device, when one of a plurality of surfaces orthogonal to the main surface and the back surface of the substrate is defined as a mounting surface that faces the circuit substrate, the through electrode is exposed from the mounting surface. When the semiconductor light emitting device is mounted on the circuit substrate, the back surface electrode and the through electrode are bonded with the circuit substrate by an electrically conductive bonding material such as solder. However, if the through electrode is not exposed from the substrate, and only the back surface electrode is bonded with the circuit substrate by an electrically conductive bonding material, the electrically conductive bonding material applies a force in a direction that causes the back surface of the substrate to come close to the circuit substrate, leading to a concern that the semiconductor light emitting device may be inclined in a way that the mounting surface departs from the circuit substrate.

Technical Means for Solving the Problem

To solve the problems above, a semiconductor light emitting device includes a multilayer substrate having a plurality of substrates and a conductive layer, and a semiconductor light emitting element. The multilayer substrate has a main surface on which the semiconductor light emitting element is mounted, a back surface facing an opposite side of the main surface and having an external electrode formed thereon, and a mounting surface intersecting both the main surface and the back surface, wherein the conductive layer includes a conductive exposed portion exposed from the mounting surface and disposed apart from the main surface and the back surface in the thickness direction of the multilayer substrate.

According to the configuration above, when the semiconductor light emitting device is mounted on a circuit substrate, the conductive exposed portion exposed from the mounting surface of the multilayer substrate may be bonded with the circuit substrate by an electrically conductive bonding material. Therefore, in the mounting surface, bonding to the circuit substrate is achieved greater in part by the side of the main surface of the substrate than the back surface of the multilayer substrate, so that the semiconductor light emitting device can be securely mounted on the circuit substrate.

Effects of the Disclosure

According to the semiconductor light emitting device, the semiconductor light emitting device may be securely mounted on the circuit substrate.

DETAILED DESCRIPTION OF THE DISCLOSURE

Details of the embodiments with respect to a semiconductor light emitting device are given with the accompanying drawings below. The embodiments below are examples for illustrating specific configurations or methods based on technical concepts, and materials, shapes, structures, configurations and sizes of the constituting components are not limited to the description below.

First Embodiment

Referring to FIG. 1 to FIG. 15, a semiconductor light emitting device 1 according to the first embodiment is described below.

Figure 1:
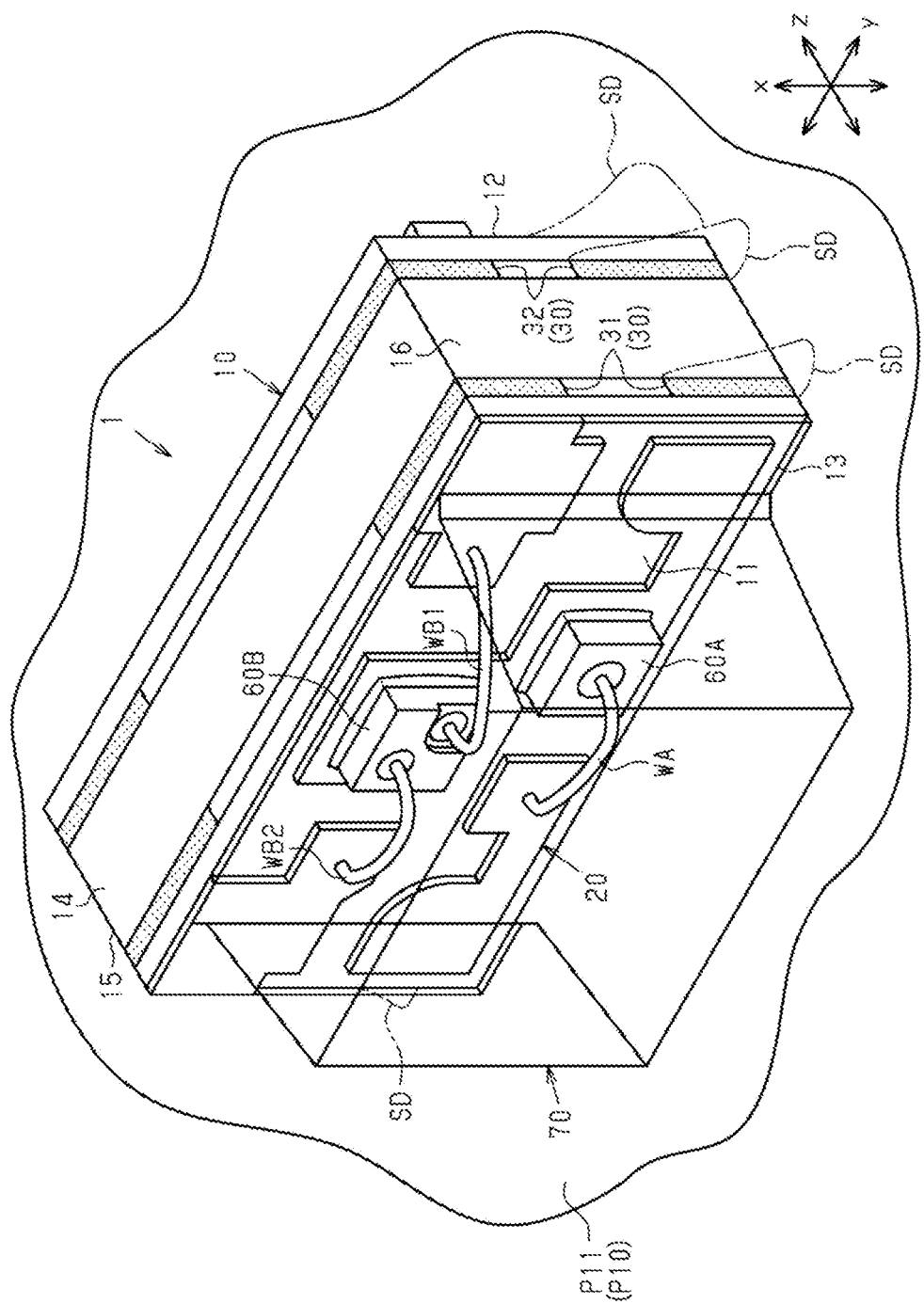
FIG. 1 is a three-dimensional diagram of a semiconductor light emitting device according to a first embodiment.
Figure 2:
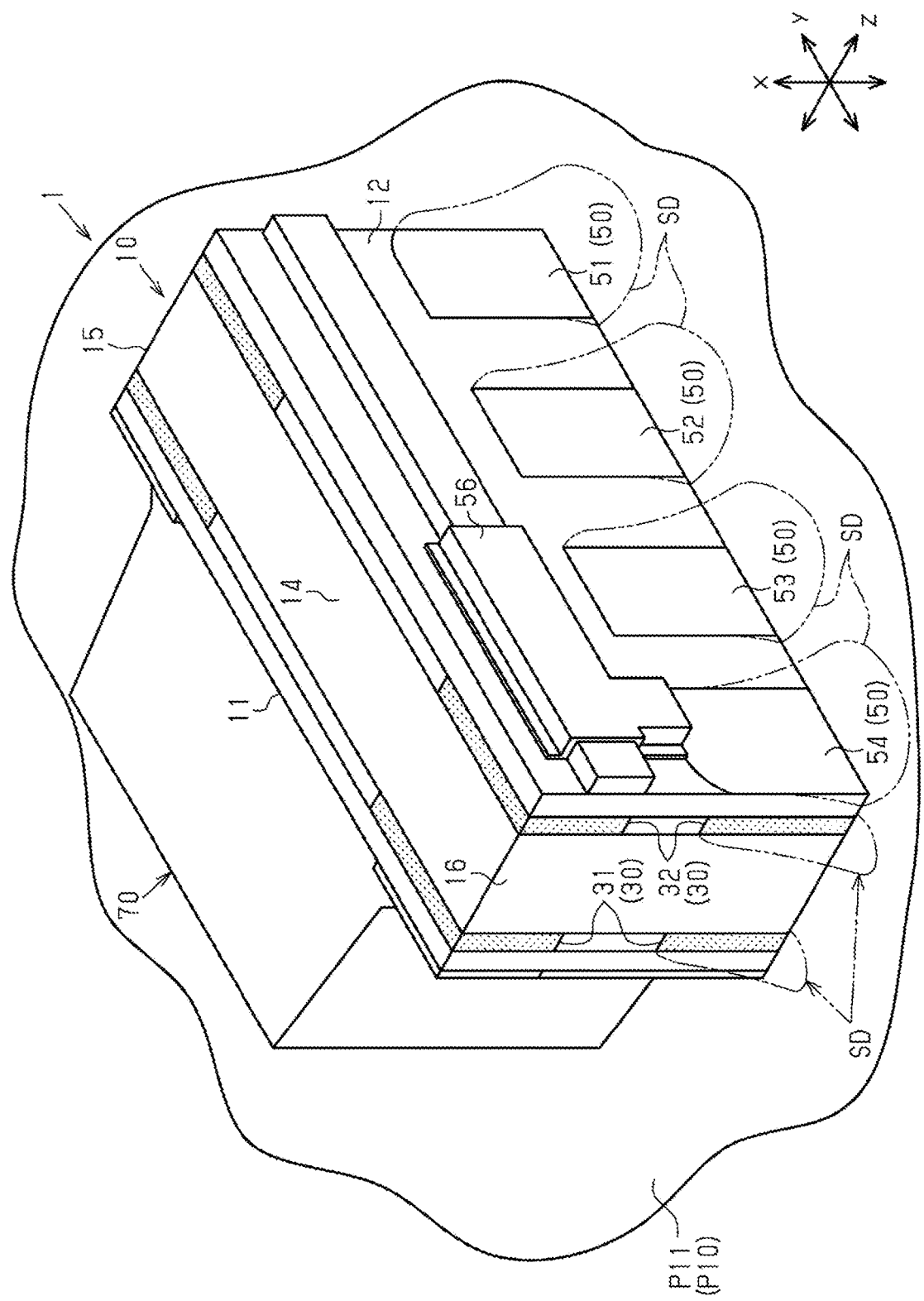
FIG. 2 is a three-dimensional diagram of a semiconductor light emitting device in FIG. 1 when observed from a different direction.

As shown in FIG. 1 and FIG. 2, the semiconductor light emitting device 1 is mounted on a circuit substrate P10 by an electrically conductive bonding material SD such as solder. The semiconductor light emitting device 1 is a side-view type semiconductor light emitting device in which a direction parallel to an upper surface P11 of the circuit substrate P10 is defined as an optical axis.

As shown in FIG. 1, the semiconductor light emitting device 1 includes a multilayer substrate 10, semiconductor light emitting elements 60A and 60B mounted on the multilayer substrate 10, lead wires WA, WB1 and WB2 connected to the semiconductor light emitting elements 60A and 60B, and a sealing resin 70 that seals the semiconductor light emitting elements 60A and 60B and the lead wires WA, WB1 and WB2. The semiconductor light emitting elements 60A and 60B are, for example, light emitting diode (LED) elements. Moreover, the semiconductor light emitting elements 60A and 60B may also be implemented by light emitting elements such as laser diodes (LD).

The multilayer substrate 10 is formed as a rectangular plate. In the description below, a thickness direction of the multilayer substrate 10 is designated as a z direction, and two directions, which are orthogonal to each other and orthogonal to the z direction, are designated as an x direction and a y direction, respectively. Thus, in the description below, "when observed in the z direction" means "when observed in the thickness direction of the multilayer substrate 10", and "in the z direction" means "in the thickness direction of the multilayer substrate 10".

Figure 3:
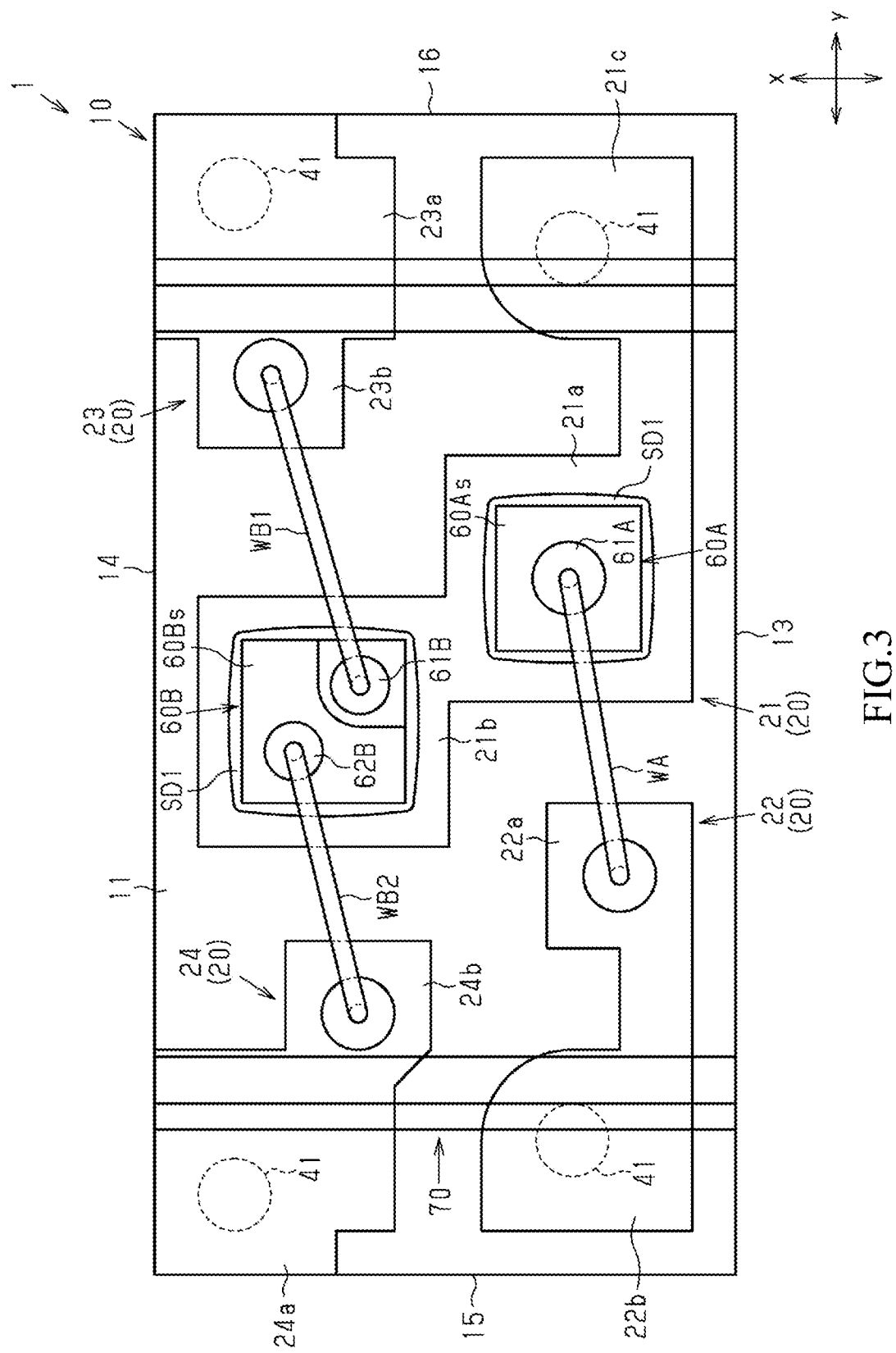
FIG. 3 is a top view of the semiconductor light emitting device in FIG. 1.

As shown in FIG. 3, when observed in the z direction, the multilayer substrate 10 is shaped as a rectangle having lengthwise sides and widthwise sides. The multilayer substrate 10 is configured as having the lengthwise sides in the y direction and the widthwise sides in the x direction. In this embodiment, the thickness of the multilayer substrate 10 (the z-direction dimension) is approximately 0.6 mm, the lengthwise (y-direction) dimension of the multilayer substrate 10 is approximately 1.6 mm, and the widthwise (x-direction) dimension of the multilayer substrate 10 is approximately 0.8 mm.

As shown in FIG. 1 to FIG. 4, the multilayer substrate 10 has a main surface 11 facing the z direction, a back surface 12 facing an opposite side of the main surface 11 in the z direction, a mounting surface 13 and an anti-mounting surface 14 intersecting both the main surface 11 and the back surface 12, a first side surface 15 and a second side surface 16 intersecting the main surface 11, the back surface 12, the mounting surface 13 and the anti-mounting surface 14. In this embodiment, the mounting surface 13 faces the x direction. The anti-mounting surface 14 faces an opposite side of the mounting surface 13 in the x direction. The first side surface 15 faces the y direction. The second side surface 16 faces an opposite side of the first side surface 15 in the y direction.

When the semiconductor light emitting device 1 is mounted on the upper surface P11 of the circuit substrate P10, the mounting surface 13 is a surface that is opposite to the upper surface P11 in a state of facing the upper surface P11. The mounting surface 13 and the anti-mounting surface 14 are two end surfaces of the multilayer substrate 10 in the x direction. The mounting surface 13 and the anti-mounting surface 14 are planes in the y direction and the z direction, respectively, and are rectangles regarding the y direction as the lengthwise direction and the z direction as the widthwise direction.

The first side surface 15 and the second side surface 16 are configured between the mounting surface 13 and the anti-mounting surface 14, and are side surfaces connecting the mounting surface 13 and the anti-mounting surface 14 in the x direction. The first side surface 15 and the second side surface 16 are two end surfaces of the multilayer substrate 10 in the y direction. The first side surface 15 and the second side surface 16 are planes in the x direction and the y direction, and in this embodiment, and are rectangles regarding the x direction as the lengthwise direction and the z direction as the widthwise direction.

As shown in FIG. 3, a wiring layer 20 formed on the main surface. The wiring layer 20 is formed of a metal layer such as Cu (copper) and a plating layer such as Ag (silver) and Au (gold). Moreover, the wiring layer 20 includes a plating layer covering a portion exposed from the sealing resin 70. The coating layer is such as Sn (tin).

The wiring layer 20 has a first wire 21, a second wire 22, a third wire 23 and a fourth wire 24. The first wire 21, the second wire 22, the third wire 23 and the fourth wire 24 are arranged apart from each other.

The first wire 21 is a wire for mounting the two semiconductor light emitting elements 60A and 60B. When observed in the z direction, the first wire 21 is disposed at a position away from the mounting surface 13. In addition, when observed in the z direction, the first wire 21 is disposed at a position away from the second side surface 16.

The first wire 21 has a first mounting portion 21a mounted with the semiconductor light emitting element 60A, a second mounting portion 21b mounted with the semiconductor light emitting element 60B, and a connection wire portion 21c for connecting to an external electrode 50 to be described later. In this embodiment, the first mounting portion 21a, the second mounting portion 21b and the connection wire portion 21c are integrated. Moreover, the first mounting portion 21a and the second mounting portion 21b may be formed individually. In this case, the second mounting portion 21b and the first mounting portion 21a are disposed apart.

The first mounting portion 21a is arranged closer to the mounting surface 13 with respect to the center of the main surface 11 in the x direction, and is closer to the second side surface 16 with respect to the center of the main surface 11 in the y direction. Thus, the semiconductor light emitting element 60A mounted on the first mounting portion 21a is arranged closer to the mounting surface 13 with respect to the center of the main surface 11 in the x direction, and is closer to the second side surface 16 with respect to the center of the main surface 11 in the y direction.

The second mounting portion 21b is arranged closer to the anti-mounting surface 14 with respect to the center of the main surface 11 in the x direction, and crosses over the center of the main surface 11 in the y direction. Thus, the semiconductor light emitting element 60B mounted on the second mounting portion 21b is arranged closer to the anti-mounting surface 14 with respect to the center of the main surface 11 in the x direction, and crosses over the center of the main surface 11 in the x direction.

The connection wire portion 21c is arranged on a position aligned with the first mounting portion 21a in the x direction, and is closer to the second side surface 16 with respect to the first mounting portion 21a in the y direction. When observed in the z direction, it may be said that, the connection wire portion 21c is arranged near the mounting surface 13 within four corners of the main surface 11 and corners near the second side surface 16.

The second wire 22 is a wire that is electrically connected to the semiconductor light emitting element 60A. The second wire 22 is arranged closer to the first side surface 15 with respect to the first mounting portion 21a in the y direction. The second wire 22 is arranged such that its edge on the side of the mounting surface 13 is aligned with an edge of the first wire 21 on the side of the mounting surface 13. When observed in the z direction, the second wire 22 is disposed at a position away from the mounting surface 13. In addition, when observed in the z direction, the second wire 22 is disposed at a position away from the first side surface 15.

The second wire 22 has a lead wire connecting portion 22a, and a connection wire portion 22b for connecting to the external electrode 50. In this embodiment, the lead wire connecting portion 22a and the connection wire portion 22b are integrated. The lead wire connecting portion 22a is formed closer to the first mounting portion 21a with respect to the connection wire portion 22b. When observed in the z direction, it may be said that, the connection wire portion 22b is arranged near the mounting surface 13 within four corners of the main surface 11 and corners near the first side surface 15.

Both the third wire 23 and the fourth wire 24 are wires that are electrically connected to the semiconductor light emitting element 60B. Both the third wire 23 and the fourth wire 24 are arranged closer to the anti-mounting surface 14 with respect to the center of the main surface 11 of the multilayer substrate 10 in the x direction. The third wire 23 and the fourth wire 24 are distributionally arranged on two sides of the second mounting portion 21b of the first wire 21.

The third wire 23 is arranged closer to the second side surface 16 with respect to the second mounting portion 21a. The third wire 23 has a body portion 23a, and a lead wire connecting portion 23b protruding from the body portion 23a.

The body portion 23a is arranged near the anti-mounting surface 14 within four corners of the main surface 11 and corners near the second side surface 16. When observed in the z direction, between two end edges of the body portion 23a in the y direction, the end edge near the second side surface 16 is formed at the same position as the second side surface 16. When observed in the z direction, between two end edges of the body portion 23a in the x direction, the end edge near the anti-mounting surface 14 is formed at the same position as the anti-mounting surface 14. The lead wire connecting portion 23b is formed closer to the second mounting portion 21b with respect to the body portion 23a.

The fourth wire 24 is arranged closer to the first side surface 15 with respect to the second mounting portion 21b. The fourth wire 24 has a body portion 24a, and a lead wire connecting portion 24b protruding from the body portion 24a.

The body portion 24a is arranged near the anti-mounting surface 14 within four corners of the main surface 11 and corners near the first side surface 15. When observed in the z direction, between two end edges of the body portion 24a in the y direction, the end edge near the first side surface 15 is formed at the same position as the first side surface 15. When observed in the z direction, between two end edges of the body portion 24a in the x direction, the end edge near the anti-mounting surface 14 is formed at the same position as the anti-mounting surface 14. The lead wire connecting portion 24b is formed closer to the second mounting portion 21b with respect to the body portion 24a.

Figure 5:
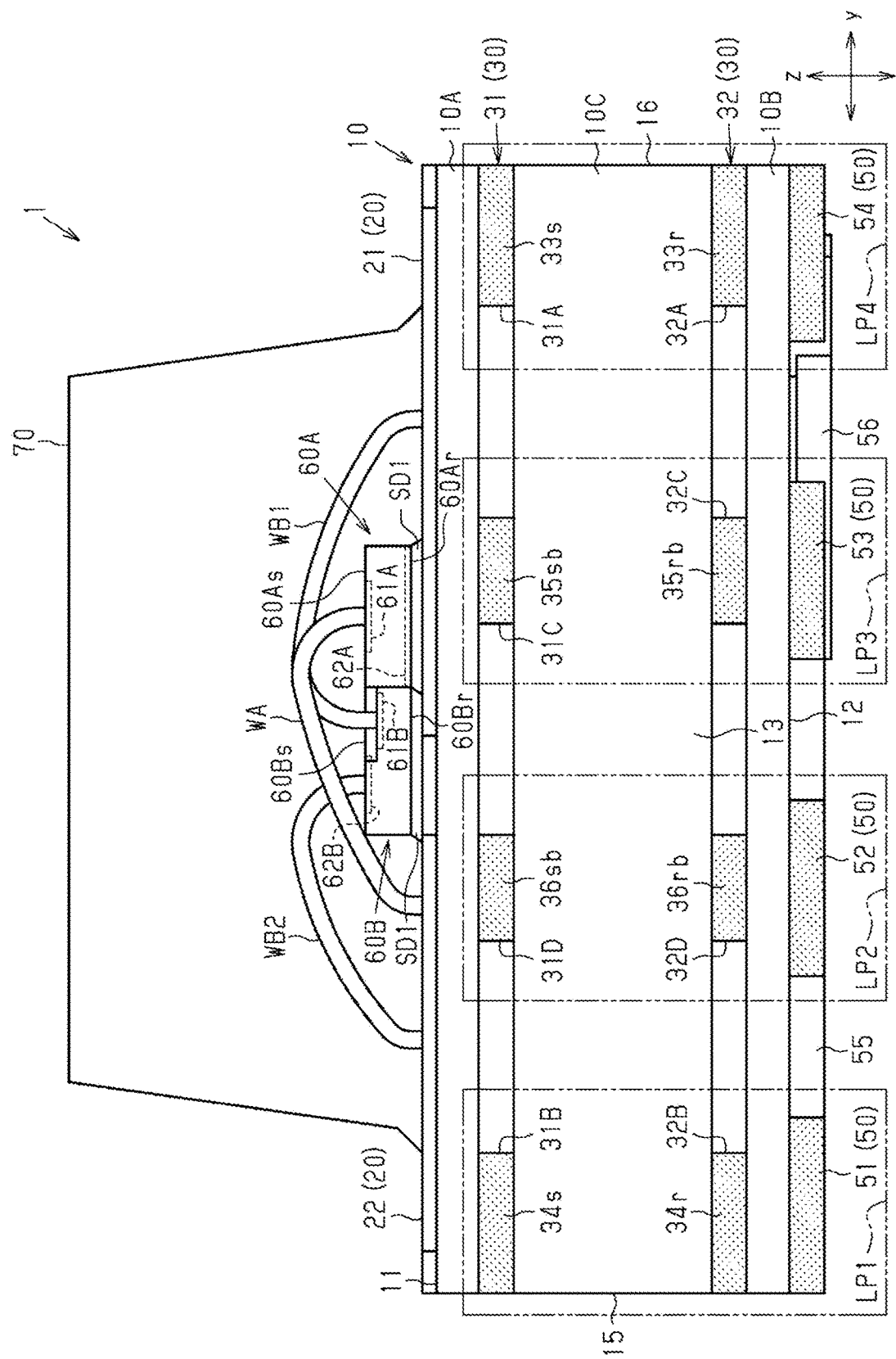
FIG. 5 is a side view of the semiconductor light emitting device in FIG. 1.

As shown in FIG. 3 and FIG. 5, the semiconductor light emitting element 60A is mounted on the first mounting portion 21a by an electrically conductive bonding material SD1 such as solder or an Ag solder paste. The semiconductor light emitting element 60A has an element main surface 60As and an element back surface 60Ar facing opposite sides in the z direction. A first electrode 61A is formed on the element main surface 60As, and a second electrode 62A is formed on the element back surface 60As. The semiconductor light emitting element 60A is, for example, a light emitting element emitting yellow light. The semiconductor light emitting element 60A is arranged as having the element main surface 60As face the same side as the main surface 11. Thus, the element back surface 60Ar and the first mounting portion 21a are bonded by the electrically conductive bonding material SD1. Accordingly, the second electrode 62A is electrically connected to the first wire 21. That is to say, the first wire 21 may be deemed as a wire that is connected to the semiconductor light emitting element 60A. The element main surface 60As forms a light emitting surface of the semiconductor light emitting element 60A. The first electrode 61A is connected to the lead wire WA. The lead wire WA is connected to the lead wire connecting portion 22a of the second wire 22. Accordingly, the first electrode 61A is electrically connected to the second wire 22.

Figure 6:
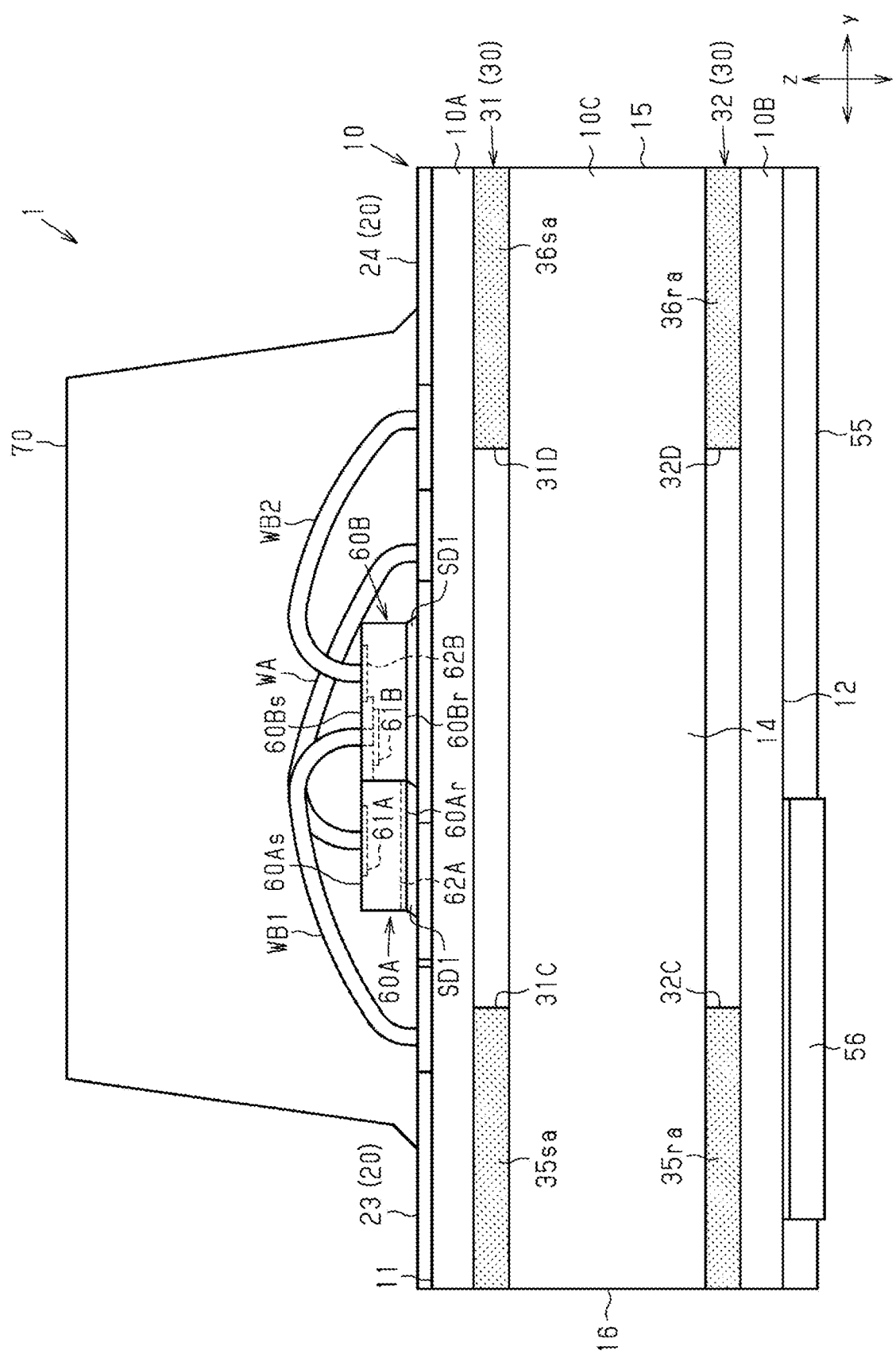
FIG. 6 is a top view of the semiconductor light emitting device in FIG. 1, when observed in an opposite side from that in FIG. 5.

As shown in FIG. 3 and FIG. 6, the semiconductor light emitting element 60B is mounted on the second mounting portion 21b by the electrically conductive bonding material SD1. Moreover, the semiconductor light emitting element 60B is mounted on the second mounting portion 21b by a non-electrically conductive bonding material, that is, an electrically insulating bonding material in substitution for the electrically conductive bonding material SD1. Such type of bonding material is, for example, an adhesive containing an epoxy resin.

The semiconductor light emitting element 60B has an element main surface 60Bs and an element back surface 60Br facing opposite sides in the z direction. Both a first electrode 61B and a second electrode 62B are formed on the element main surface 60Bs. The semiconductor light emitting element 60B is, for example, a light emitting element emitting blue light. The semiconductor light emitting element 60B is arranged as having the element main surface 60Bs face the same side as the main surface 11. Thus, the element back surface 60Br and the second mounting portion 21b are bonded by the electrically conductive bonding material SD1. The element main surface 60Bs forms a light emitting surface of the semiconductor light emitting element 60B.

The first electrode 61B is connected to the lead wire WB1, and the second electrode 62B is connected to the lead wire WB2. The lead wire WB1 is connected to the lead wire connecting portion 23b of the third wire 23. Accordingly, the first electrode 61B is electrically connected to the third wire 23. The lead wire WB2 is connected to the lead wire connecting portion 24b of the fourth wire 24. Accordingly, the second electrode 62B is electrically connected to the fourth wire 24.

Each of the lead wires WA, WB1 and WB2 includes a metal material such as Au, Al, Cu and Ag, and is, for example, a bonding wire formed by a lead wire bonding device.

As shown in FIG. 3, FIG. 5 and FIG. 6, the sealing resin 70 is formed on the main surface 11 of the multilayer substrate 10. The sealing resin 70 includes, for example, a transparent or semi-transparent electrically insulating resin material, and in this embodiment, includes a transparent epoxy. In this embodiment, the sealing resin 70 is located inside with respect to the first side surface 15 and the second side surface 16 in the y direction. The sealing resin 70 is shaped as a trapezoid, when observed in the x direction. Between two resin surfaces of the sealing resin 70 facing the x direction, the surface facing the same side as the mounting surface 13 is flush with the mounting surface 13. Between two resin surfaces of the sealing resin 70 facing the x direction, the surface facing the same side as the anti-mounting surface 14 is flush with the anti-mounting surface 14.

Figure 4:
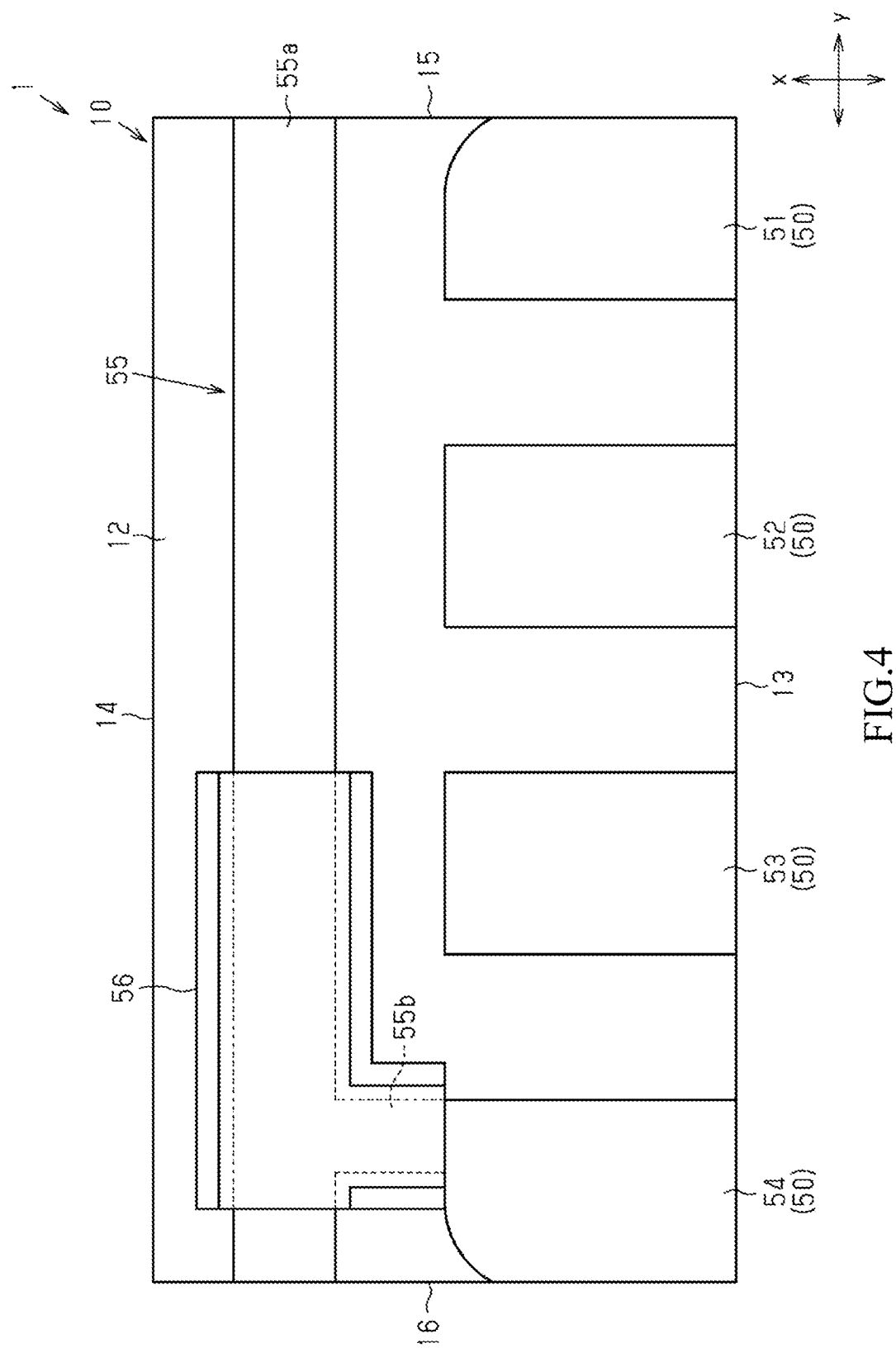
FIG. 4 is a rear view of the semiconductor light emitting device in FIG. 1.

As shown in FIG. 4, the external electrode 50 is formed on the back surface 12. The external electrode 50 is a layered structure including a metal layer such as Au, Cu, Ag and Ni, and a coating layer such as Sn formed on the metal layer. Thus, the thickness of the external electrode 50 is greater than the thickness of the wiring layer 20. The coating layer is formed by, for example, electroplating.

The external electrode 50 includes a plurality of external electrodes, that is, a first external electrode 51, a second external electrode 52, a third external electrode 53 and a fourth electrode 54. That is to say, the external electrode is arranged in plural form.

The external terminals 51 to 54 are disposed apart from each other in the y direction in a state of being aligned with each other in the x direction. In this embodiment, the first external electrode 51, the second external electrode 52, the third external electrode 53 and the fourth external electrode 54 are sequentially arranged from the first side surface 15 to the second side surface 16. When observed from the back surface 12, the external electrodes 51 to 54 are shaped as substantially rectangles regarding the x direction as the lengthwise direction and the y direction as the widthwise direction. When observed in the z direction, between two end edges of each of the external electrodes 51 to 54 in the x direction, the end edge near the mounting surface 13 is formed at the same position as the mounting surface 13. When observed in the z direction, between the two end edges of the first external electrode 51 in the x direction, the end edge near the first side surface 15 is formed at the same position as the first side surface 15. When observed in the z direction, between the two end edges of the fourth external electrode 54 in the x direction, the end edge near the second side surface 16 is formed at the same position as the second side surface 16.

The first external electrode 51 is an external electrode electrically connected to the second wire 22. The second external electrode 52 is an external electrode electrically connected to the fourth wire 24. The third external electrode 53 is an external electrode electrically connected to the third wire 23. The fourth external electrode 54 is an external electrode electrically connected to the first wire 21. As such, the first external electrode 51 and the fourth external electrode 54 are electrically connected to the semiconductor light emitting element 60A. The second external electrode 52 and the third external electrode 53 are electrically connected to the semiconductor light emitting element 60B.

As shown in FIG. 4, a connecting wiring portion 55 is formed on the back surface 12. The connection wire portion 55 includes a first wire portion 55a extending in the y direction, and a second wire portion 55b branched from the first wire portion 55a and extending in the x direction. The second wire portion 55b is connected to the fourth external electrode 54. The connection wire portion 55 forms a conducting path for performing electroplating for forming a plating layer of the fourth external electrode 54.

A resist layer 56 is provided on a portion of the connection wire portion 55. The resist layer 56 is provided depending on the polarity (a connection means of the semiconductor light emitting device 1) of the semiconductor light emitting device 1, and is shaped as a symmetrical shape when observed in the z direction. When the semiconductor light emitting device 1 is mounted on the circuit substrate P10, the resist layer 56 inhibits the electrically conductive bonding material SD from crawling from the external electrodes 51 to 54 to the anti-mounting surface 14. Therefore, electrical connection caused by the electrically conductive bonding material SD between the first wire portion 55a and an outer conductive exposed portion 35ra (to be described later) can be inhibited. In this embodiment, the resist layer 56 is formed to cover a portion of the first wire portion 55a and the second wire portion 55b.

The resist layer 56 includes an electrically insulating material, and is formed by, for example, curing a thin-film resist layer adhered on the back surface 12. Moreover, the resist layer 56 may also be implemented by a liquid resist.

Next, the structure of the multilayer substrate 10 is described in detail below.

As shown in FIG. 5 and FIG. 6, the multilayer substrate 10 has a plurality of substrates and a conductive layer. In an example, the multilayer substrate 10 has a first substrate 10A, a second substrate 10B and a third substrate 10C, and at least one conductive layer 30 formed between the first substrate 10A and the third substrate 10C and between the third substrate 10C and the second substrate 10B. In this embodiment, the conductive layer 30 is formed between the first substrate 10A and the third substrate 10C, and between the third substrate 10C and the second substrate 10B.

The first substrate 10A, the second substrate 10B and the third substrate 10C are respectively materials containing electrically insulating materials, for example, containing an epoxy resin or acrylic resin. In this embodiment, each of the substrates 10A to 10C contains an epoxy resin. The first substrate 10A, the second substrate 10B and the third substrate 10C are layered in the z direction. The third substrate 10C is arranged in a layering direction, that is, the z direction, between the first substrate 10A and the second substrate 10B. In this embodiment, the thickness (the z-direction dimension) of the third substrate 10C is greater than the thickness of the first substrate 10A and the thickness of the second substrate 10B. The thickness of the first substrate 10A and the thickness of the substrate 10B are equal to each other. Moreover, the thicknesses of the substrates 10A to 10C can be modified as desired. For example, the thickness of the first substrate 10A and the thickness of the substrate 10B may be different from each other. In addition, the third substrate 10C may also be electrically insulative, and is formed by layering a plurality of substrates.

The conductive layer 30 is a layer forming a part of a conducting path connecting the wiring layer 20 and the external electrode 50, and includes, for example, Cu. The conductive layer 30 includes a first conductive layer 31 formed between the first substrate 10A and the third substrate 10C, and a second conductive layer 32 formed between the second substrate 10B and the third substrate 10C. The conductive layers 31 and 32 are arranged at positions separated from both the main surface 11 and the back surface 12 of the multilayer substrate 10 in the z direction.

Figure 8:
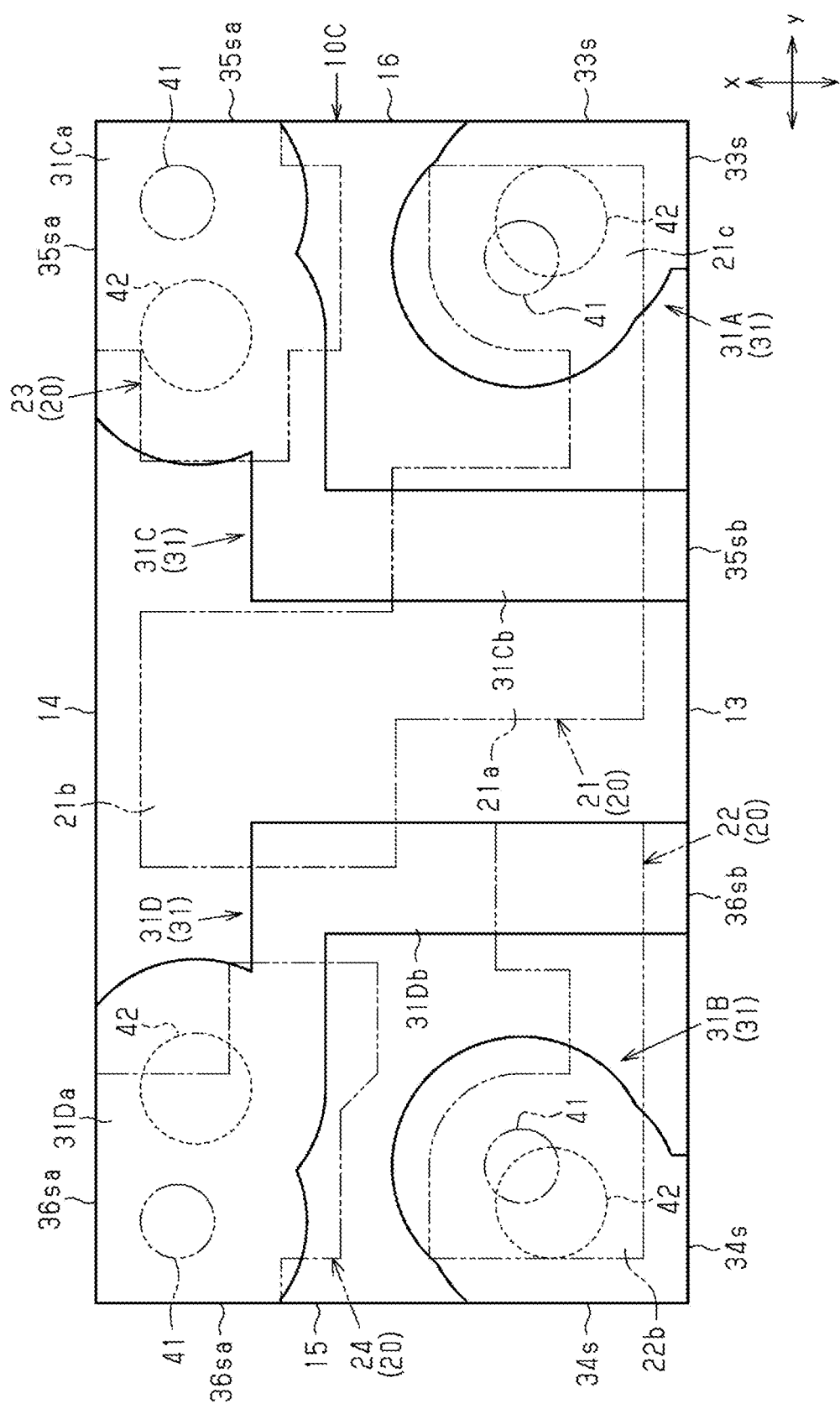
FIG. 8 is a top view of an example of a structure in a multilayer substrate in the semiconductor light emitting device in FIG. 1.
Figure 9:
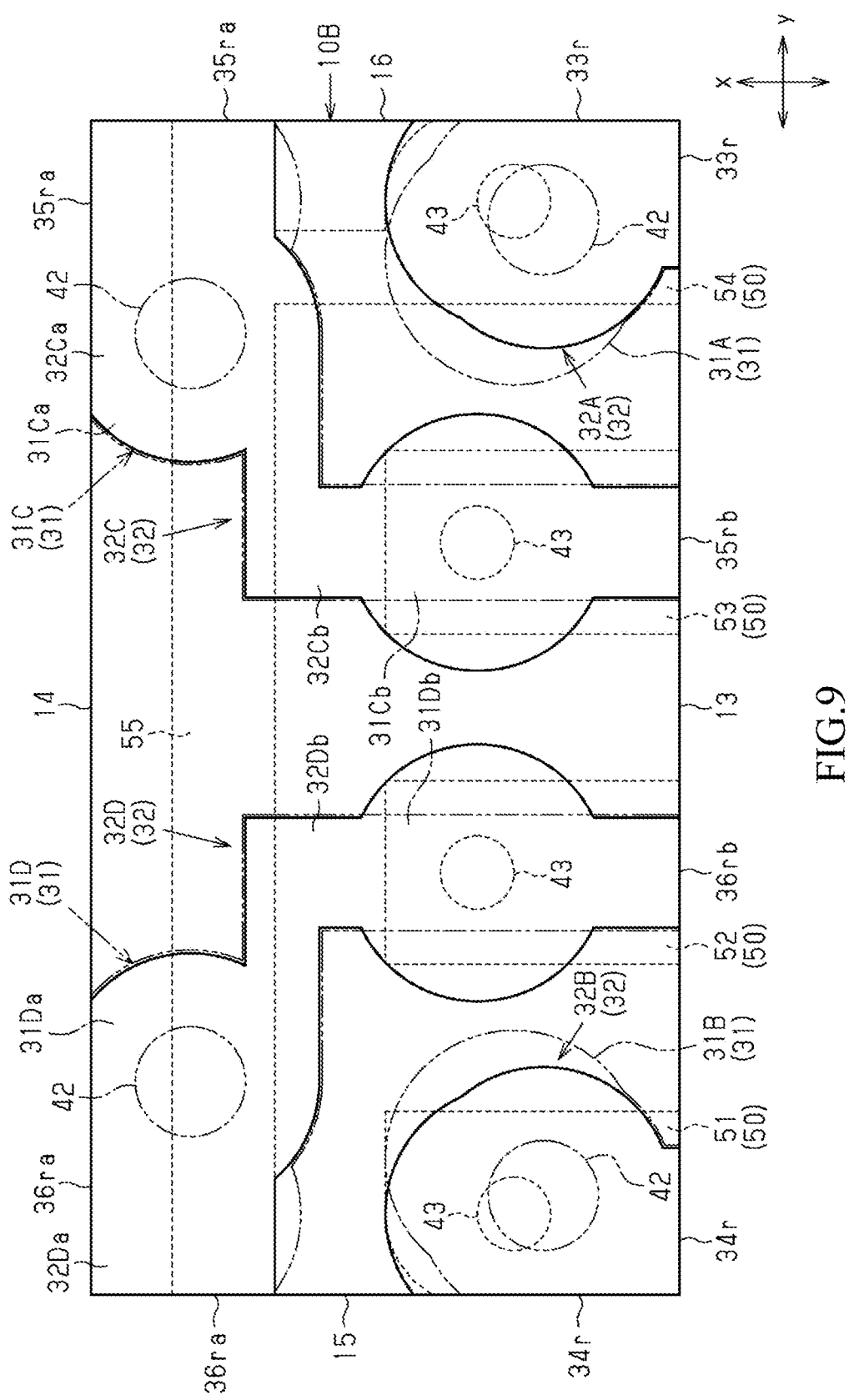
FIG. 9 is a top view of an example of a structure in a multilayer substrate in the semiconductor light emitting device in FIG. 1.

In addition, the multilayer substrate 10 includes a main surface side connection electrode 41 connecting the wiring layer 20 and the first conductive layer 31 (referring to FIG. 3), an intermediate connection layer 42 connecting the first conductive layer 31 and the second conductive layer 32 (referring to FIG. 8), and a back surface side connection electrode 43 connecting the second conductive layer 32 and the external electrode 50 (referring to FIG. 9). The main surface side connection electrode 41 penetrates the first substrate 10A in the z direction, and includes a via, for example. The intermediate connection electrode 42 penetrates the third substrate 10C in the z direction, and includes a conducting via, for example. The back surface side connection electrode 43 penetrates the second substrate 10B, and includes a via, for example. The connection electrodes 41 to 43 include such as Cu. Moreover, the intermediate connection electrode 42 having a conducting via includes a cylindrical conductive film (e.g., a Cu coating film) formed in an inner surface of a through via penetrating the third substrate 10C. In addition, the intermediate connection electrode 42 may be a cylindrical conductive film having a hollow on the inside, or may having a resin or a metal such as Cu filling the hollow on the inside.

FIG. 8 shows a position relation of the first conductive layer 31 formed on the third substrate 10C and the intermediate connection electrode 42, the wiring layer 20 and the main surface side connection electrode 41. For better illustration, the wiring layer 20 and the main surface side connection electrode 41 are represented by double-dot dotted lines.

As shown in FIG. 8, the first conductive layer 31 is formed on a main surface of the third substrate 10C. The first conductive layer 31 has a first main surface side wire 31A connected to the first wire 21, a second main surface side wire 31B connected to the second wire 22, a third main surface side wire 31C connected to the third wire 23, and a fourth main surface side wire 31D connected to the fourth wire 24.

As shown by the double-dotted lines in FIG. 8, the main surface side connection electrode 41 is arranged in plural form (four in this embodiment) by way of individually connecting the main surface side wires 31A to 31D and the wires 21 to 24. Moreover, as shown by the double-dot dotted lines in FIG. 8, the intermediate connection electrode 42 is arranged in plural form (four in this embodiment) by way of individually being connected to the main surface side wires 31A to 31D. In this embodiment, when observed in the z direction, the main surface side connection electrodes 41 and the intermediate connection electrodes 42 are shaped as circles.

In this embodiment, when observed in the z direction, each main surface side electrode 41 is arranged inside with respect to an outer periphery of the multilayer substrate 10. Thus, when observed in the x direction and the y direction, that is, when observed from the side of the multilayer substrate 10, each main surface side connection electrode 41 is exposed from the multilayer substrate 10. Moreover, when observed in the z direction, each intermediate connection electrode 42 is arranged inside with respect to the outer periphery of the multilayer substrate 10. Thus, when observed from the side of the multilayer substrate 10, each intermediate connection electrode 42 is not exposed from the multilayer substrate 10.

When observed in the z direction, the first main surface side wire 31A is disposed at a position coinciding with the first wire 21. More specifically, when observed in the z direction, the first main surface side wire 31A is disposed at a position coinciding with the connection wire portion 21c of the first wire 21. The first main surface side wire 31A is connected to the connection wire portion 21c by the main surface side connection electrode 41.

When observed in the z direction, between two end edges of the first main surface side wire 31A in the x direction, the end edge near the mounting surface 13 is formed at the same position as the mounting surface 13. That is to say, as shown in FIG. 5, the first main surface side wire 31A is exposed from the mounting surface 13. The first main surface side wire 31A has an outer conductive exposed portion 33s exposed from the mounting surface 13.

When observed in the z direction, between two end edges of the first main surface side wire 31A in the y direction, the end edge near the second side surface 16 is formed at the same position as the second side surface 16. That is to say, the outer conductive exposed portion 33s is also exposed from the second side surface 16. The outer conductive exposed portion 33s is arranged across from the second side surface 16 to the mounting surface 13, and is continuously exposed from the multilayer substrate 10. That is to say, a portion of the outer conductive exposed portion 33s exposed from the mounting surface 13 is connected to a portion exposed from the second side surface 16. Thus, when observed from the mounting surface 13, the outer conductive exposed portion 33s extends from, between two end edges of the mounting surface 13 in the y direction, the end edge close to the second side surface 16 in the y direction. Moreover, when observed from the second side surface 16, the outer conductive exposed portion 33s extends from, between two end edges of the second side surface 16 in the x direction, the end edge close to the mounting surface 13 in the x direction. In this embodiment, a portion of the outer conductive exposed portion 33s exposed from the second side surface 16 corresponds to an exposed portion of a side surface.

The intermediate connection electrode 42 is connected to the first main surface side wire 31A. In this embodiment, when observed in the z direction, the main surface side connection electrode 41 connected to the first main surface side wire 31A is arranged as partially coinciding with the intermediate connection electrode 42.

When observed in the z direction, the second main surface side wire 31B is disposed at a position coinciding with the second wire 22. More specifically, when observed in the z direction, the second main surface side wire 31B is disposed at a position coinciding with the connection wire portion 22b of the second wire 22. The second main surface side wire 31B is connected to the connection wire portion 22b by the main surface side connection electrode 41. In this embodiment, when observed in the z direction, the second main surface side wire 31B is shaped as a shape symmetrical to the first main surface side wire 31A with respect to an imaginary line extending in the x direction from the center of the third substrate 10C in they direction.

When observed in the z direction, between two end edges of the second main surface side wire 31B in the x direction, the end edge near the mounting surface 13 is formed at the same position as the mounting surface 13. That is to say, as shown in FIG. 5, the second main surface side wire 31B is exposed from the mounting surface 13. The second main surface side wire 31B has an outer conductive exposed portion 34s exposed from the mounting surface 13.

As shown in FIG. 8, when observed in the z direction, between two end edges of the second main surface side wire 31B in the y direction, the end edge near the first side surface 15 is formed at the same position as the first side surface 15. That is to say, the outer conductive exposed portion 34s is also exposed from the first side surface 15. The outer conductive exposed portion 34s is arranged across from the first side surface 15 to the mounting surface 13, and is continuously exposed from the multilayer substrate 10. That is to say, a portion of the outer conductive exposed portion 34s exposed from the mounting surface 13 is connected to a portion exposed from the first side surface 15. Thus, when observed from the mounting surface 13, the outer conductive exposed portion 34s extends from, between two end edges of the mounting surface 13 in the y direction, the end edge close to the first side surface 15 in they direction. Moreover, when observed from the first side surface 15, the outer conductive exposed portion 34s extends from, between two end edges of the first side surface 15 in the x direction, the end edge close to the mounting surface 13 in the x direction. In this embodiment, a portion of the outer conductive exposed portion 34s exposed from the first side surface 15 corresponds to an exposed portion of a side surface.

The intermediate connection electrode 42 is connected to the second main surface side wire 31B. In this embodiment, when observed in the z direction, the main surface side connection electrode 41 connected to the second main surface side wire 31B is arranged as partially coinciding with the intermediate connection electrode 42.

When observed in the z direction, the third main surface side wire 31C is disposed at a position coinciding with third wire 23. The third main surface side wire 31C has a connection wire portion 31Ca coinciding with the third wire 23 when observed in the z direction, and an extension portion 31Cb extending from the connection wire portion 31Ca toward the mounting surface 13. In this embodiment, the connection wire portion 31Ca and the extension portion 31Cb are integrated. When observed in the z direction, the extension portion 31Cb is disposed at a position non-coinciding with third wire 23. The connection wire portion 31Ca is connected to the third wire 23 by the main surface side connection electrode 41.

When observed in the z direction, between two end edges of the connection wire portion 31Ca in the x direction, the end edge near the anti-mounting surface 14 is formed at the same position as the anti-mounting surface 14. That is to say, as shown in FIG. 6, the third main surface side wire 31C is exposed from the anti-mounting surface 14. The third main surface side wire 31C has an outer conductive exposed portion 35sa exposed from the anti-mounting surface 14. In this embodiment, the outer conductive exposed portion 35sa corresponds to a conductive exposed portion on an opposite side.

As shown in FIG. 8, when observed in the z direction, between two end edges of the connection wire portion 31Ca in the y direction, the end edge near the second side surface 16 is formed at the same position as the second side surface 16. That is to say, the outer conductive exposed portion 35sa is also exposed from the second side surface 16. The outer conductive exposed portion 35sa is arranged across from the second side surface 16 to the anti-mounting surface 14, and is continuously exposed from the multilayer substrate 10. That is to say, a portion of the outer conductive exposed portion 35sa exposed from the anti-mounting surface 14 is connected to a portion exposed from the second side surface 16. Thus, when observed from the mounting surface 14, the outer conductive exposed portion 35sa extends from, between two end edges of the anti-mounting surface 14 in the y direction, the end edge close to the second side surface 16 in the y direction. Moreover, when observed from the second side surface 16, the outer conductive exposed portion 35sa extends from, between two end edges of the second side surface 16 in the x direction, the end edge close to the anti-mounting surface 14 in the x direction. In this embodiment, a portion of the outer conductive exposed portion 35sa exposed from the second side surface 16 corresponds to an exposed portion of a side surface.

The connection wire portion 31Ca is connected to the intermediate connection electrode 42. In this embodiment, when observed in the z direction, the main surface side connection electrode 41 connected to the connection wire portion 31Ca is arranged as non-coinciding with the intermediate connection electrode 42.

When observed in the z direction, a front end edge of the extension portion 31Cb is formed at a same position as the mounting surface 13. That is to say, as shown in FIG. 5, the third main surface side wire 31C is exposed from the mounting surface 13. The third main surface side wire 31C has an inner conductive exposed portion 35sb exposed from the mounting surface 13. The inner conductive exposed portion 35sb is arranged between the outer conductive exposed portion 33s of the first main surface side wire 31A and the outer conductive exposed portion 34s of the second main surface side wire 31B in the y direction. The inner conductive exposed portion 35sb is disposed closer to the outer conductive exposed portion 33s with respect to the center of the multilayer substrate 10 in the y direction.

When observed in the z direction, the fourth main surface side wire 31D is disposed at a position coinciding with fourth wire 24. In this embodiment, when observed in the z direction, the fourth main surface side wire 31D is shaped as a shape symmetrical to the third main surface side wire 31C with respect to an imaginary line extending in the x direction from the center of the second substrate 10B in the y direction. The fourth main surface side wire 31D has a connection wire portion 31Da coinciding with the fourth wire 24 when observed in the z direction, and an extension portion 31db extending from the connection wire portion 31Da to the mounting surface 13. In this embodiment, the connection wire portion 31Da and the extension portion 31db are integrated. When observed in the z direction, the extension portion 31db is disposed at a position non-coinciding with fourth wire 24. The connection wire portion 31Da is connected to the fourth wire 24 by the main surface side connection electrode 41.

When observed in the z direction, between two end edges of the connection wire portion 31Da in the x direction, the end edge near the anti-mounting surface 14 is formed at the same position as the anti-mounting surface 14. That is to say, as shown in FIG. 6, the fourth main surface side wire 31D is exposed from the anti-mounting surface 14. The fourth main surface side wire 31D has an outer conductive exposed portion 36sa exposed from the anti-mounting surface 14. In this embodiment, the outer conductive exposed portion 36sa corresponds to a conductive exposed portion on an opposite side.

As shown in FIG. 8, when observed in the z direction, between two end edges of the connection wire portion 31Da in the y direction, the end edge near the first side surface 15 is formed at the same position as the first side surface 15. That is to say, the outer conductive exposed portion 36sa is also exposed from the first side surface 15. The outer conductive exposed portion 36sa is arranged across from the first side surface 15 to the anti-mounting surface 14, and is continuously exposed from the multilayer substrate 10. That is to say, a portion of the outer conductive exposed portion 36sa exposed from the anti-mounting surface 14 is connected to a portion exposed from the first side surface 15. Thus, when observed from the anti-mounting surface 14, the outer conductive exposed portion 36sa extends from, between two end edges of the anti-mounting surface 14 in the y direction, the end edge close to the first side surface 15 in the y direction. Moreover, when observed from the first side surface 15, the outer conductive exposed portion 36sa extends from, between two end edges of the first side surface 15 in the x direction, the end edge close to the anti-mounting surface 14 in the x direction. In this embodiment, a portion of the outer conductive exposed portion 35sa exposed from the second side surface 16 corresponds to an exposed portion of a side surface.

The connection wire portion 31Da is connected to the intermediate connection electrode 42. In this embodiment, when observed in the z direction, the main surface side connection electrode 41 connected to the connection wire portion 31Da is arranged as non-coinciding with the intermediate connection electrode 42.

When observed in the z direction, a front end edge of the extension portion 31db is formed at a same position as the mounting surface 13. That is to say, as shown in FIG. 5, the fourth main surface side wire 31D is exposed from the mounting surface 13. The fourth main surface side wire 31D has an inner conductive exposed portion 36sb exposed from the mounting surface 13. The inner conductive exposed portion 36sb is arranged between the outer conductive exposed portion 33s of the first main surface side wire 31A and the outer conductive exposed portion 34s of the second main surface side wire portion 31B in the y direction. The inner conductive exposed portion 36sb is disposed closer to the outer conductive exposed portion 34s with respect to the center of the multilayer substrate 10 in the y direction.

FIG. 9 shows a position relation of the second conductive layer 32 formed on the third substrate 10C and the intermediate connection electrode 42, and the external electrode 50 and the back surface side connection electrode 43. In addition, for illustration purposes, in FIG. 9, solid lines are used to represent the second conductive layer 32 and the intermediate connection electrode 42, double-dot dotted lines are used to represent the first conductive layer 31, and dotted lines are used to represent the external electrode 50 and the back surface side connection electrode 43.

The second conductive layer 32 is formed on a back surface of the third substrate 10C (referring to FIG. 8). For illustration purposes, FIG. 9 shows a state in which the second conductive layer 32 is disposed on a main surface of the second substrate 10B. As shown in FIG. 9, the second conductive layer 32 has a first back surface side wire 32A connected to the first main surface side wire 31A, a second back surface side wire 32B connected to the second main surface side wire 31B, a third back surface side wire 32C connected to the third main surface side wire 31C, and a fourth back surface side wire 32D connected to the fourth main surface side wire 31D.

As shown by the dotted lines in FIG. 9, the back surface side connection electrode 43 is arranged in plural form (four in this embodiment) by way of individually connecting the back surface side wires 32A to 32D and the external electrodes 51 to 54. Moreover, the plurality of intermediate connection electrodes 42 are individually connected to the back surface side wires 32A to 32D. That is to say, the plurality of intermediate connection electrodes 42 individually connect the main surface side wires 31A to 31D and the back surface side wires 32A to 32D. In this embodiment, when observed in the z direction, the back surface side connection electrodes 43 are shaped as circles.

In this embodiment, when observed in the z direction, each back surface side electrode 43 is arranged inside with respect to the outer periphery of the multilayer substrate 10. Thus, when observed from the side of the multilayer substrate 10, the back surface side connection electrode 43 are not exposed from the multilayer substrate 10.

When observed in the z direction, the first back surface side wire 32A is disposed at a position coinciding with the first main surface side wire 31A. The first back surface side wire 32A is connected to the first main surface side wire 31A by the intermediate connection electrode 42. When observed in the z direction, the first back surface side wire 32A is disposed at a position coinciding with the fourth external electrode 54. The first back surface side wire 32A is connected to the fourth external electrode 54 by the back surface side connection electrode 43. As such, the first wire 21 is electrically connected to the fourth external electrode 43 by the main surface side connection electrode 41, the first main surface side wire 31A, the intermediate connection electrode 42, the first back surface side wire 32A and the back surface side connection electrode 43.

When observed in the z direction, between two end edges of the first back surface side wire 32A in the x direction, the end edge near the mounting surface 13 is formed at the same position as the mounting surface 13. That is to say, as shown in FIG. 5, the first back surface side wire 32A is exposed from the mounting surface 13. The first back surface side wire 32A has an outer conductive exposed portion 33r exposed from the mounting surface 13.

When observed in the z direction, between two end edges of the first back surface side wire 32A in the y direction, the end edge near the second side surface 16 is formed at the same position as the second side surface 16. That is to say, the outer conductive exposed portion 33r is also exposed from the second side surface 16. The outer conductive exposed portion 33r is arranged across from the second side surface 16 to the mounting surface 13, and is continuously exposed from the multilayer substrate 10. That is to say, a portion of the outer conductive exposed portion 33r exposed from the mounting surface 13 is connected to a portion exposed from the second side surface 16. Thus, when observed from the mounting surface 13, the outer conductive exposed portion 33r extends from, between two end edges of the mounting surface 13 in the y direction, the end edge close to the second side surface 16 in the y direction. Moreover, when observed from the second side surface 16, the outer conductive exposed portion 33r extends from, between two end edges of the second side surface 16 in the x direction, the end edge close to the mounting surface 13 in the x direction. In this embodiment, a portion of the outer conductive exposed portion 33r exposed from the second side surface 16 corresponds to an exposed portion of a side surface.

When observed in the z direction, the second back surface side wire 32B is disposed at a position coinciding with the second main surface side wire 31B. The second back surface side wire 32B is connected to the second main surface side wire 31B by the intermediate connection electrode 42. When observed in the z direction, the second back surface side wire 32B is disposed at a position coinciding with the first external electrode 51. The second back surface side wire 32B is connected to the first external electrode 51 by the back surface side connection electrode 43. As such, the second wire 22 is electrically connected to the second external electrode 25 by the main surface side connection electrode 41, the second main surface side wire 31B, the intermediate connection electrode 42, the second back surface side wire 32B and the back surface side connection electrode 43.

In this embodiment, when observed in the z direction, the second back surface side wire 32B is shaped as a shape symmetrical to the first back surface side wire 32A with respect to an imaginary line extending in the x direction from the center of the second substrate 10B (the multilayer substrate 10) in they direction.

When observed in the z direction, between two end edges of the second back surface side wire 32B in the x direction, the end edge near the mounting surface 13 is formed at the same position as the mounting surface 13. That is to say, as shown in FIG. 5, the second back surface side wire 32B is exposed from the mounting surface 13. The second back surface side wire 32B has an outer conductive exposed portion 34r exposed from the mounting surface 13.

When observed in the z direction, between two end edges of the second back surface side wire 32B in the y direction, the end edge near the first side surface 15 is formed at the same position as the first side surface 15. That is to say, the outer conductive exposed portion 34r is also exposed from the first side surface 15. The outer conductive exposed portion 34r is arranged across from the first side surface 15 to the mounting surface 13, and is continuously exposed from the multilayer substrate 10. That is to say, a portion of the outer conductive exposed portion 34r exposed from the mounting surface 13 is connected to a portion exposed from the first side surface 15. Thus, when observed from the mounting surface 13, the outer conductive exposed portion 34r extends from, between two end edges of the mounting surface 13 in the y direction, the end edge close to the first side surface 15 in they direction. Moreover, when observed from the first side surface 15, the outer conductive exposed portion 34r extends, between two end edges of the first side surface 15 in the x direction, from the end edge close to the mounting surface 13 in the x direction. In this embodiment, a portion of the outer conductive exposed portion 34r exposed from the first side surface 15 corresponds to an exposed portion of a side surface.

When observed in the z direction, the third back surface side wire 32C is disposed at a position coinciding with the third main surface side wire 31C. The third back surface side wire 32C has a connection wire portion 32Ca coinciding with the connection wire portion 31Ca of the third wire portion 31C when observed in the z direction, and an extension portion 32Cb coinciding with the extension portion 31Cb of the third main surface side wire 31C. In this embodiment, the connection wire portion 32Ca and the extension portion 32Cb are integrated. When observed in the z direction, the extension portion 32Cb is disposed at a position coinciding with the third external electrode 53. On the other hand, when observed in the z direction, the connection wire portion 32Ca is disposed at a position non-coinciding with the third external electrode 53. The extension portion 32Cb is connected to the third external electrode 53 by the back surface side connection electrode 43.

As such, the third wire 23 is electrically connected to the third external electrode 53 by the main surface side connection electrode 41, the third main surface side wire 31C, the intermediate connection electrode 42, the third back surface side wire 32C and the back surface side connection electrode 43.

When observed in the z direction, between two end edges of the connection wire portion 32Ca in the x direction, the end edge near the anti-mounting surface 14 is formed at the same position as the anti-mounting surface 14. That is to say, as shown in FIG. 6, the third back surface side wire 32C is exposed from the anti-mounting surface 14. The third back surface side wire 32C has an outer conductive exposed portion 35ra exposed from the anti-mounting surface 14.

When observed in the z direction, between two end edges of the connection wire portion 32Ca in the y direction, the end edge near the second side surface 16 is formed at the same position as the second side surface 16. That is to say, the outer conductive exposed portion 35ra is also exposed from the second side surface 16. The outer conductive exposed portion 35ra is arranged across from the second side surface 16 to the anti-mounting surface 14, and is continuously exposed from the multilayer substrate 10. That is to say, a portion of the outer conductive exposed portion 35ra exposed from the anti-mounting surface 14 is connected to a portion exposed from the second side surface 16. Thus, when observed from the anti-mounting surface 14, the outer conductive exposed portion 35ra extends from, between two end edges of the anti-mounting surface 14 in the y direction, the end edge close to the second side surface 16 in the y direction. Moreover, when observed from the second side surface 16, the outer conductive exposed portion 35ra extends from, between two end edges of the second side surface 16 in the x direction, the end edge close to the anti-mounting surface 14 in the x direction.

When observed in the z direction, a front end edge of the extension portion 32Cb is formed at a same position as the mounting surface 13. That is to say, as shown in FIG. 5, the third back surface side wire 32C is exposed from the mounting surface 13. The third back surface side wire 32C has an inner conductive exposed portion 35rb exposed from the mounting surface 13. The inner conductive exposed portion 36rb is arranged between the outer conductive exposed portion 33r of the first back surface side wire 32A and the outer conductive exposed portion 34r of the second back surface side wire portion 32B in the y direction. The inner conductive exposed portion 35rb is disposed closer to the outer conductive exposed portion 33r with respect to the center of the multilayer substrate 10 in the y direction.

When observed in the z direction, the fourth back surface side wire 32D is disposed at a position coinciding with the fourth main surface side wire 31D. In this embodiment, when observed in the z direction, the fourth back surface side wire 32D is shaped as a shape symmetrical to the third back surface side wire 32D with respect to an imaginary line extending in the x direction from the center of the second substrate 10B (the multilayer substrate 10) in the y direction. The fourth back surface side wire 32D has a connection wire portion 32Da coinciding with the connection wire portion 31Da of the fourth main surface side wire 31D when observed in the z direction, and an extension portion 32db coinciding with the extension portion 31db of the fourth main surface side wire 31D. In this embodiment, the connection wire portion 31Da and the extension portion 32db are integrated. When observed in the z direction, the extension portion 32db is disposed at a position coinciding with second external electrode 52. On the other hand, when observed in the z direction, the connection wire portion 32Da is disposed at a position non-coinciding with second external electrode 52. The extension portion 32db is connected to the second external electrode 52 by the back surface side connection electrode 43.

The fourth wire 24 is electrically connected to the second external electrode 52 by the main surface side connection electrode 41, the fourth main surface side wire 31D, the intermediate connection electrode 42, the fourth back surface side wire 32D and the back surface side connection electrode 43.

When observed in the z direction, between two end edges of the connection wire portion 32Da in the x direction, the end edge near the anti-mounting surface 14 is formed at the same position as the anti-mounting surface 14. That is to say, as shown in FIG. 6, the fourth back surface side wire 32D is exposed from the anti-mounting surface 14. The fourth back surface side wire 32D has an outer conductive exposed portion 36ra exposed from the anti-mounting surface 14.

When observed in the z direction, between two end edges of the connection wire portion 32Da in the y direction, the end edge near the first side surface 15 is formed at the same position as the first side surface 15. That is to say, the outer conductive exposed portion 36ra is also exposed from the first side surface 15. The outer conductive exposed portion 36ra is arranged across from the first side surface 15 to the anti-mounting surface 14, and is continuously exposed from the multilayer substrate 10. That is to say, a portion of the outer conductive exposed portion 36ra exposed from the anti-mounting surface 14 is connected to a portion exposed from the first side surface 15. Thus, when observed from the anti-mounting surface 14, the outer conductive exposed portion 36ra extends from, between two end edges of the anti-mounting surface 14 in the y direction, the end edge close to the first side surface 15 in the y direction. Moreover, when observed from the first side surface 15, the outer conductive exposed portion 36ra extends from, between two end edges of the first side surface 15 in the x direction, the end edge close to the anti-mounting surface 14 in the x direction.

When observed in the z direction, a front end edge of the extension portion 32db is formed at a same position as the mounting surface 13. That is to say, as shown in FIG. 5, the fourth back surface side wire 32D is exposed from the mounting surface 13. The fourth back surface side wire 32D has an inner conductive exposed portion 36rb exposed from the mounting surface 13. The inner conductive exposed portion 36rb is arranged between the outer conductive exposed portion 33r of the first back surface side wire 32A and the outer conductive exposed portion 34r of the second back surface side wire portion 32B in the y direction. The inner conductive exposed portion 36rb is disposed closer to the outer conductive exposed portion 34r with respect to the center of the multilayer substrate 10 in the y direction.

Figure 7:
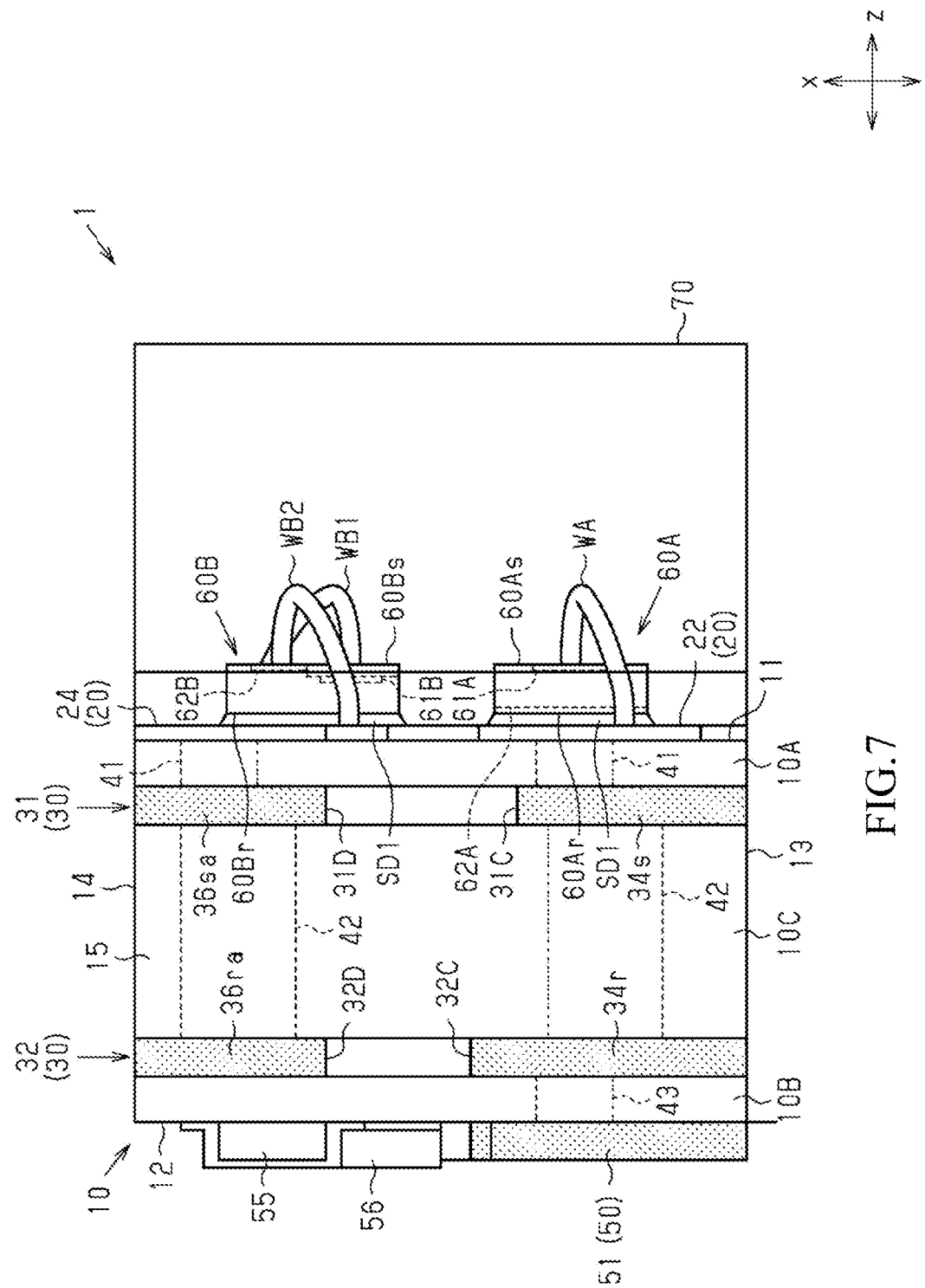
FIG. 7 is a side view of the semiconductor light emitting device in FIG. 1, when observed from different directions from those in FIG. 5 and FIG. 6.

Next, referring to FIG. 5 to FIG. 7, the conductive exposed portions are described. From a perspective of better understanding, the outer conductive exposed portions 33s, 33r, 34s and 34r, the inner conductive exposed portions 35sb, 35rb, 36sb and 36rb, and the external electrode 50 are respectively shaded by dots.

As shown in FIG. 5, the conductive exposed portion exposed from the mounting surface 13 of the multilayer substrate 10 is provided in plural form. In this embodiment, the conductive exposed portions are the outer conductive exposed portions 33s, 33r, 34s and 34r, and the inner conductive exposed portions 35sb, 35rb, 36sb and 36rb.

As described above, the main surface side wires 31A to 31D are arranged in a state of being aligned with each other in the z direction, as being disposed between the first substrate 10A and the third substrate 10C. Thus, as shown in FIG. 5, the outer conductive exposed portion 33s, the outer conductive exposed portion 34s, the inner conductive exposed portion 35sb and the inner conductive exposed portion 36sb are arranged in a state of being aligned to each other in the z direction. That is to say, the outer conductive exposed portion 33s, the outer conductive exposed portion 34s, the inner conductive exposed portion 35sb and the inner conductive exposed portion 36sb are respectively disposed at separated positions in the z direction on the main surface 11 and the back surface 12 of the multilayer substrate 10. Moreover, when observed from the mounting surface 13, the outer conductive exposed portion 33s, the outer conductive exposed portion 34s, the inner conductive exposed portion 35sb and the inner conductive exposed portion 36sb are arranged as separated from each other in one row in the y direction. That is to say, the y direction may be said as an arrangement direction of the outer conductive exposed portion 33s, the outer conductive exposed portion 34s, the inner conductive exposed portion 35sb and the inner conductive exposed portion 36sb, that is, an arrangement direction of the plurality of conductive exposed portions. In other words, the y direction corresponds to the first direction. In the z direction, the main surface side wires 31A to 31D are arranged closer to the main surface 11 with respect to the center of the multilayer substrate 10 in the z direction (the center of the mounting surface 13 in the z direction). That is to say, the conductive exposed portions 33s, 34s, 35sb and 36sb are arranged closer to the main surface 11 with respect to the center of the multilayer substrate 10 in the z direction (the center of the mounting surface 13 in the z direction).

Moreover, as described above, the back surface side wires 32A to 32D are arranged in a state of being aligned with each other in the z direction, as being disposed between the second substrate 10B and the third substrate 10C. Thus, as shown in FIG. 5, the outer conductive exposed portion 33r, the outer conductive exposed portion 34r, the inner conductive exposed portion 35rb and the inner conductive exposed portion 36rb are arranged in a state of being aligned with each other in the z direction. That is to say, the outer conductive exposed portion 33r, the outer conductive exposed portion 34r, the inner conductive exposed portion 35rb and the inner conductive exposed portion 36rb are respectively disposed at separated positions in the z direction on the main surface 11 and the back surface 12 of the multilayer substrate 10. Moreover, when observed from the mounting surface 13, the outer conductive exposed portion 33r, the outer conductive exposed portion 34r, the inner conductive exposed portion 35rb and the inner conductive exposed portion 36rb are arranged as separated from each other in one row in the y direction. In addition, in the z direction, the back surface side wires 32A to 32D are arranged closer to the back surface 12 with respect to the center of the multilayer substrate 10 in the z direction (the center of the mounting surface 13 in the z direction). That is to say, the conductive exposed portions 33r, 34r, 35rb and 36rb are arranged closer to the back surface 12 with respect to the center of the multilayer substrate 10 in the z direction (the center of the mounting surface 13 in the z direction).

As such, in the z direction, the conductive exposed portions 33r, 34r, 35rb and 36rb are arranged at intervals closer to the back surface 12 with respect to the conductive exposed portions 33s, 34s, 35sb and 36sb. In other words, in the z direction, the conductive exposed portions 33s, 34s, 35sb and 36sb are arranged at intervals closer to the main surface 11 with respect to the conductive exposed portions 33r, 34r, 35rb and 36rb. The first conductive layer 31, that is, the conductive exposed portions 33s, 34s, 35sb and 36sb exposed from the mounting surface 13, corresponds to the first conductive exposed portion. Moreover, the second conductive layer 32, that is, the conductive exposed portions 33r, 34r, 35rb and 36rb exposed from the mounting surface 13, corresponds to the second conductive exposed portion.

As shown in FIG. 5, when observed from the mounting surface 13, the outer conductive exposed portion 33s, the outer conductive exposed portion 33r and the fourth external electrode 54 are aligned with each other in the y direction. When observed from the mounting surface 13, the outer conductive exposed portion 34s, the outer conductive exposed portion 34r and the first external electrode 51 are aligned with each other in the y direction. When observed from the mounting surface 13, the inner conductive exposed portion 35sb, the inner conductive exposed portion 35rb and the third external electrode 53 are aligned in the y direction. When observed from the mounting surface 13, the inner conductive exposed portion 36sb, the inner conductive exposed portion 36rb and the second external electrode 52 are aligned with each other in the y direction.

As shown in FIG. 5, the lengths of the external electrodes 51 to 54 in the y direction are equal to each other. The length of the outer conductive exposed portion 33s in the y direction, the length of the outer conductive exposed portion 34s in the y direction, the length of the inner conductive exposed portion 35sb in the y direction and the length of the inner conductive exposed portion 36sb in they direction are respectively less than the lengths of the external electrodes 51 to 54 in they direction.

The length of the outer conductive exposed portion 33s in the y direction is equal to the length of the outer conductive exposed portion 34s in the y direction. The length of the inner conductive exposed portion 35sb in the y direction is equal to the length of the inner conductive exposed portion 36sb in the y direction. Both the length of the inner conductive exposed portion 35sb in the y direction and the length of the inner conductive exposed portion 36sb in the y direction are less than both the length of the outer conductive exposed portion 33s in the y direction and the outer conductive exposed portion 34s in the y direction.

The outer conductive exposed portions 33s and 33r are formed in a manner of having, between respective two end edges thereof in the y direction, the end edges closer to the first side surface 15 be closer to the second side surface 16 with respect to, between two end edges of the fourth external electrode 54 in they direction, the end edge closer to the first side surface 15. In other words, when observed in the z direction, an end portion of the fourth external electrode 54 on the side of the first side surface 15 extends out toward the y direction from the outer conductive exposed portions 33s and 33r.

The outer conductive exposed portions 34s and 34r are formed in a manner of having, between respective two end edges thereof in the y direction, the end edges closer to the second side surface 16 be closer to the first side surface 15 with respect to, between two end edges of the first external electrode 51 in the y direction, the end edge closer to the second side surface 16. In other words, when observed in the z direction, an end portion of the first external electrode 51 on the side of the second side surface 16 extends out toward the y direction from the outer conductive exposed portions 34s and 34r.

The inner conductive exposed portions 35sb and 35rb are arranged in a manner of having respective centers thereof in the y direction be aligned in the y direction with the center of the third external electrode 53 in the y direction. Therefore, when observed from the mounting surface 13, respective two end portions of the inner conductive exposed portions 35sb and 35rb in the y direction are located inside with respect to two end portions of the third external electrode 53 in the y direction. In other words, when observed in the z direction, two end portions of the third external electrode 53 in the y direction extend out toward the y direction from the inner conductive exposed portions 35sb and 35rb.

The inner conductive exposed portions 36sb and 36rb are arranged in a manner of having respective centers thereof in the y direction be aligned in the y direction with the center of the second external electrode 52 in the y direction. Therefore, when observed from the mounting surface 13, respective two end portions of the inner conductive exposed portions 36sb and 36rb in the y direction are located inside with respect to two end portions of the second external electrode 52 in they direction. In other words, when observed in the z direction, two end portions of the second external electrode 52 in the y direction out toward the y direction from the inner conductive exposed portions 36sb and 36rb.

As shown in FIG. 6, because the first main surface side wire 31A, the second main surface side wire 31B, the first back surface side wire 32A and the second back surface side wire 32B are not exposed from the anti-mounting surface 14, how the first conductive layer 31 and the second conductive layer 32 are exposed from the anti-mounting surface 14 is different from how they are exposed from the mounting surface 13. That is to say, an exposing pattern of the conductive layer 30 exposed from the mounting surface 13 is different from an exposing pattern of the conductive layer 30 from the anti-mounting surface 14. Moreover, the so-called "exposing pattern" includes at least one of the first conductive layer 31 and the second conductive layer 32, and at least one of the shapes (the y-direction length) of a portion exposed from the mounting surface 13 and the anti-mounting surface 14, the number of portions exposed, and the position of an exposed portion in the y direction. In brief, the conductive layer 30 includes a plurality of conductive layers, as long as an exposed portion of at least one conductive layer appears different at the mounting surface 13 and the anti-mounting surface 14.

In the anti-mounting surface 14, the outer conductive exposed portion 35sa of the third main surface side wire 31C and the outer conductive exposed portion 36sa of the fourth main surface side wire 31D, as well as the outer conductive exposed portion 35ra of the third back surface side wire 32C and the outer conductive exposed portion 36ra of the fourth back surface side wire 32D are exposed. In the y direction, the outer conductive exposed portion 35sa and the outer conductive exposed portion 35ra are aligned with each other, and the outer conductive exposed portion 36sa and the outer conductive exposed portion 36ra are aligned with each other. The lengths of the outer conductive exposed portions 35sa and 35ra in the y direction are more than the lengths, in they direction, of the outer conductive exposed portions 33s and 33r (referring to FIG. 5) exposed from the mounting surface 13. The lengths of the outer conductive exposed portions 36sa and 36ra in the y direction are more than the lengths, in the y direction, of the outer conductive exposed portions 34s and 34r (referring to FIG. 5) exposed from the mounting surface 13.

As shown in FIG. 7, in the first side surface 15, the outer conductive exposed portion 34s of the second main surface side wire 31B and the outer conductive exposed portion 36sa of the fourth main surface side wire 31D, as well as the outer conductive exposed portion 34r of the second back surface side wire 32B and the outer conductive exposed portion 36ra of the fourth back surface side wire 32D are exposed.

The outer conductive exposed portion 34s and the outer conductive exposed portion 36sa are disposed apart from each other in the x direction in a state of being aligned with each other in the z direction. In the z direction, the outer conductive exposed portion 34r and the outer conductive exposed portion 36ra are arranged closer to the external electrode 50 relative to the outer conductive exposed portion 34s and the outer conductive exposed portion 36sa. The outer conductive exposed portion 34r and the outer conductive exposed portion 36ra are disposed apart from each other in the x direction in a state of being aligned with each other in the z direction. When observed in the z direction, the outer conductive exposed portion 34s and the outer conductive exposed portion 34r are disposed on positions coinciding with each other. When observed in the z direction, the outer conductive exposed portion 36sa and the outer conductive exposed portion 36ra are disposed on positions coinciding with each other.

The length of the outer conductive exposed portion 34s in the x direction is less than the length of the outer conductive exposed portion 34r in the x direction. In this embodiment, the length of the outer conductive exposed portion 34s in the x direction is less than the length of the outer conductive exposed portion 34r in the x direction. The length of the outer conductive exposed portion 34s in the x direction is less than the length of the first external electrode 51 in the x direction (the length of the external electrode 50 in the x direction). In this embodiment, the length of the outer conductive exposed portion 34s in the x direction is less than the length of the first external electrode 51 in the x direction. The length of the outer conductive exposed portion 34r in the x direction is less than the length of the first external electrode 51 in the x direction (the length of the external electrode 50 in the x direction). In this embodiment, the length of the outer conductive exposed portion 34r in the x direction is equal to the length of the first external electrode 51 in the x direction.

Moreover, the lengths of the outer conductive exposed portions 34s and 34r in the x direction may respectively be modified as desired. In one example, the length of the outer conductive exposed portion 34s in the x direction be equal to the length of the outer conductive exposed portion 34r in the x direction, or may be more than the length of the outer conductive exposed portion 34r in the x direction. The length of the outer conductive exposed portion 34s in the x direction may be equal to the length of the first external electrode 51 in the x direction, or may be more than the length of the first external electrode 51. Moreover, in one example, the length of the outer conductive exposed portion 34r in the x direction may be equal to the length of the first external electrode 51 in the x direction, or may be less than the length of the first external electrode 51.

The length of the outer conductive exposed portion 36sa in the x direction is equal to the length of the outer conductive exposed portion 36ra in the x direction. In this embodiment, the lengths of the outer conductive exposed portions 36sa and 36ra in the x direction are less than the lengths of the outer conductive exposed portions 34s and 34r in the x direction. Moreover, the lengths of the outer conductive exposed portions 36sa and 36ra in the x direction may be modified as desired, for example, may be equal to the lengths of the outer conductive exposed portions 34s and 34r in the x direction, or may be more than the lengths of the outer conductive exposed portions 34s and 34r in the x direction.

Moreover, although not depicted, in the second side surface 16, the outer conductive exposed portion 33s of the first main surface side wire 31A and the outer conductive exposed portion 35sa of the third main surface side wire 31C, as well as the outer conductive exposed portion 33r of the first back surface side wire 32A and the outer conductive exposed portion 35ra of the third back surface side wire 32C are exposed. An exposing pattern (arrangement position, shape and dimensions) of the conductive layer exposed from the second side surface 16 is the same as an exposing pattern of the conductive layer from the first side surface 15.

Figure 10:
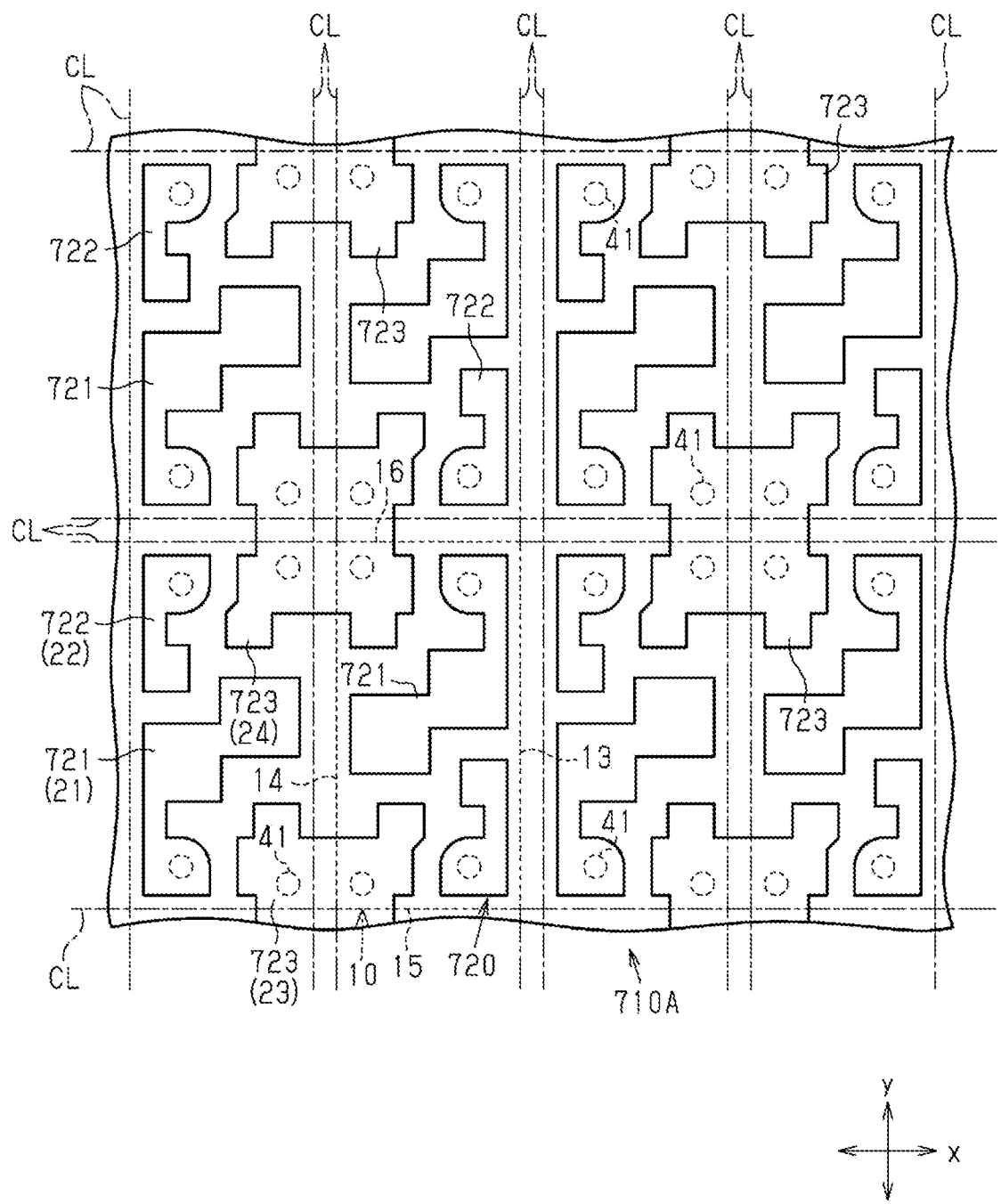
FIG. 10 is an illustration diagram for illustrating an example of a manufacturing process of a multilayer substrate.
Figure 11:
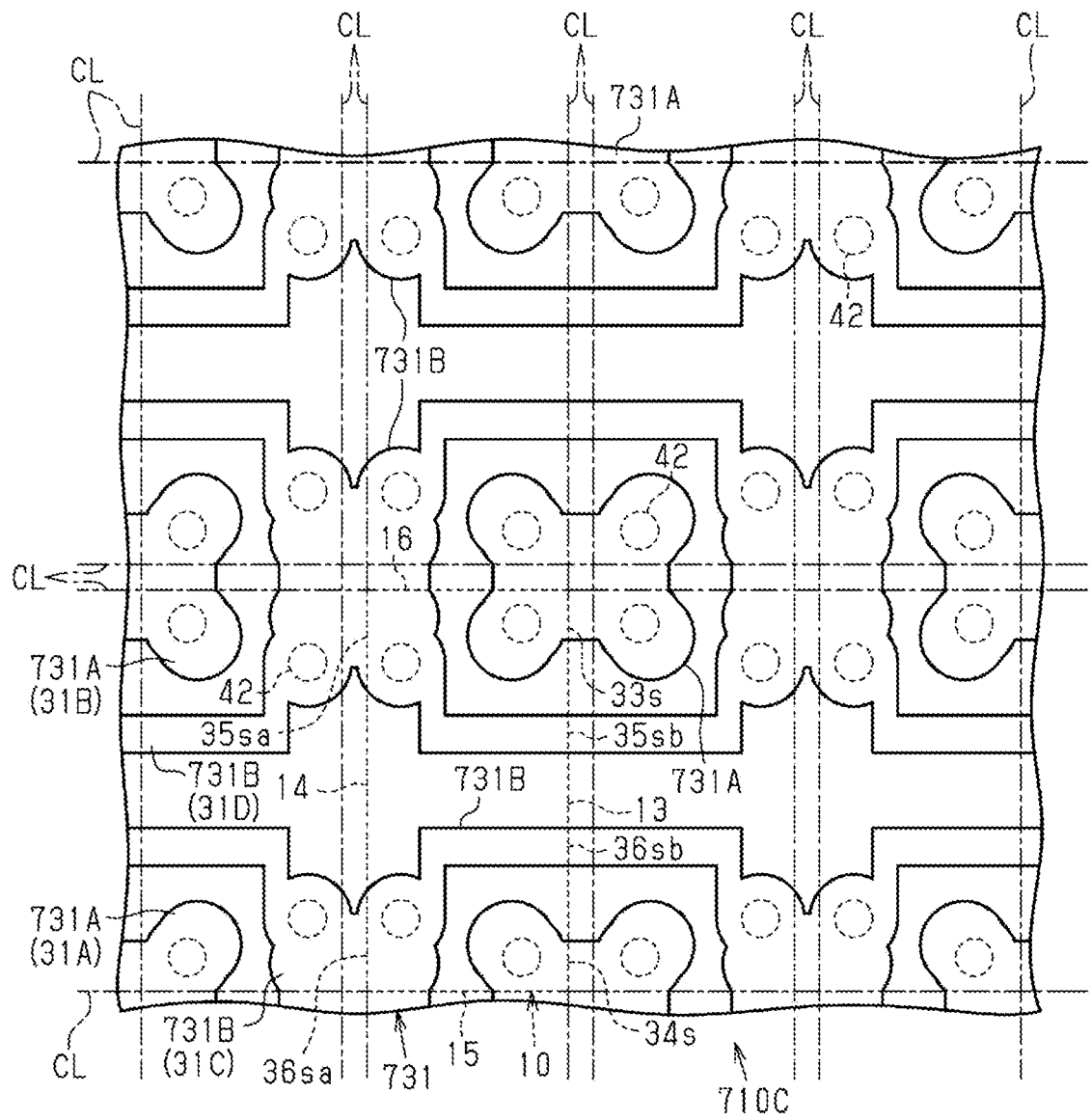
FIG. 11 is an illustration diagram for illustrating an example of a manufacturing process of a multilayer substrate.
Figure 12:
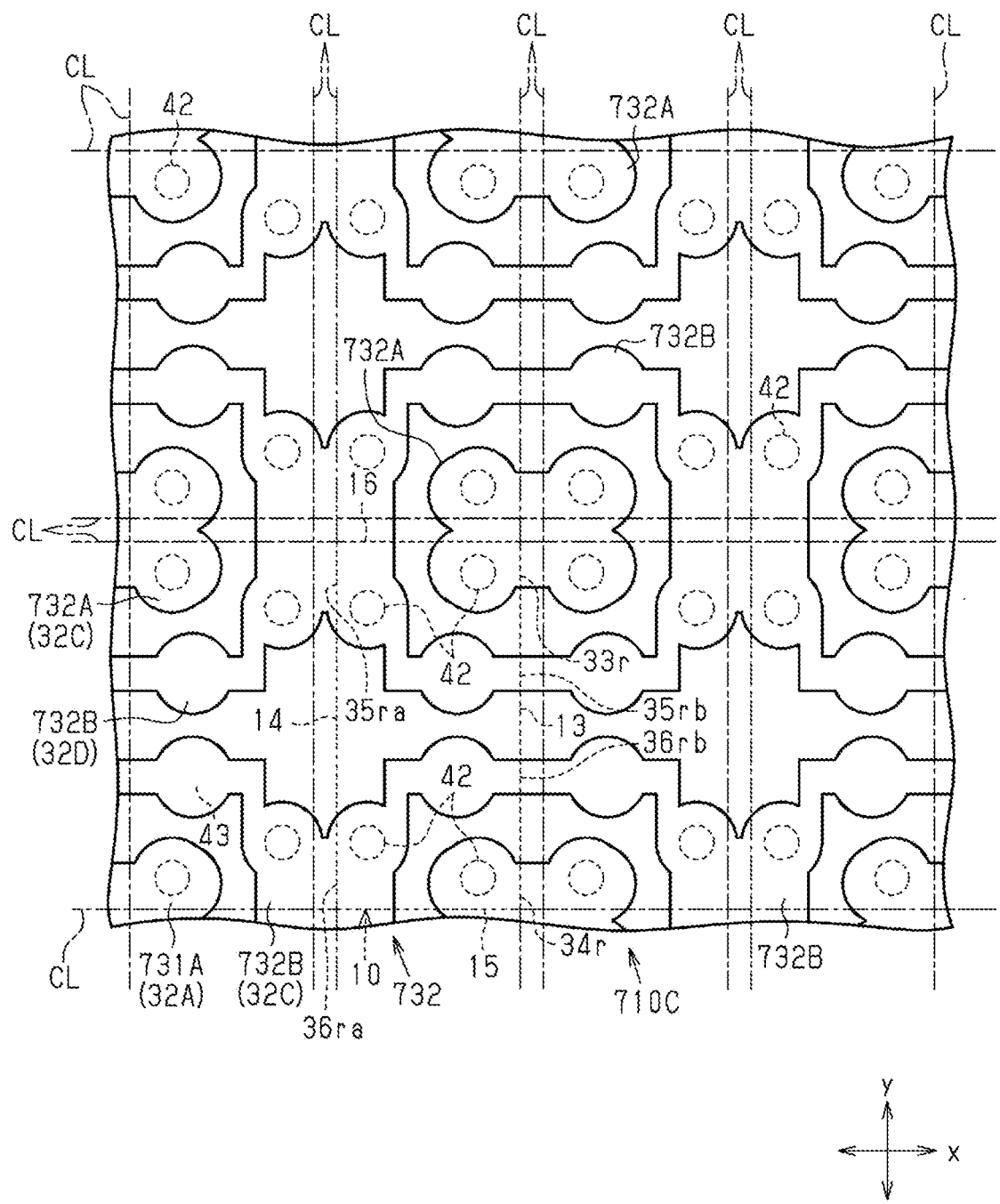
FIG. 12 is an illustration diagram for illustrating an example of a manufacturing process of a multilayer substrate.
Figure 13:
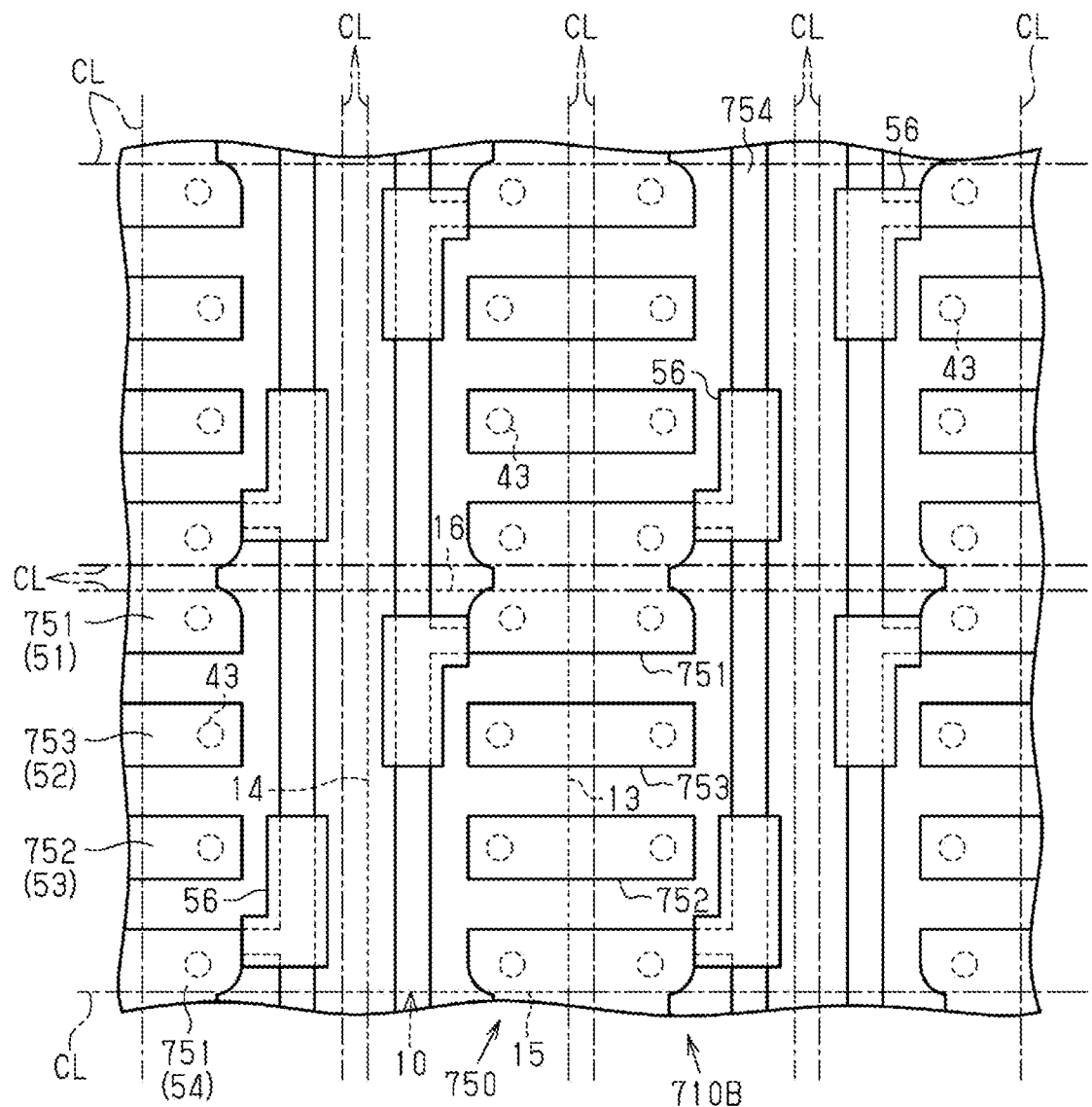
FIG. 13 is an illustration diagram for illustrating an example of a manufacturing process of a multilayer substrate.

Next, an example of a manufacturing process of the multilayer substrate 10 is described in detail below. Moreover, the dotted rectangles in FIG. 10 to FIG. 13 represent dimensions equivalent to those of the multilayer substrate 10. In addition, in FIG. 10 to FIG. 13, an example of a region for manufacturing eight multilayer substrates 10 is depicted. Moreover, the wire patterns shown in FIG. 10 to FIG. 12 are represented as perspective views from the main surface 11 through the multilayer substrate 10. The wire pattern shown in FIG. 13 is represented by viewing the multilayer substrate 10 from the side of the back surface 12 in accordance with the turned arrangements shown in FIG. 10 to FIG. 12.

In the manufacturing method of the multilayer substrate 10, a base material of the multilayer substrate is first manufactured. The base material of the multilayer substrate includes a first substrate 710A shown in FIG. 10, a third substrate 710C shown in FIG. 11 and FIG. 12, and a second substrate 710B shown in FIG. 13.

The first substrate 710A is a substrate corresponding to the first substrate 10A of the multilayer substrate 10, and is a substrate before being cut into having the dimensions of the multilayer substrate 10 shown in the dotted rectangles in FIG. 10. The first substrate 710A is formed to cover a main surface of the third substrate 710C and the first conductive layer 731 (to be described later) on the main surface of the third substrate 710C.

The third substrate 710C is a substrate corresponding to the third substrate 10C of the multilayer substrate 10, and is a substrate before being cut into having the dimensions of the multilayer substrate 10 shown in the dotted rectangles in FIG. 11.

The second substrate 710B is a substrate corresponding to the second substrate 10B of the multilayer substrate 10, and is a substrate before being cut into having the dimensions of the multilayer substrate 10 shown in the dotted rectangles in FIG. 12. The second substrate 710B is formed to cover a back surface of the third substrate 710C and the second conductive layer 732 (to be described later) on the back surface of the third substrate 710C.

As shown in FIG. 10, a wiring layer 720 is formed on the main surface of the first substrate 710A. Moreover, a plurality of main surface side connection electrodes 41 are formed on the first substrate 710A. As shown in FIG. 11, the first conductive layer 731 is formed on the main surface of the third substrate 710C, and as shown in FIG. 12, the second conductive layer 732 is formed on the back surface of the third substrate 710C. Moreover, a plurality of intermediate connection electrodes 42 are formed on the third substrate 710C. As shown in FIG. 13, an external electrode 750 is formed on the back surface of the second substrate 710B. Moreover, a plurality of back surface side connection electrodes 43 are formed on the second substrate 710B. The first substrate 710A, the second substrate 710B and the third substrate 710C are layered in the z direction, by sandwiching the third substrate 710C between the first substrate 710A and the second substrate 710B. Accordingly, the base material of the multilayer substrate is manufactured.

Next, the base material of the multilayer substrate is cut along the cutting lines CL represented by single-dot dotted lines in FIG. 10 to FIG. 12 by using, for example, a cutting blade. Accordingly, the multilayer substrate 10 is monolithically formed. With the process above, the multilayer substrate 10 is manufactured.

Next, the wire patterns in FIG. 10 to FIG. 13 are described below.

FIG. 10 shows an example of a wiring layer 720 formed at the first substrate 710A and the main surface side connection electrode 41.

The wiring layer 720 is a conductive layer equivalent to the wiring layer 20 of the multilayer substrate 10, and has a first wire 721, a second wire 722, and a common wire 723. The wiring layer 720 is formed by patterning using a mask.

The first wire 721 is a wire corresponding to the first wire 21 of the multilayer substrate 10, and the second wire 722 is a wire corresponding to the second wire 22 of the multilayer substrate 10. The common wire 723 is a wire including the third wire 23 and the fourth wire 24 of the multilayer substrate 10. The common wire 723 is cut together with the first substrate 710A along the cutting line CL to form the third wire 23 and the fourth wire 24. Thus, the third wire 23 and the fourth wire 24 have portions coinciding with an outer periphery of the first substrate 10A (the multilayer substrate 10). The portions of the third wire 23 and the fourth wire 24 coinciding with the outer periphery of the first substrate 10A become cut side surfaces formed by cutting.

The main surface side connection electrode 41 is formed as penetrating the first substrate 710A in its thickness direction (the z direction). More specifically, first of all, at a portion in the first substrate 710A forming the main surface side connection electrode 41, an opening exposing a portion of the first conductive layer 731 is formed by such as laser processing. Next, plating Cu is embedded in the opening. Accordingly, a via is formed. Moreover, the main surface side connection electrode 41 may be formed by a same step as the wiring layer 720, or may be formed by a different step. With the process above, the main surface side connection electrode 41 is manufactured. Moreover, the plating Cu may be not embedded in the opening, but may be formed in a cylindrical shape at an inner wall of the opening.

FIG. 11 and FIG. 12 show examples of the first conductive layer 731, the second conductive layer 732 and the intermediate connection electrode 42 formed at the third substrate 710C.

The first conductive layer 731 is a conductive layer equivalent to the first conductive layer 31 of the multilayer substrate 10, and has a first common wire 731A and a second common wire 731B. The first conductive layer 731 is formed by patterning using a mask.

The first common wire 731A is a wire including the first main surface side wire 31A and the second main surface side wire 31B of the multilayer substrate 10. The first common wire 731A is cut together with the third substrate 710C along the cutting line CL to form the first main surface side wire 31A and the second main surface side wire 31B. Thus, when observed in the thickness direction (the z direction) of the third substrate 710C, the first main surface side wire 31A has a portion (the outer conductive exposed portion 33*s*) coinciding with the mounting surface 13 and the second side surface 16 of the multilayer substrate 10, and the second main surface side wire 31B has a portion (the outer conductive exposed portion 34*s*) coinciding with the mounting surface 13 and the first side surface 15 of the multilayer substrate 10. That is to say, both the outer conductive exposed portion 33*s* and the outer conductive exposed portion 34*s* become cut side surfaces formed by cutting. Accordingly, the outer conductive exposed portions 33*s* and 34*s* are flush with the mounting surface 13. The outer conductive exposed portion 33*s* is flush with the second side surface 16, and the outer conductive exposed portion 34*s* is flush with the first side surface 15.

The second common wire 731B is a wire including the third main surface side wire 31C and the fourth main surface side wire 31D of the multilayer substrate 10. The second common wire 731B is cut together with the third substrate 710C along the cutting line CL to form the third main surface side wire 31C and the fourth main surface side wire 31D. Thus, when observed in the z direction, the third main surface side wire 31C has a portion (the inner conductive exposed portion 35*sb*) coinciding with the mounting surface 13 of the multilayer substrate 10, and a portion (the outer conductive exposed portion 35*sa*) coinciding with the anti-mounting surface 14 and the second side surface 16. The fourth main surface side wire 31D has a portion (the inner conductive exposed portion 36*sb*) coinciding with the mounting surface 13 of the multilayer substrate 10, and a portion (the outer conductive exposed portion 36*sa*) coinciding with the anti-mounting surface 14 and the first side surface 15. That is to say, the inner conductive exposed portions 35*sb* and 36*sb*, and the outer conductive exposed portions 35*sa* and 36*sa* become cut side surfaces formed by cutting. Accordingly, the outer conductive exposed portions 35*sa* and 36*sa* and the inner conductive exposed portions 35*sb* and 36*sb* are flush with the mounting surface 13. The outer conductive exposed portion 35*sa* is flush with the second side surface 16, and the outer conductive exposed portion 36*sa* is flush with the first side surface 15.

The second conductive layer 732 is a conductive layer equivalent to the second conductive layer 32 of the multilayer substrate 10, and has a first common wire 732A and a second common wire 732B. The second conductive layer 732 is formed by patterning using a mask.

The first common wire 732A is a wire including the first back surface side wire 32A and the second back surface side wire 32B of the multilayer substrate 10. The first common wire 732A is cut together with the third substrate 710C along the cutting line CL to form the first back surface side wire 32A and the second back surface side wire 32B. Thus, when observed in the thickness direction (the z direction) of the third substrate 710C, the first back surface side wire 32A has a portion (the outer conductive exposed portion 33*r*) coinciding with the mounting surface 13 and the second side surface 16 of the multilayer substrate 10, and the second back surface side wire 32B has a portion (the outer conductive exposed portion 34*r*) coinciding with the mounting surface 13 and the first side surface 15 of the multilayer substrate 10. That is to say, both the outer conductive exposed portion 33*r* and the outer conductive exposed portion 34*r* become cut side surfaces formed by cutting. Accordingly, the outer conductive exposed portions 33*r* and 34*r* are flush with the mounting surface 13. The outer conductive exposed portion 33*r* is flush with the second side surface 16, and the outer conductive exposed portion 34*r* is flush with the first side surface 15.

The second common wire 732B is a wire including the third back surface side wire 32C and the fourth back surface side wire 32D of the multilayer substrate 10. The second common wire 732B is cut together with the second substrate 710B along the cutting line CL to form the third back surface side wire 32C and the fourth back surface side wire 32D. Thus, when observed in the z direction, the third back surface side wire 32C has a portion (the inner conductive exposed portion 35*rb*) coinciding with the mounting surface 13 of the multilayer substrate 10, and a portion (the outer conductive exposed portion 35*ra*) coinciding with the anti-mounting surface 14 and the second side surface 16. The fourth back surface side wire 32D has a portion (the inner conductive exposed portion 36*rb*) coinciding with the mounting surface 13 of the multilayer substrate 10, and a portion (the outer conductive exposed portion 36*ra*) coinciding with the anti-mounting surface 14 and first side surface 15. That is to say, the inner conductive exposed portions 35*rb* and 36*rb*, and the outer conductive exposed portions 35*ra* and 36*ra* become cut side surfaces formed by cutting. Accordingly, the outer conductive exposed portions 35*ra* and 36*ra* and the inner conductive exposed portions 35*rb* and 36*rb* are flush with the mounting surface 13. The outer conductive exposed portion 35*ra* is flush with the second side surface 16, and the outer conductive exposed portion 36*ra* is flush with the first side surface 15.

The intermediate connection electrode 42 is formed as penetrating the third substrate 710C in its thickness direction (the z direction). More specifically, first of all, at a portion forming the intermediate connection electrode 42 in the third substrate 710B, a through via is formed by such as laser processing. Next, plating Cu is embedded in the through via. Accordingly, a via is formed. With the process above, the intermediate connection electrode 42 is manufactured. Moreover, the plating Cu may be not embedded in the through via, but may be formed in a cylindrical shape at an inner wall of the through via.

FIG. 13 shows an example of an external electrode 750 formed on the back surface of the second substrate 710B.

The external electrode 750 is a conductive layer corresponding to the external electrode 50 of the multilayer substrate 10, and has a first common electrode portion 751, a second common electrode portion 752 and a third common electrode portion 753. A metal layer of the external electrode 750 is formed by patterning. In addition, the patterned metal layer is designated to be electroplating of a conducting path to form a plating layer.

The first common electrode portion 751 is a conductive layer including four external electrodes, each of the second common electrode portion 752 and the third common electrode portion 753 is a conductive layer including two external electrodes. In one example, the first common electrode portion 751 includes two first external electrode 51 and two fourth external electrodes 54. Both the second common electrode portion 752 and the third common electrode portion 753 include the second external electrode 52 and the third external electrode 53. When the second substrate 710B is cut along the cutting line CL, the common electrode portions 751 to 753 are cut to form the first external electrode 51, the second external electrode 52, the third external electrode 53 and the fourth external electrode 54. Thus, when observed in the thickness direction (the z direction) of the second substrate 710B, each of the external electrodes 51 to 54 has a portion coinciding with the mounting surface 13, the first external electrode 51 has a portion coinciding with the first side surface 15, and the fourth external electrode 54 has a portion coinciding with the second side surface 16. The portions in the external electrodes 51 to 54 coinciding with the mounting surface 13, the portion in the first external electrode 51 coinciding with the first side surface 15, and the portion in the fourth external electrode 54 coinciding with the second side surface 16 respectively become cut side surfaces formed by cutting. Accordingly, the external electrodes 51 to 54 have portions flush with the mounting surface 13. The first external electrode 51 has a portion flush with the first side surface 15, and the fourth external electrode 54 has a portion flush with the second side surface 16.

The back surface side connection electrode 43 is formed as penetrating the second substrate 710B in its thickness direction (the z direction). More specifically, first of all, at a portion forming the back surface side connection electrode 43 in the second substrate 710B, an opening exposing a portion of the second conductive layer 732 is formed by such as laser processing. Next, plating Cu is embedded in the opening. Accordingly, a via is formed. Moreover, the plating Cu may be not embedded in the opening, but may be formed in a cylindrical shape at an inner wall of the opening. Moreover, the back surface side connection electrode 43 may be formed by a same step as the external electrode 750, or may be formed by a different step. With the process above, the back surface side connection electrode 43 is manufactured.

In addition, a connection wire portion 754 connected to the first common electrode portion 751, and a resist layer 56 covering a portion of the connection wire portion 754 are formed at the second substrate 710B. The connection wire portion 754 is a conductive layer corresponding to the connection wire portion 55 of the multilayer substrate 10.

The connection wire portion 754 is designated as electroplating for a conducting path, and a coating layer is formed at the first common electrode 751. Then, the connection wire portion 55 of the multilayer substrate 10 is formed by cutting the connection wire portion 754 together with the second substrate 710B along the cutting line CL.

In the manufacturing method of the semiconductor light emitting device 1, the semiconductor light emitting elements 60A and 60B are mounted on the wiring layer 720 of the base material formed as described. Next, using a lead wire bonding device, lead wires WA, WB1 and WB2 connecting the semiconductor light emitting elements 60A and 60B to the wiring layer 720 are formed.

Next, a resin layer that seals the semiconductor light emitting elements 60A and 60B and the lead wires WA, WB1 and WB2 is formed. The resin layer corresponds to the sealing resin, and seals the semiconductor light emitting elements 60A and 60B and the lead wires WA, WB1 and WB2.

Finally, the resin layer and the base material of the multilayer substrate are cut along the cutting lines CL shown in FIG. 10 to FIG. 13 by a cutting blade. Accordingly, the semiconductor light emitting device 1 is monolithically formed. The semiconductor light emitting device 1 is manufactured by the steps above.

Moreover, before mounting the semiconductor light emitting elements 60A and 60B, the base material of the multilayer substrate may also be cut along the cutting line CL using a cutting blade. Accordingly, the multilayer substrate 10 is monolithically formed. In this case, the semiconductor light emitting elements 60A and 60B are mounted on the monolithic multilayer substrate 10.

Next, mounting of the semiconductor light emitting device 1 on the circuit substrate P10 according to the embodiment is described below.

To secure the semiconductor light emitting device 1, the circuit substrate P10 for mounting the semiconductor light emitting device 1 has a plurality of land pads LP1 to LP4 as shown by single-dot dotted lines in FIG. 5.

The external electrodes 50 of the semiconductor light emitting device 1 are bonded to the land pads LP1 to LP4 by the electrically conductive bonding material SD. More specifically, the first external electrode 51 is bonded to the land pad LP1 by the electrically conductive bonding material SD, the second external electrode 52 is bonded to the land pad LP2 by the electrically conductive bonding material SD, the third external electrode 53 is bonded to the land pad LP3 by the electrically conductive bonding material SD, and the fourth external electrode 54 is bonded to the land pad LP4 by the electrically conductive bonding material SD.

As shown in FIG. 5, the land pads LP1 to LP4 are provided across overall opposite sides in the z direction of the mounting surface 13. Thus, in the semiconductor light emitting device 1, among the conductive exposed portions of the conductive layer 30, the conductive exposed portions 33$s$, 33$r$, 34$s$, 34$r$, 35$sb$, 35$rb$, 36$sb$ and 36$rb$ close to the land pads LP1 to LP4 are bonded to the land pads LP1 to LP4 by the electrically conductive bonding material SD. More specifically, the outer conductive exposed portions 34$s$ and 34$r$ are bonded to the land pad LP1 by the electrically conductive bonding material SD, the inner conductive exposed portions 36$sb$ and 36$rb$ are bonded to the land pad LP2 by the electrically conductive bonding material SD, the inner conductive exposed portions 35$sb$ and 35$rb$ are bonded to the land pad LP3 by the electrically conductive bonding material SD, and the outer conductive exposed portions 33$s$ and 33$r$ are bonded to the land pad LP4 by the electrically conductive bonding material SD.

Effects of the semiconductor light emitting device 1 according to the embodiment are described below. Moreover, in FIG. 15, the multilayer substrate 10 is depicted in brief.

Figure 14:
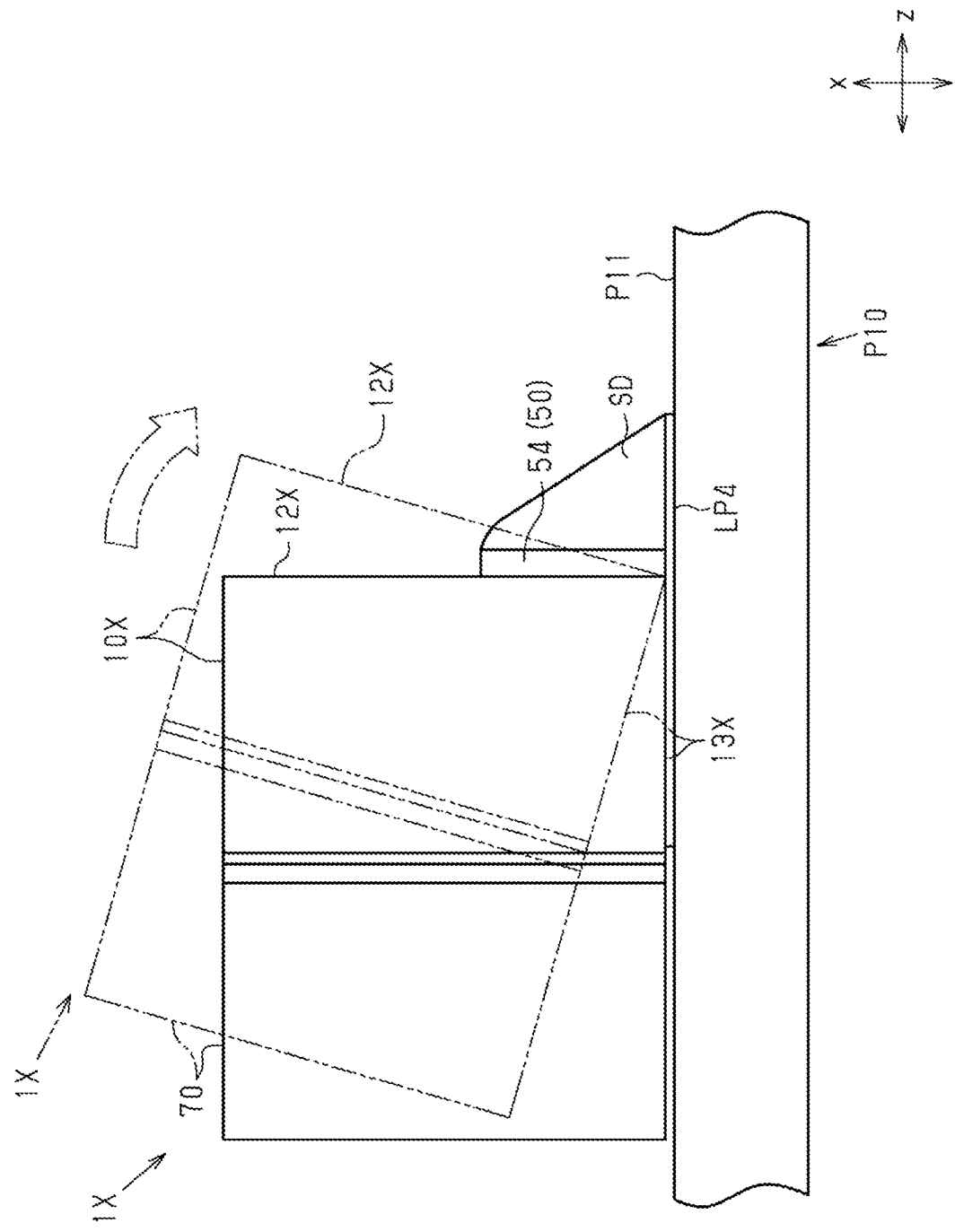
FIG. 14 is a side view of a state in which a semiconductor light emitting device is mounted on a circuit substrate in a comparison example.
Figure 15:
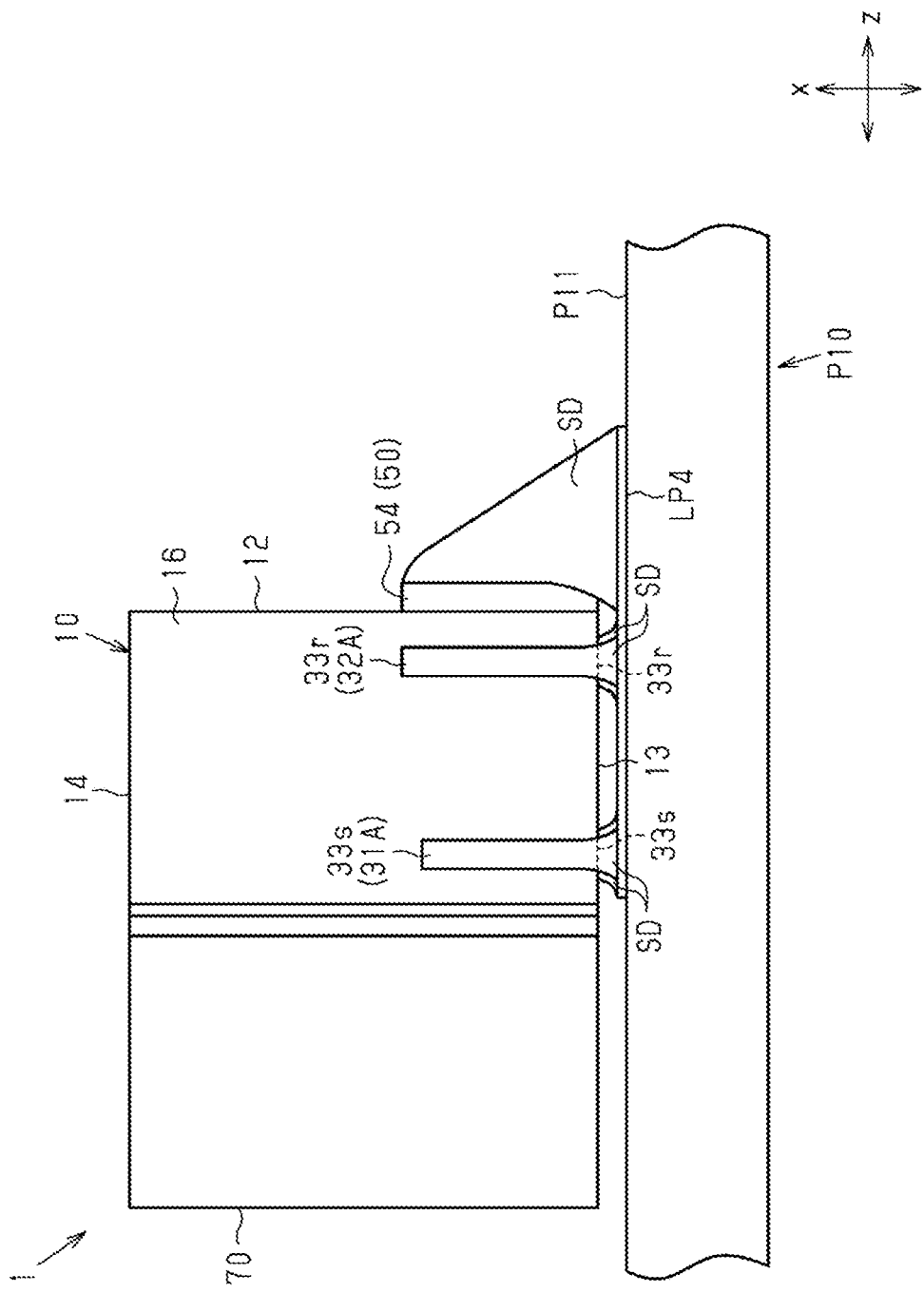
FIG. 15 is a side view of a state in which a semiconductor light emitting device is mounted on a circuit substrate according to the first embodiment.

FIG. 14 shows state in which a semiconductor light emitting device 1X of a comparison example is mounted on the upper surface P11 of the circuit substrate P10. The semiconductor light emitting device 1X of the comparison example, compared to the semiconductor light emitting device 1 of this embodiment, differs in respect of using a single-layer substrate 10X in substitution for the multilayer substrate 10.

As shown in FIG. 14, in a state where a mounting surface 13X of the substrate 10X of the semiconductor light emitting device 1X of the comparison example is in contact with the circuit substrate P10, the external electrode 50 is bonded to the circuit substrate P10 by the electrically conductive bonding material SD. In this case, when the electrically conductive bonding material SD bonding the external electrode 50 and the circuit substrate P10 is cured, a force is caused to be applied in a direction of a back surface 12X of the substrate 10X close to the circuit substrate P10. Due to the force, as indicated by the double-dot dotted lines in FIG. 14, the mounting surface 13X of the substrate 10X is caused to separate from an upper surface P11 of the circuit substrate P10, such that the semiconductor light emitting device 1X of the comparison example is inclined relative to the upper surface P11 of the circuit substrate P10. As a result, there is a concern that light emitted from the semiconductor light emitting elements is not parallel to the upper surface P11 of the circuit substrate P10.

Regarding the issue above, in the semiconductor light emitting device 1 of the embodiment, the mounting surface 13 of the multilayer substrate 10 is bonded to the circuit substrate P10 via the outer conductive exposed portions 33s, 33r, 34s and 34r, and the inner conductive exposed portions 35sb, 35rb, 36sb and 36rb by the electrically conductive bonding material SD. Accordingly, even if a force is caused to be applied in a direction of the back surface 12X of the substrate 10X close to the circuit substrate P10 due to the electrically conductive bonding material SD bonding the external electrodes 51 to 54 and may further cause the mounting surface 13 to be separated from the upper surface P11 of the circuit substrate P10, such can be inhibited by bonding the conductive exposed portions 33s, 33r, 34s, 34r, 35sb, 35rb, 36sb and 36rb to the circuit substrate P10 using the electrically conductive bonding material SD. Therefore, the mounting surface 13 does not easily become inclined relative to the upper surface P11 of the circuit substrate P10.

The semiconductor light emitting device 1 of the embodiment achieves the following effects.

(1-1) The side-view type semiconductor light emitting device 1 includes a multilayer substrate 10 having the plurality of substrates 10A to 10C and the conductive layer 30, and the semiconductor light emitting elements 60A and 60B. The multilayer substrate 10 has the main surface 11 on which the semiconductor light emitting elements 60A and 60B are mounted, the back surface 12 facing an opposite side of the main surface 11 and having the external electrodes 50 formed thereoin, and a mounting surface 13 intersecting both the main surface 11 and the back surface 12. The conductive layer 30 is disposed apart from both the main surface 11 and the back surface 12 in the thickness direction (the z direction) of the multilayer substrate 10, and the conductive exposed portions exposed from the mounting surface 13 include the outer conductive exposed portion 33s, the outer conductive exposed portion 34s, the inner conductive exposed portion 35sb and the inner conductive exposed portion 36sb.

According to the configuration above, when the semiconductor light emitting device 1 is mounted on the circuit substrate P10, the external electrodes 51 to 54 formed on the back surface 12 of the multilayer substrate 10 are connected to the circuit substrate P10 by the electrically conductive bonding material SD, and at the same time the conductive exposed portions 33s, 34s, 35sb and 36sb exposed from the mounting surface 13 of the multilayer substrate 10 are bonded to the circuit substrate P10 by the electrically conductive bonding material SD. Therefore, in the mounting surface 13, bonding to the upper surface P11 of the circuit substrate P10 is achieved greater in part by the side of the main surface 11 of the substrate 10 than the back surface 12 of the multilayer substrate 10, so that the semiconductor light emitting device 1 can be securely mounted on the circuit substrate P10. Moreover, the same effect is achieved by the outer conductive exposed portion 33r, the outer conductive exposed portion 34r, the inner conductive exposed portion 35rb and the inner conductive exposed portion 36rb.

(1-2) When observed from the mounting surface 13, the outer conductive exposed portion 33s, the outer conductive exposed portion 34s, the inner conductive exposed portion 35sb and the inner conductive exposed portion 36sb are disposed apart from each other in a direction orthogonal to (the y direction) the thickness direction of the multilayer substrate 10, in a state of being aligned with each other in the thickness direction (the z direction) of the multilayer substrate 10.

According to the configuration above, compared to when there is one conductive exposed portion, the mounting surface 13 is bonded to the circuit substrate P10 at a plurality of portions of the mounting surface 13 by the electrically conductive bonding material SD, so that the semiconductor light emitting device 1 can be securely mounted on the circuit substrate P10.

Moreover, because the conductive exposed portions 33s, 34s, 35sb and 36sb are aligned with each other in the z direction, they are formed in the same layer in the multilayer substrate 10. Thus, the conductive exposed portions 33s, 34s, 35sb and 36sb can be formed by the same step, hence simplifying the manufacturing steps of the multilayer substrate 10.

Moreover, because the conductive exposed portions 33s, 34s, 35sb and 36sb are arranged as separated from each other in the y direction, they can be arranged across a wide range in the y direction that is the lengthwise direction of the mounting surface 13 and be bonded to the circuit substrate P10 by the electrically conductive bonding material SD. Therefore, the overall surface of the mounting surface 10 is not easily separated from the circuit substrate P10, so that the semiconductor light emitting device 1 can be securely mounted on the circuit substrate P10. Moreover, the same effect is achieved by the outer conductive exposed portion 33r, the outer conductive exposed portion 34r, the inner conductive exposed portion 35rb and the inner conductive exposed portion 36rb.

(1-3) When observed from the mounting surface 13, the outer conductive exposed portion 33s, the outer conductive exposed portion 34s, the inner conductive exposed portion 35sb and the inner conductive exposed portion 36sb are aligned with the external electrodes 51 to 54 in an arrangement direction of the conductive exposed portions 33s, 34s, 35sb and 36sb, that is, the y direction. The respective lengths of the conductive exposed portions 33s, 34s, 35sb and 36sb in the y direction are less than the respective lengths of the external electrodes 51 to 54 in the y direction. In other words, when observed in the z direction, the external electrodes 51 to 54 extend out from the conductive exposed portions 33s, 33r, 34s, 34r, 35sb, 35rb, 36sb and 36rb.

According to the configuration above, short circuitry when the semiconductor light emitting device 1 is mounted on the circuit substrate P10 can be mitigated.

For example, in the manufacturing steps of the multilayer substrate P10, when the wiring layer 720, the first conductive layer 731, the second conductive layer 732 and the external electrode 750 are formed by patterning, due to an alignment precision of the mask for patterning, the wiring layer 720, the first conductive layer 731 and the second conductive layer 732 may become shifted relative to the external electrode 50. For example, if the length of the inner conductive exposed portion 35rb in the y direction is made to be equal to the length of the third external electrode 53 in the y direction, due to the position shift, the inner conductive exposed portion 35rb may become close to, for example, the land pad LP4 bonded to the fourth electrode 54, such that the land pad LP4 may become bonded to the inner conductive exposed portion 35rb by the electrically conductive bonding material SD.

Regarding the above, since the third external electrode 53 extends farther out with respect to the inner conductive exposed portion 35*rb* when observed in the z direction, the inner conductive exposed portion 35*rb* is not likely to extend out farther with respect to the third external electrode 53 even if a position shift is generated in the manufacturing steps of the multilayer substrate 10. Therefore, erroneous bonding between the inner conductive exposed portion 35*rb* and the land pad LP4 is inhibited. The same effect is achieved by the remaining conductive exposed portions 33*s*, 33*r*, 34*s*, 34*r*, 35*sb*, 3*sb* and 36*rb*. In other words, in contribution to the tolerance for a position shift between the conductive layer 30 and the external electrode 50, high-precision alignment is not needed so that the semiconductor light emitting device 1 can be easily manufactured.

(1-4) In the manufacturing steps of the multilayer substrate 10, the outer conductive exposed portions 33*s* and 34*s* are formed by cutting the respective common wires 731A and 731B when the substrates 710A to 710C are cut in the x direction. Thus, even if layers are formed in the presence of a shift of the mask in the y direction for patterning the first conductive layer 731, an end edge aligned with the second side surface 16 is formed in the outer conductive exposed portion 33*s*, and an end edge aligned with the first side surface 15 is formed in the outer conductive exposed portion 34*s*. Thus, in the outer conductive exposed portion 33*s*, only the position relation of, between two end edges of the outer conductive exposed portion 33*s* in they direction, the end edge close to the first side surface 15 and the fourth external electrode 54 needs to be taken into account; in the outer conductive exposed portion 34*s*, only the position relation of, between two end edges of the outer conductive exposed portion 34*s* in the y direction, the end edge close to the second side surface 16 and the first external electrode 51 needs to be taken into account.

On the other hand, in the manufacturing steps of the multilayer substrate 10, the respective common wires 731A and 731B at the inner conductive exposed portions 35*sb* and 36*sb* are not cut when the substrates 710A to 710C are cut in the x direction. Thus, when layers are formed in the presence of a shift of the mask in the y direction for patterning the first conductive layer 731, the second common wire 731B may shift toward two sides of the y direction relative to the third external electrode 53, and another second common wires 731B may shift toward two sides of the y direction relative to the second external electrode 52.

Regarding the above, in this embodiment, the lengths of the inner conductive exposed portions 35*sb* and 36*sb* in the y direction are less than the lengths of the outer conductive exposed portions 33*s* and 34*s* in the y direction. Thus, the concern for connection of the inner conductive exposed portion 35*sb* to land pads other than the land pad LP3 corresponding to the third external electrode 53 in the z direction, as well as the concern for connection of the inner conductive exposed portion 35*sb* to land pads other than the land pad LP2 corresponding to the second external electrode 52 can be alleviated. Moreover, the same effect is achieved by the outer conductive exposed portion 33*r*, the outer conductive exposed portion 34*r*, the inner conductive exposed portion 35*rb* and the inner conductive exposed portion 36*rb*.

(1-5) The outer conductive exposed portion 33*s* is exposed from both the mounting surface 13 and the second side surface 16, and the outer conductive exposed portion 34*s* is exposed from both the mounting surface 13 and the first side surface 15.

According to the configuration above, the outer conductive exposed portion 33*s*, in both the mounting surface 13 and the second side surface 16, is bonded to the circuit substrate P10 by the electrically conductive bonding material SD, and the outer conductive exposed portion 34*s*, in the mounting surface 13 and the first side surface 15, is bonded to the circuit substrate P10 by the electrically conductive bonding material SD. Therefore, the semiconductor light emitting device 1 can be securely mounted on the circuit substrate P10. Moreover, the same effect is achieved by the outer conductive exposed portion 33*r* and the outer conductive exposed portion 34*r*.

(1-6) In the multilayer substrate 10, the conductive exposed portions 33*s*, 33*r*, 34*s*, 34*r*, 35*sb*, 35*rb*, 36*sb* and 36*rb* are exposed from the mounting surface 13, and the outer conductive exposed portions 35*sa*, 35*ra*, 36*sa* and 36*ra* are exposed from the anti-mounting surface 14. That is to say, an exposing pattern of the conductive layer 30 exposed from the anti-mounting surface 14 is different from an exposing pattern of the conductive layer 30 from the mounting surface 13.

According to the configuration above, when the semiconductor light emitting device 1 is accommodated in a carrier tape, and the direction of the semiconductor light emitting device 1 is determined using an image capturing device such as a camera, the determination can be performed according to the exposing pattern of the conductive layer 30 exposed from the anti-mounting surface 14 and the exposing pattern of the conductive layer 30 exposed from the mounting surface 13. Therefore, even if the semiconductor light emitting device 1 is accommodated in a carrier tape, the direction of the semiconductor light emitting device 1 can be determined.

(1-7) The multilayer substrate 10 includes a first conductive layer 32 formed between the first substrate 10A and the third substrate 10C, and a second conductive layer 32 formed between the second substrate 10B and the third substrate 10C. The first conductive layer 31 has the outer conductive exposed portion 33*s*, the outer conductive exposed portion 34*s*, the inner conductive exposed portion 35*sb* and the inner conductive exposed portion 36*sb* exposed from the mounting surface 13. The second conductive layer 32 has the outer conductive exposed portion 33*r*, the outer conductive exposed portion 34*r*, the inner conductive exposed portion 35*rb* and the inner conductive exposed portion 36*rb* exposed from the mounting surface 13.

According to the configuration above, at a plurality of portions of the mounting surface 13 that are mutually separated from each other in the z direction, the mounting surface 13 is bonded to the circuit P10 by the electrically conductive bonding material SD, so that the semiconductor light emitting device 1 can be securely mounted on the circuit substrate P10.

(1-8) In the arrangement direction of the outer conductive exposed portion 33*s*, the outer conductive exposed portion 34*s*, the inner conductive exposed portion 35*sb* and the inner conductive exposed portion 36*sb*, that is, in the y direction, the outer conductive exposed portion 33*s*, the outer conductive exposed portion 33*r* and the fourth external electrode 54 are aligned with each other, the outer conductive exposed portion 34*s*, the outer conductive exposed portion 34*r* and the first external electrode 51 are aligned with each other, the inner conductive exposed portion 35*sb*, the inner conductive exposed portion 35*rb* and the third external electrode 53 are aligned with each other, and the inner conductive exposed portion 36*sb*, the inner conductive exposed portion 36*rb* and the second external electrode 52 are aligned with each other.

According to the configuration above, when the semiconductor light emitting device 1 is mounted on the circuit substrate P10, the connection of the outer conductive exposed portions 33s and 33r to land pads other than the land pad LP4 corresponding to the fourth external electrode 54 can be inhibited, the connection of the outer conductive exposed portions 34s and 34r to land pads other than the land pad LP1 corresponding to the first external electrode 51 can be inhibited, the connection of the inner conductive exposed portions 35sb and 35rb to land pads other than the land pad LP3 corresponding to the third external electrode 53 can be inhibited, and the connection of the inner conductive exposed portion 36sb and 36rb to land pads other than the land pad LP2 corresponding to the second external electrode 52 can be inhibited.

(1-9) When observed in the z direction, the first wire 21 and the second wire 22 in the wiring layer 20 formed on the main surface 11 of the multilayer substrate 10 are disposed at positions separated from the mounting surface 13 in the main surface 11. According to the configuration above, the electrically conductive bonding material SD can be inhibited from attaching to the first wire 21 and the second wire 22 when the semiconductor light emitting device 1 is mounted on the circuit substrate P10.

(1-10) The first wire 21 is disposed at a position separated from the second side surface 16. The second wire 22 is disposed at a position separated from the first side surface 15. Moreover, the first wire 21 and the second wire 22 are covered by the sealing resin 70. Thus, the first wire 21 is not exposed from the second side surface 16. In addition, the second wire 22 is not exposed from the first side surface 15. According to the configuration above, the electrically conductive bonding material SD can be inhibited from attaching to the first wire 21 and the second wire 22 when the semiconductor light emitting device 1 is mounted on the circuit substrate P10.

(1-11) The conductive exposed portions 33s, 33r, 34s, 34r, 35sb, 35rb, 36sb and 36rb formed to be flush with the mounting surface 13.

According to the configuration above, compared to when the conductive exposed portions 33s, 33r, 34s, 34r, 35sb, 35rb, 36sb and 36rb are inside in the x direction with respect to the mounting surface 13, the electrically conductive bonding material SD can be more easily attached to the conductive exposed portions 33s, 33r, 34s, 34r, 35sb, 35rb, 36sb and 36rb. Therefore, reduced bonding ability between the mounting surface 13 and the circuit substrate P10 can be inhibited by the electrically conductive bonding material SD, so that the semiconductor light emitting device 1 can be securely mounted on the circuit substrate P10.

(1-12) The outer conductive exposed portions 33s and 33r are flush with the second side surface 16, and the outer conductive exposed portions 34s and 34r are flush with the first side surface 15.

According to the configuration above, compared to when the outer conductive exposed portions 33s and 33r are inside in the y direction with respect to the second side surface 16, the electrically conductive bonding material SD can be more easily attached to the outer conductive exposed portions 33s and 33r. Moreover, compared to when the outer conductive exposed portions 34s and 34r are inside in the y direction with respect to the first side surface 15, the electrically conductive bonding material SD can be more easily attached to the outer conductive exposed portions 34s and 34r. Therefore, reduced bonding ability of the first side surface 15, the second side surface 16 and the circuit substrate P10 can be inhibited by the electrically conductive bonding material SD, so that the semiconductor light emitting device 1 can be securely mounted on the circuit substrate P10.

Second Embodiment

Referring to FIG. 16 to FIG. 26, a semiconductor light emitting device 1 according to a second embodiment is described below. Comparing the semiconductor light emitting device 1 of this embodiment with the semiconductor light emitting device 1 of the first embodiment, shapes of the wiring layer 20, the conductive layer 30, the connection electrodes 41 to 43 and the external electrode 50 are different. In the description below, items different from those of the first embodiment are described, and constituting elements common with those of the first embodiment are represented by the same denotations and associated details thereof omitted for brevity.

Figure 16:
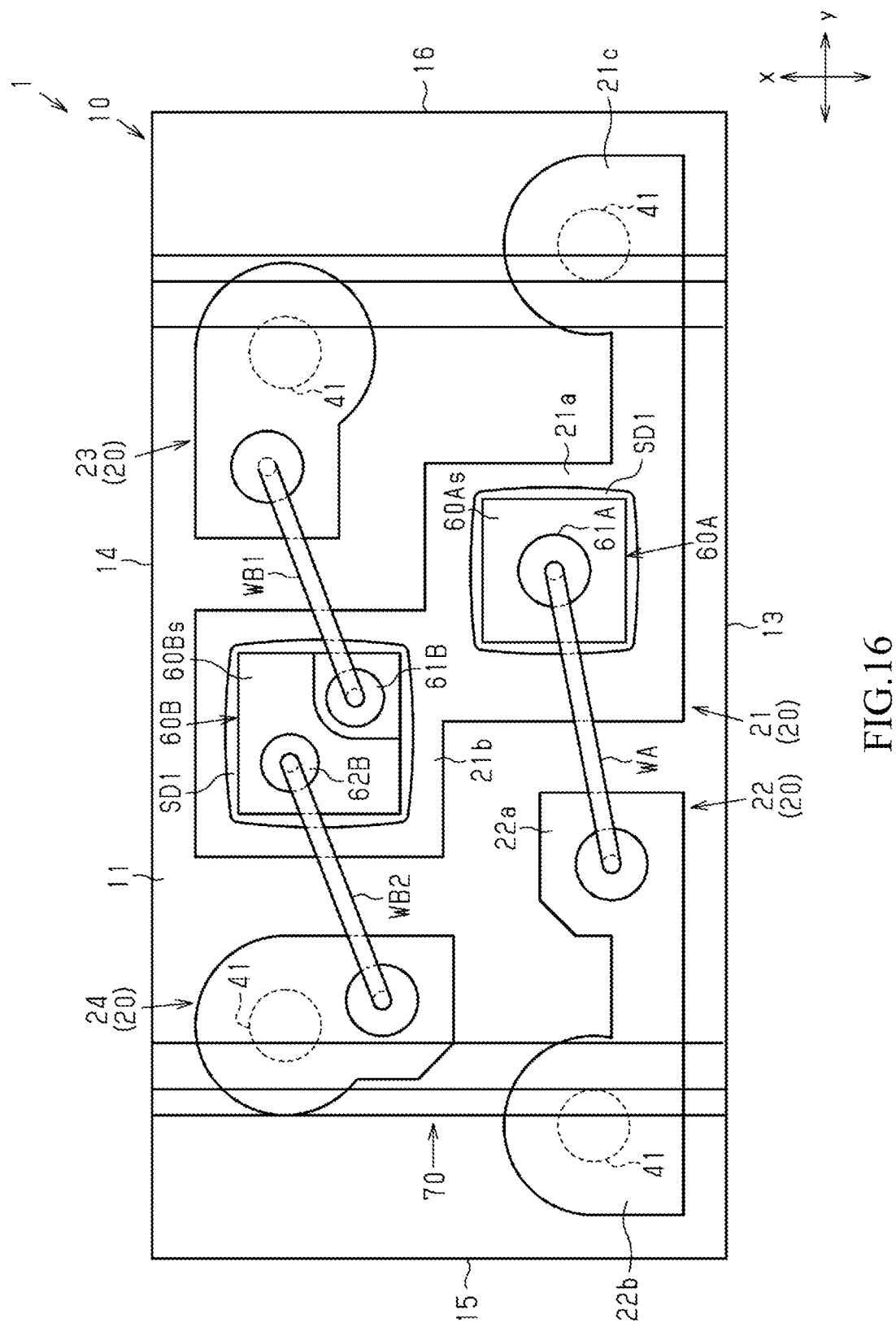
FIG. 16 is a top view of a semiconductor light emitting device according to a second embodiment.

As shown in FIG. 16, in this embodiment, the shapes of the third wire 23 and the fourth wire 24 in the wiring layer 20 are different. The connection configuration of the semiconductor light emitting elements 60A and 60B and the wiring layer 20 is the same as that of the first embodiment.

When observed in the z direction, the third wire 23 and the fourth wire 24 are arranged inside with respect to the outer periphery of the multilayer substrate 10. Between the two end edges of the third wire 23 in the y direction, the end edge closer to the second side surface 16 is closer to the first side surface 15 with respect to, between the two end edges of the first wire 21 in the y direction, the edge closer to the second side surface 16. Between the two end edges of the fourth wire 24 in the y direction, the end edge closer to the first side surface 15 is closer to the second side surface 16 with respect to, between the two end edges of the second wire 22 in the y direction, the end edge closer to the first side surface 15. Moreover, when observed in the z direction, an area of the third wire 23 is less than an area of the third wire 23 of the first embodiment, and when observed in the z direction, an area of the fourth wire 24 is less than an area of the fourth wire 24 of the first embodiment. The third wire 23 extends in the y direction, and the fourth wire 24 extends in the x direction.

Figure 17:
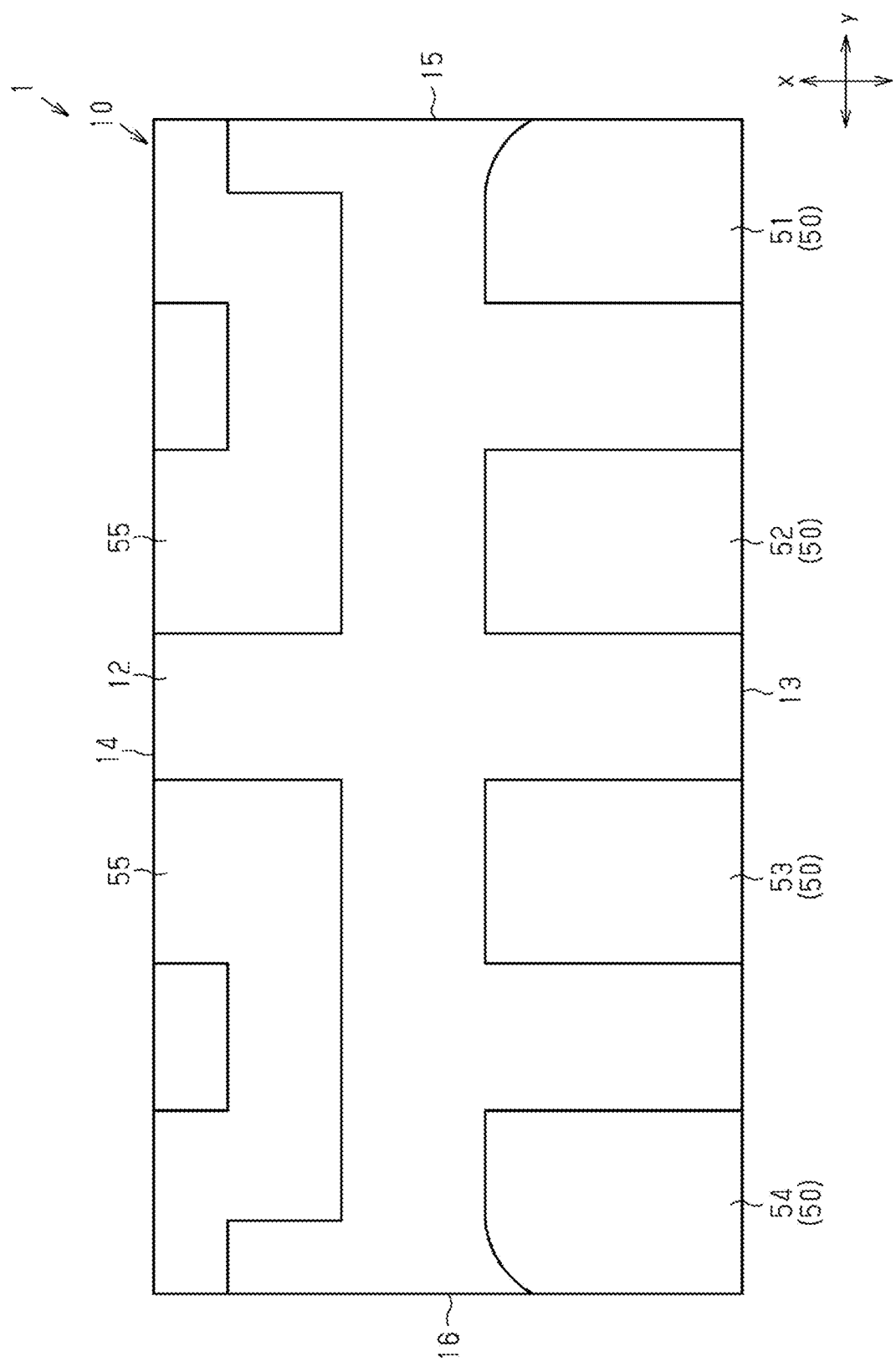
FIG. 17 is a rear view of the semiconductor light emitting device in FIG. 16.

As shown in FIG. 17, in this embodiment, the shape of the connection wire portion 55 is different. The connection wire portion 55 is disposed apart from the external electrode 50, and is not connected to the external electrode 50. Moreover, in this embodiment, the resist layer 56 (referring to FIG. 4) is omitted.

Figure 18:
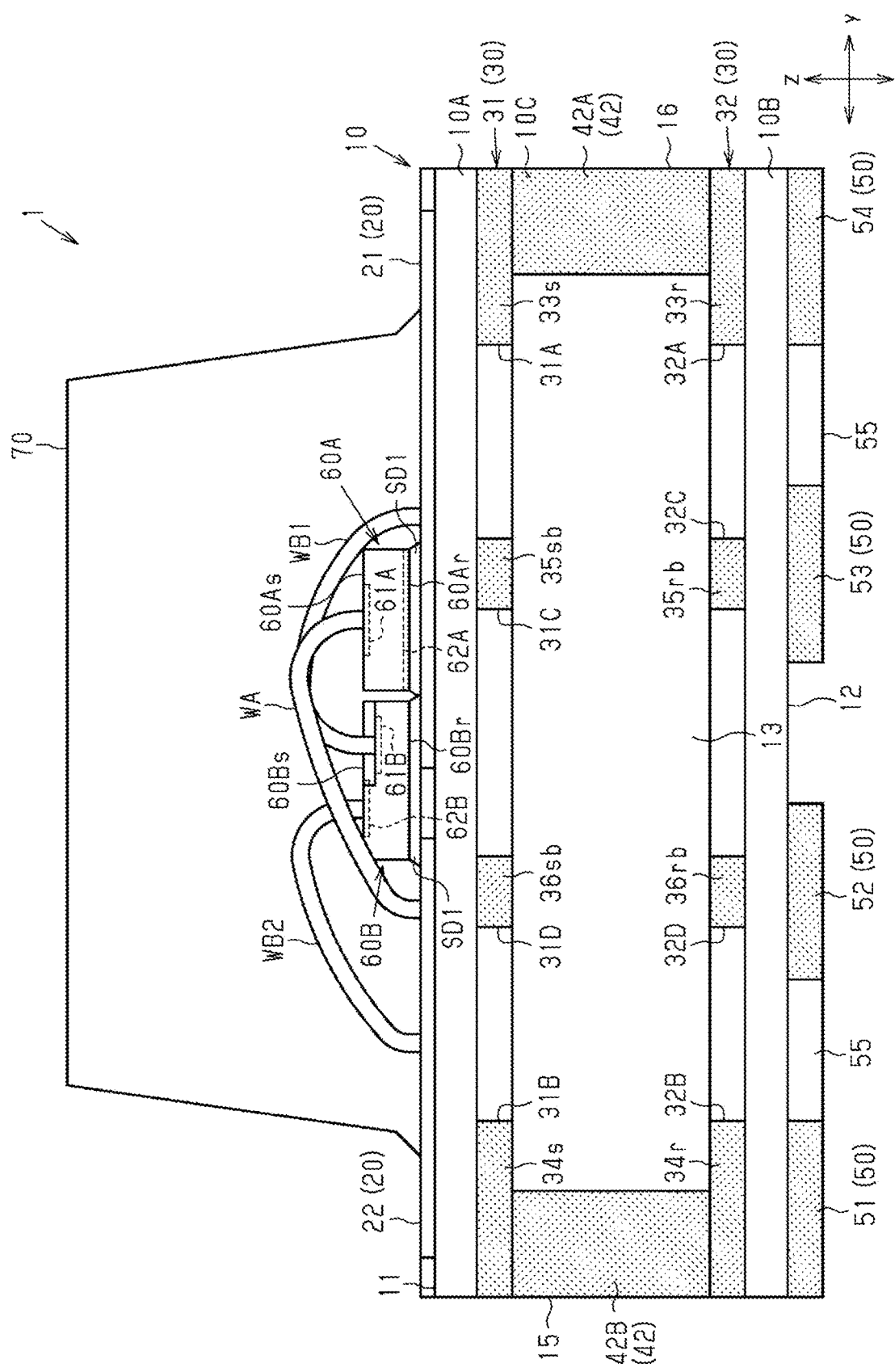
FIG. 18 is a side view of the semiconductor light emitting device in FIG. 16.
Figure 20:
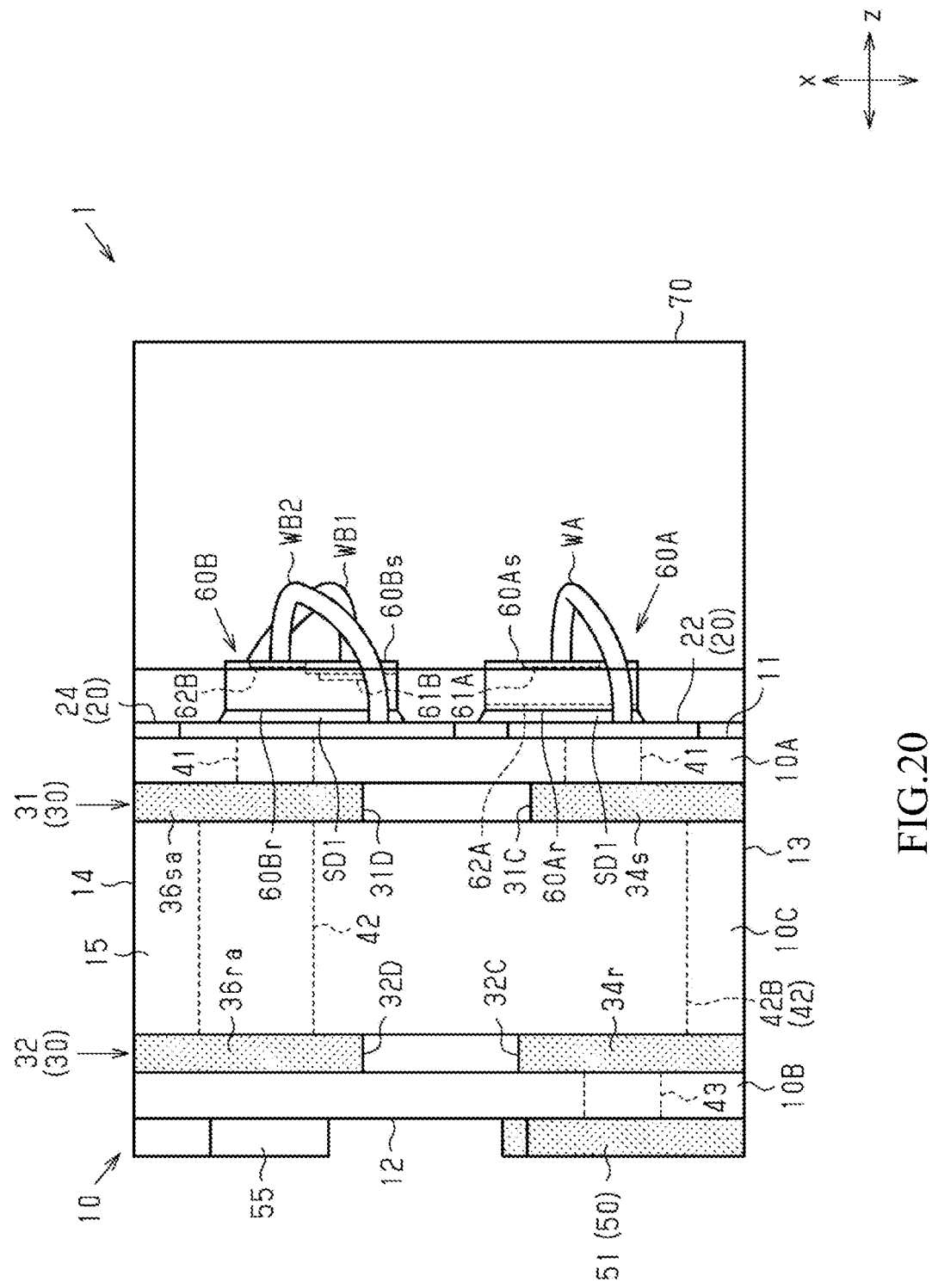
FIG. 20 is a side view of the semiconductor light emitting device in FIG. 16, when observed from different directions from those in FIG. 18 and FIG. 19.

As shown in FIG. 18, in this embodiment, the intermediate connection electrode 42 (to be referred to as an "intermediate connection electrode 42A" below) connecting the first main surface wire 31A and the first back surface side wire 32A, and the intermediate connection electrode 42 (to be referred to as an "intermediate connection electrode 42B" connecting the second main surface side wire 31B and the second back surface side wire 32B are exposed from the mounting surface 13. As shown in FIG. 20, the intermediate connection electrode 42B is not exposed from the first side surface 15. Moreover, although not shown, the intermediate connection electrode 42A is not exposed from the second side surface 16 in this embodiment. In this embodiment, the intermediate connection electrodes 42A and 42B correspond to the connection electrodes. In addition, the intermediate connection electrode 42A of this embodiment is designed as an electrode that is not exposed from the second side surface 16, but it may be exposed from the second side surface 16 due to a manufacturing error of the multilayer substrate 10.

End portions of the intermediate connection electrodes 42A and 42B are formed at positions separated from the main surface 11 in the z direction. That is to say, between the two end portions of each of the intermediate connection electrodes 42A and 42B, the end portion closer to the main surface 11 is closer to the back surface 12 with respect to the main surface 11. The intermediate connection electrode 42A and 42B are covered by the first substrate 10A in the z direction. The intermediate connection electrode 42A is covered by the first main surface side wire 31A. The intermediate connection electrode 42B is covered by the second main surface side wire 31B.

End portions of the intermediate connection electrodes 42A and 42B are formed at positions separated from the back surface 12 in the z direction. That is to say, between the two end portions of each of the intermediate connection electrodes 42A and 42B, the end portion closer to the back surface 12 is closer to the main surface 11 with respect to the back surface 12. The intermediate connection electrode 42A and 42B are covered by the second substrate 10A in the z direction. The intermediate connection electrode 42A is covered by the first back surface side wire 32A. The intermediate connection electrode 42B is covered by the second back surface side wire 32B.

When observed in the z direction, the intermediate connection electrode 42A is disposed at a position coinciding with the outer conductive exposed portions 33$s$ and 33$r$. When observed in the z direction, the intermediate connection electrode 42B is disposed at a position coinciding with the outer conductive exposed portions 34$s$ and 34$r$.

As shown in FIG. 18, in this embodiment, the lengths of the outer conductive exposed portion 33$s$ and 33$r$ in the y direction are equal to the length of the fourth external electrode 54 in the y direction. The lengths of the outer conductive exposed portion 34$s$ and 34$r$ in they direction are equal to the length of the first external electrode 51 in the y direction. However, the disclosure is not limited to the examples above. Similar to the first embodiment, the lengths of the outer conductive exposed portions 33$s$ and 33$r$ in the y direction may be less than the length of the fourth external electrode 54 in the y direction, and the lengths of the outer conductive exposed portions 34$s$ and 34$r$ in the y direction may be less than the length of the first external electrode 51 in the y direction.

In this embodiment, when observed from the mounting surface 13, the length of the intermediate connection electrode 42A in the y direction is less than the lengths of the outer conductive exposed portions 33$s$ and 33$r$ in the y direction. When observed from the mounting surface 13, the length of the intermediate connection electrode 42A in the y direction is less than the length of the fourth external electrode 54 in the y direction. When observed from the mounting surface 13, the length of the intermediate connection electrode 42A in the y direction is more than the lengths of the inner conductive exposed portions 35$sb$, 35$rb$, 36$sb$ and 36$rb$ in the y direction. In addition, when observed from the mounting surface 13, the length of the intermediate connection electrode 42B in the y direction is equal to the length of the intermediate connection electrode 42B in the y direction. However, the lengths of the intermediate connection electrodes 42A and 42B in the y direction are not limited to the examples above, and may be modified as desired.

Figure 19:
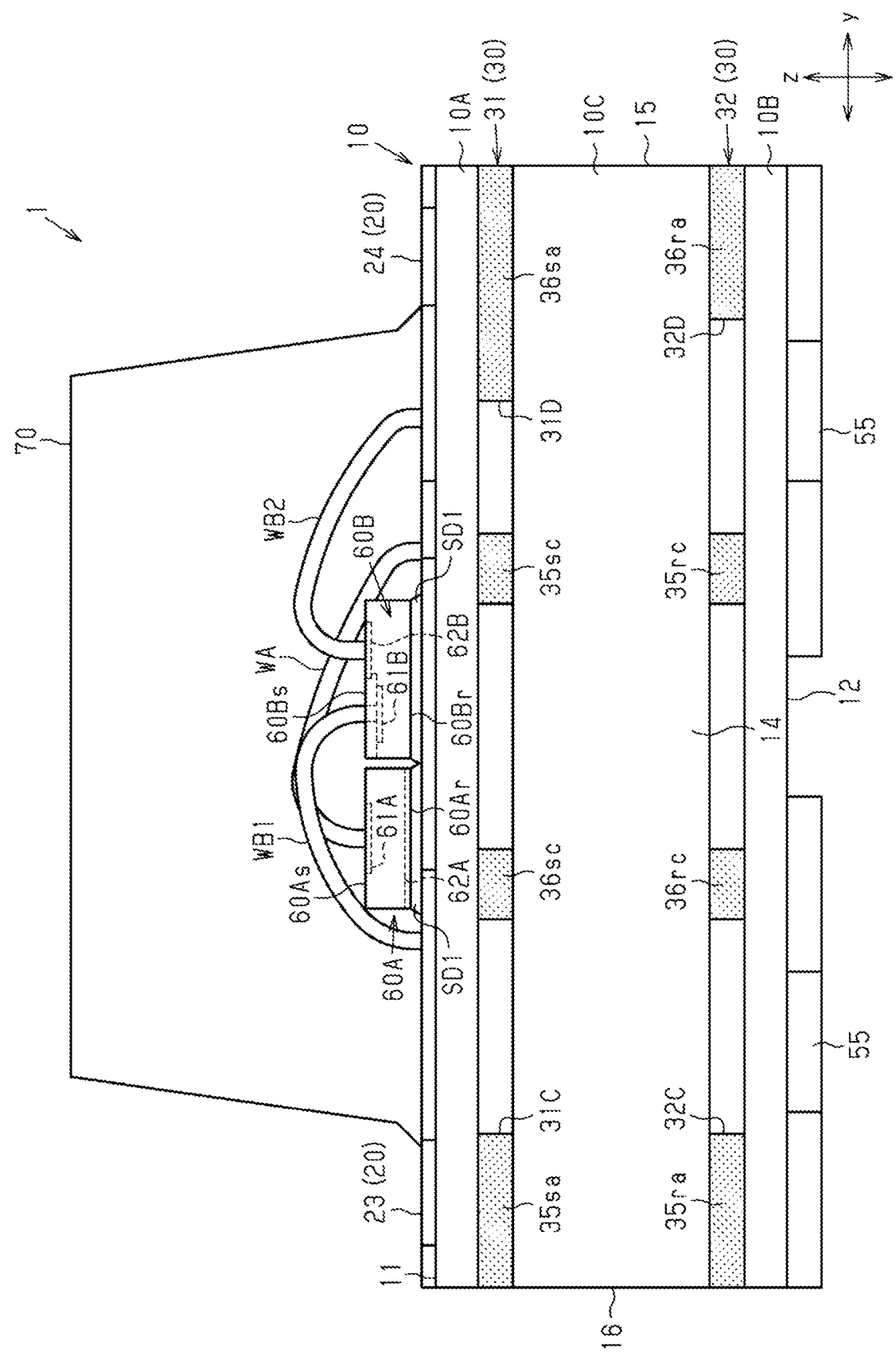
FIG. 19 is a top view of the semiconductor light emitting device in FIG. 16, when observed in an opposite side from that in FIG. 18.

As shown in FIG. 19, in this embodiment, apart from the shape (the y-direction length) of the outer conductive exposed portion 36$sa$, the exposing patterns of the first conductive layer 31 and the second conductive layer 32 exposed from the anti-mounting surface 14 are the same as the exposing patterns of the first conductive layer 31 and the second conductive layer 32 exposed from the mounting surface 13. The exposing patterns of the first conductive layer 31 and the second conductive layer 32 exposed from the mounting surface 13 are the same as the exposing patterns of the first conductive layer 31 and the second conductive layer 32 exposed from the mounting surface 13 of the first embodiment. In this embodiment, the length of the outer conductive exposed portion 36$sa$ in the y direction is more than the length of the outer conductive exposed portion 36$ra$ in the y direction. Moreover, the length of the outer conductive exposed portion 36$sa$ in the y direction may be modified as desired, for example, may be equal to that of the outer conductive exposed portion 36$ra$ or may be less than that of the outer conductive exposed portion 36$ra$.

In this embodiment, the third main surface side wire 31C has the inner conductive exposed portion 35$sc$ exposed from the anti-mounting surface 14, and the fourth main surface side wire 31D has the inner conductive exposed portion 36$sc$ exposed from the anti-mounting surface 14. The third main surface side wire 32C has the inner conductive exposed portion 35$rc$ exposed from the anti-mounting surface 14, and the fourth back surface side wire 32D has the inner conductive exposed portion 36$rc$ exposed from the anti-mounting surface 14.

As shown in FIG. 20, the exposing patterns of the first conductive layer 31 and the second conductive layer 32 exposed from the first side surface 15 are the same as the exposing patterns of the first conductive layer 31 and the second conductive layer 32 exposed from the first side surface 15 of the first embodiment.

Next, the structure of the multilayer substrate 10 is described in detail below.

Figure 21:
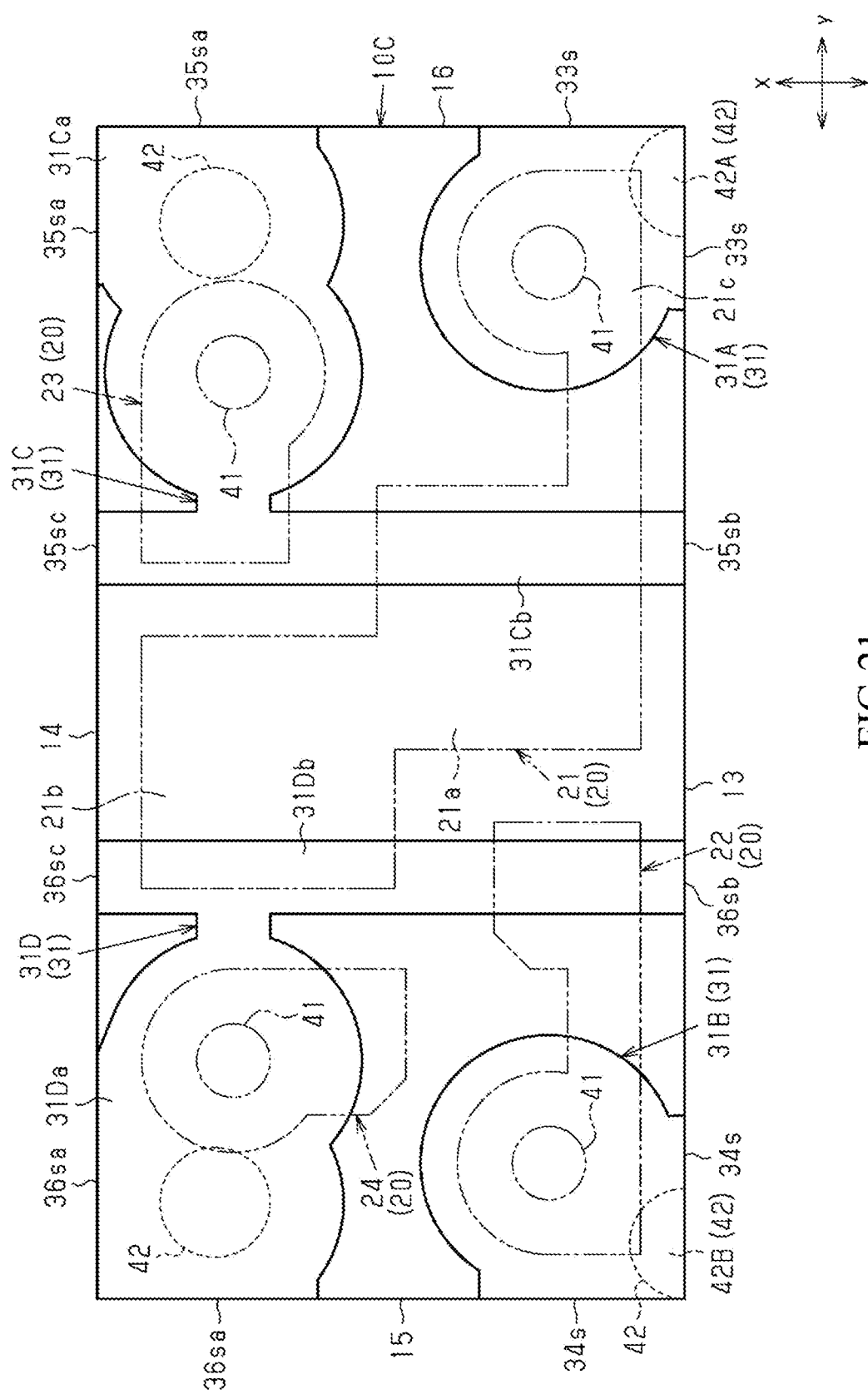
FIG. 21 is a top view of an example of a structure in a multilayer substrate in the semiconductor light emitting device in FIG. 16.

FIG. 21 shows a position relation of the first conductive layer 31 formed on the third substrate 10C and the intermediate connection electrode 42, the wiring layer 20 and the main surface side connection electrode 41. For better illustration, the wiring layer 20 and the main surface side connection electrode 41 are represented by double-dot dotted lines.

As shown in FIG. 21, similar to the first embodiment, the first conductive layer 31 has the first main surface side wire 31A, the second main surface side wire 31B, the third main surface side wire 31C and the fourth main surface side wire 31D. The shapes of the first main surface side wire 31A and the second main surface side wire 31B are substantially the same as those of the first embodiment. In the third main surface side wire 31C and the fourth main surface side wire 31D, the shapes of the extension portions 31Cb and 31$db$ are different from those of the first embodiment.

The extension portions 31Cb and 31$db$ are arranged across the mounting surface 13 to the anti-mounting surface 14, and extend in the x direction. The extension portion 31Cb is connected to the connection wire portion 31Ca, and is disposed between the first main surface side wire 31A and the extension portion 31$db$ in the y direction. The extension portion 31$db$ is connected to the connection wire portion 31Da, and is disposed between the second main surface side wire 31B and the extension portion 31Cb in the y direction.

When observed in the z direction, between two end edges of each of the extension portions 31Cb and 31$db$ in the x direction, the end edge near the mounting surface 13 is formed at the same position coinciding with the mounting surface 13. Accordingly, the inner conductive exposed portions 35$sb$ and 36$sb$ are formed. When observed in the z direction, between the two end edges of each of the extension portions 31Cb and 31$db$ in the x direction, the end edge near the anti-mounting surface 14 is disposed at a position coinciding with the mounting surface 14. Accordingly, the inner conductive exposed portions 35sc and 36sc are formed.

In this embodiment, the position of the intermediate connection electrode 42 is different from that of the first embodiment. When observed in the z direction, the intermediate connection electrodes 42A and 42B have a portion coinciding with the mounting surface 13. When observed in the z direction, the intermediate connection electrodes 42A and 42B are shaped as semi-circles. When observed in the z direction, the intermediate connection electrode 42A may also be shaped as a semi-circle (arc-shaped). The intermediate connection electrode 42 connected to the third main surface side wire 31C and the intermediate connection electrode 42 connected to the fourth main surface side wire 31D are arranged inside with respect to the outer periphery of the third substrate 10C (the multilayer substrate 10), when the two electrodes are observed in the z direction. That is to say, the intermediate connection electrode 42 is not exposed from the multilayer substrate 10.

Figure 22:
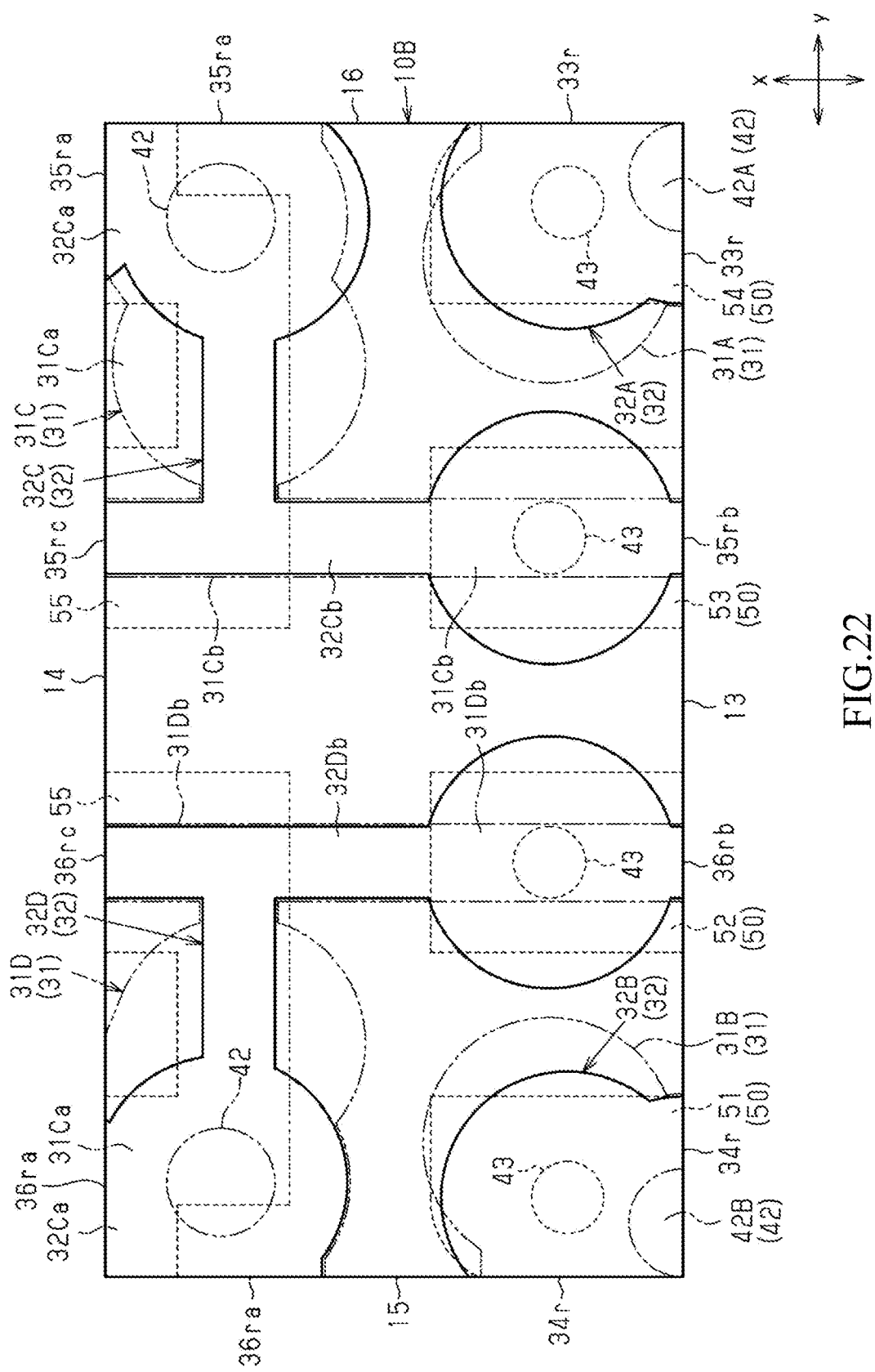
FIG. 22 is a top view of an example of a structure in a multilayer substrate in the semiconductor light emitting device in FIG. 16.

FIG. 22 shows a position relation of the second conductive layer 32 formed on the third substrate 10C and the intermediate connection electrode 42, and the external electrode 50 and the back surface side connection electrode 43. Moreover, for better illustration, the first conductive layer 31 and the intermediate connection electrode 42 are represented by double-dotted lines.

As shown in FIG. 22, similar to the first embodiment, the second conductive layer 32 has the first back surface side wire 32A, the second back surface side wire 32B, the third back surface side wire 32C and the fourth back surface side wire 32D. The shapes of the first back surface side wire 32A and the second back surface side wire 32B are substantially the same as those of the first embodiment. In the third back surface side wire 32C and the fourth back surface side wire 32D, the shapes of the extension portions 32Cb and 32db are different from those of the first embodiment.

The extension portions 32Cb and 32db are arranged across the mounting surface 13 to the anti-mounting surface 14, and extend in the x direction. The configuration relation between the extension portions 32Cb and 32db is the same as the configuration relation between the extension portions 31Cb and 32db. The extension portion 32Cb is connected to the connection wire portion 32Ca, and the extension portion 32db is connected to the connection wire portion 32Da.

When observed in the z direction, between two end edges of each of the extension portions 32Cb and 32db in the x direction, the end edge near the mounting surface 13 is disposed at the position coinciding with the mounting surface 13. Accordingly, the inner conductive exposed portions 35rb and 36rb are formed. When observed in the z direction, between the two end edges of each of the extension portions 32Cb and 32db in the x direction, the end edge near the anti-mounting surface 14 is disposed at a position coinciding with the mounting surface 14. Accordingly, the inner conductive exposed portions 35rc and 36rc are formed.

When observed in the z direction, the extension portion 32Cb is disposed at a position coinciding with third external electrode 53. The extension portion 32Cb is connected to the third external electrode 53 by the back surface side connection electrode 43. A portion in the extension portion 32Cb connected to the back surface side connection electrode 43 is more expanded than other portions of the extension portion 32Cb.

When observed in the z direction, the extension portion 32db is disposed at a position coinciding with second external electrode 52. The extension portion 32db is connected to the second external electrode 52 by the back surface side connection electrode 43. A portion in the extension portion 32db connected to the back surface side connection electrode 43 is more expanded than other portions of the extension portion 32db.

Next, an example of a wire pattern in a manufacturing process of the multilayer substrate 10 is described in detail below. Moreover, the dotted rectangles in FIG. 23 to FIG. 26 represent dimensions equivalent to those of the multilayer substrate 10. In addition, in FIG. 23 to FIG. 26, an example of a region for manufacturing eight multilayer substrates 10 is depicted. Moreover, the wire patterns shown in FIG. 23 to FIG. 26 are represented as perspective views from the main surface 11 through the multilayer substrate 10. In addition, the manufacturing method of the multilayer substrate 10 is the same as the manufacturing method of the multilayer substrate 10 of the first embodiment.

Figure 23:
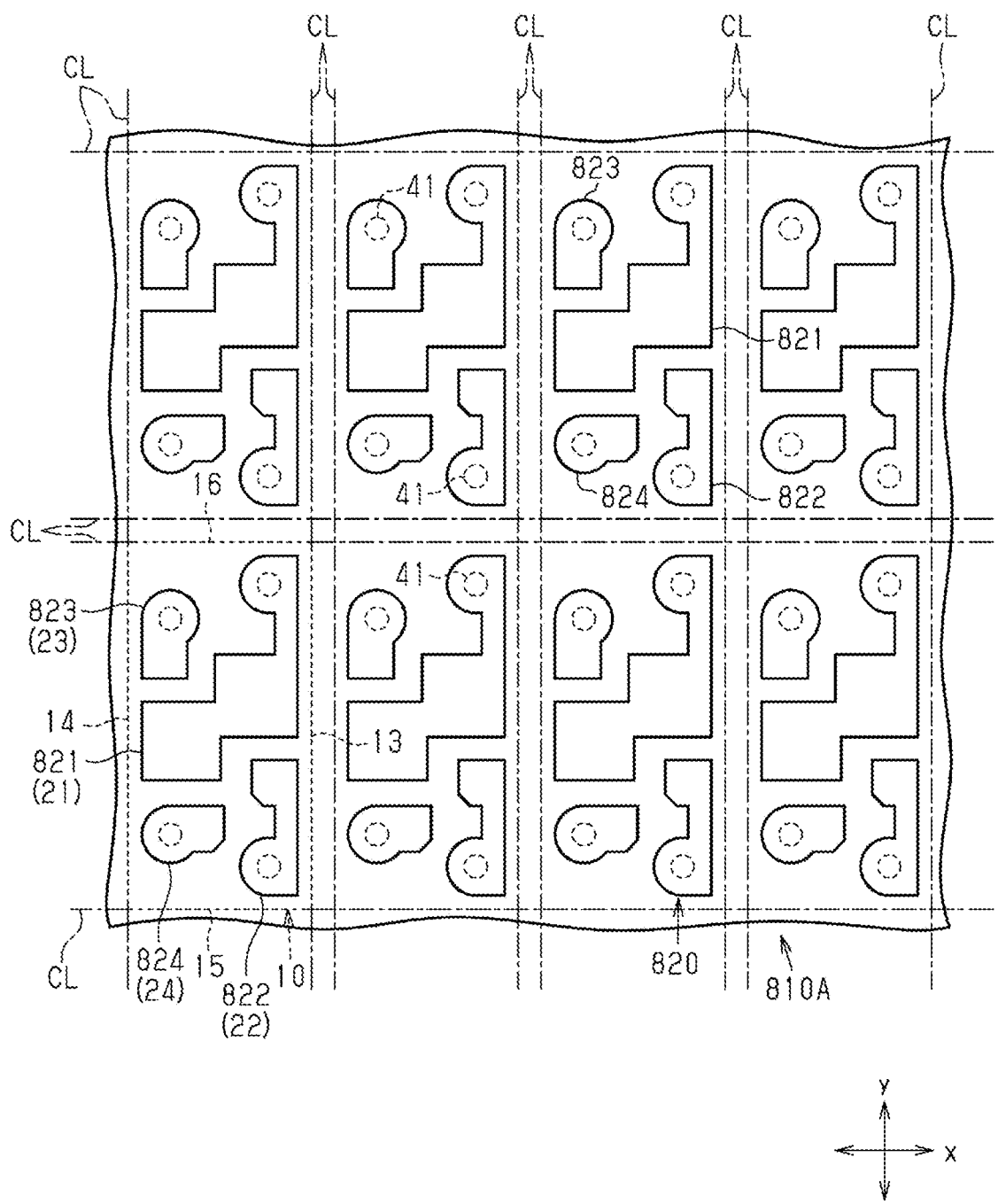
FIG. 23 is an illustration diagram for illustrating an example of a manufacturing process of a multilayer substrate.
Figure 24:
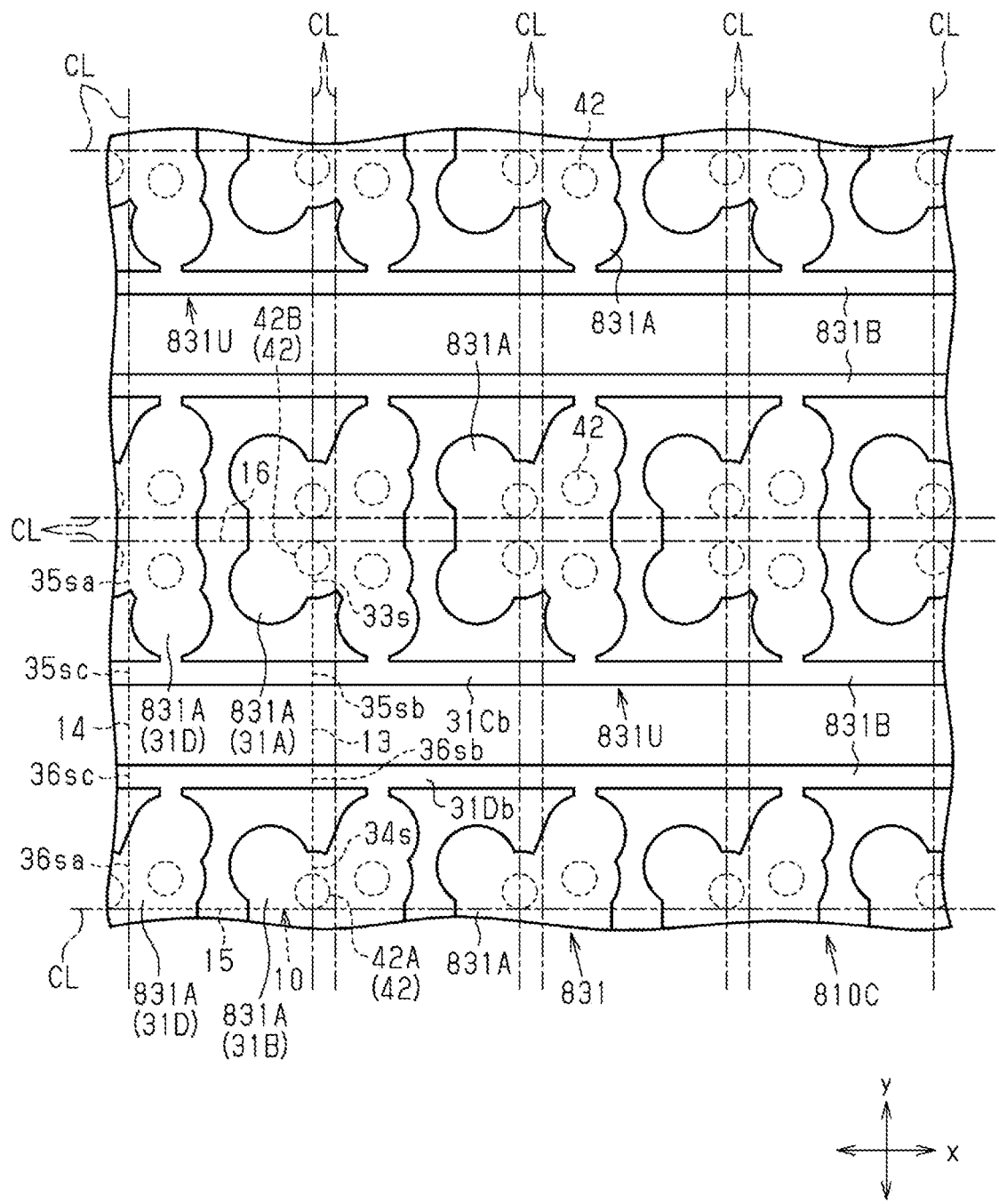
FIG. 24 is an illustration diagram for illustrating an example of a manufacturing process of a multilayer substrate.
Figure 25:
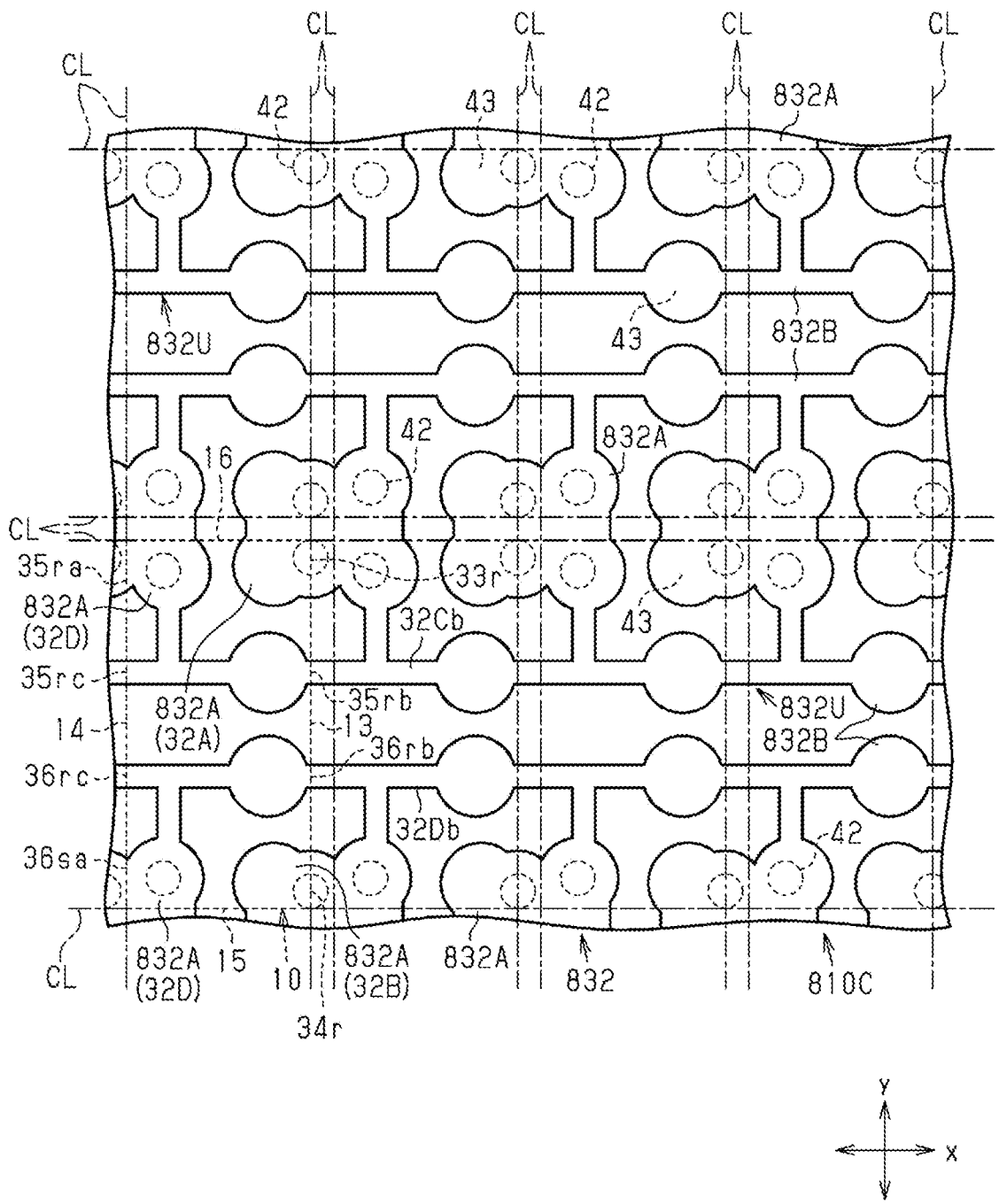
FIG. 25 is an illustration diagram for illustrating an example of a manufacturing process of a multilayer substrate.
Figure 26:
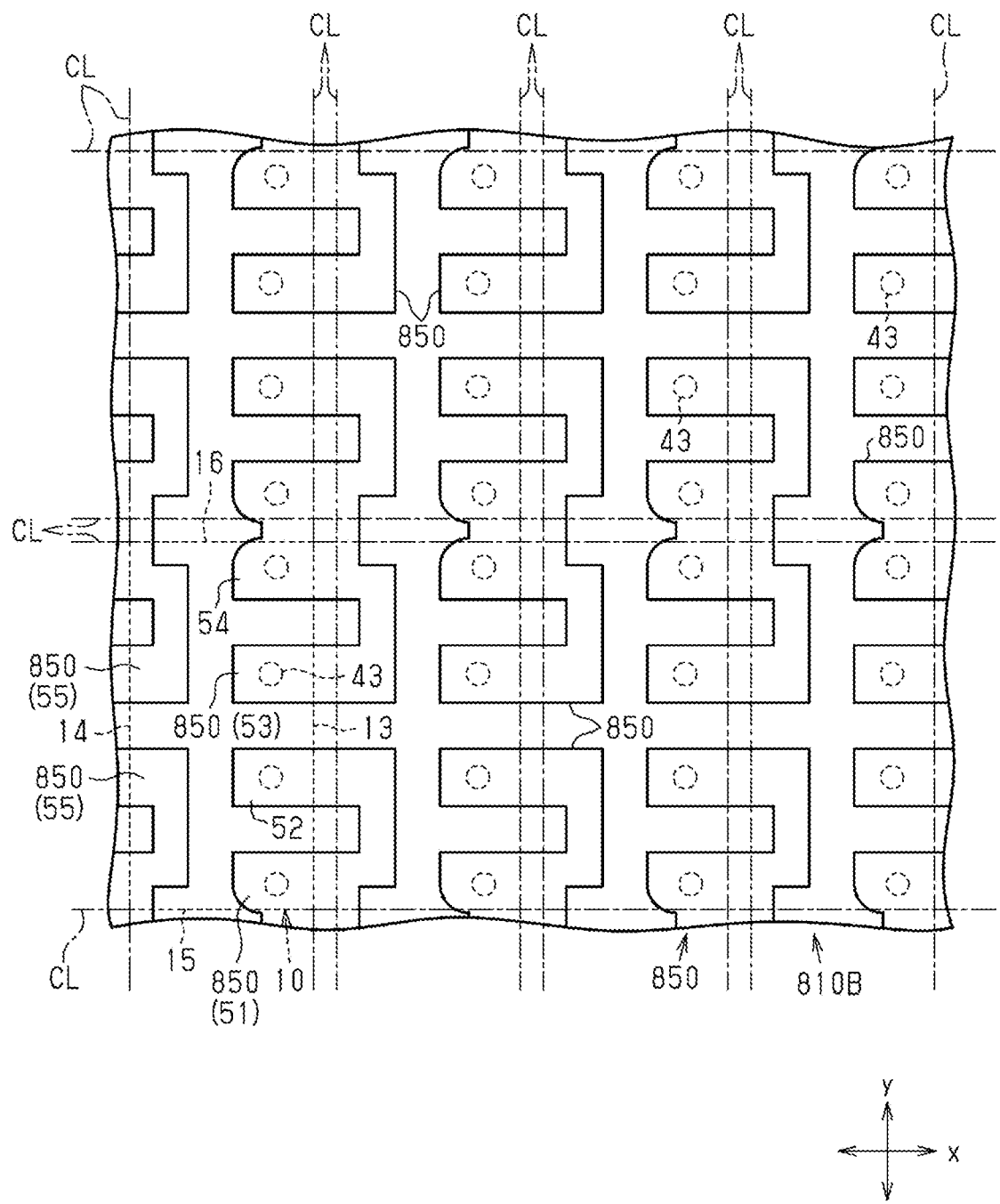
FIG. 26 is an illustration diagram for illustrating an example of a manufacturing process of a multilayer substrate.

The base material of the multilayer substrate 10 includes a first substrate 810A shown in FIG. 23, a third substrate 810C shown in FIG. 24 and FIG. 25, and a second substrate 810B shown in FIG. 26.

The first substrate 810A is a substrate corresponding to the first substrate 10A of the multilayer substrate 10, and is a substrate before being cut into having the dimensions of the multilayer substrate 10 shown in the dotted rectangles in FIG. 23. The first substrate 810A is formed to cover a main surface of the third substrate 810C and the first conductive layer 831 (to be described later) on the main surface of the third substrate 810C.

The third substrate 810C is a substrate corresponding to the third substrate 10C of the multilayer substrate 10, and is a substrate before being cut into having the dimensions of the multilayer substrate 10 shown in the dotted rectangles in FIG. 24.

The second substrate 810B is a substrate corresponding to the second substrate 10B of the multilayer substrate 10, and is a substrate before being cut into having the dimensions of the multilayer substrate 10 shown in the dotted rectangles in FIG. 25. The second substrate 810B is formed to cover a back surface of the third substrate 810C and the second conductive layer 832 (to be described later) on the back surface of the third substrate 810C.

As shown in FIG. 23, a wiring layer 820 is formed on the main surface of the first substrate 810A. Moreover, a plurality of main surface side connection electrodes 41 are formed on the first substrate 810A. As shown in FIG. 24, the first conductive layer 831 is formed on the main surface of the third substrate 810C, and as shown in FIG. 25, the second conductive layer 832 is formed on the back surface of the third substrate 810C. Moreover, a plurality of intermediate connection electrodes 42 are formed on the third substrate 810C. As shown in FIG. 26, an external electrode 850 is formed on the back surface of the second substrate 810B. Moreover, a plurality of back surface side connection electrodes 43 are formed on the second substrate 810B.

FIG. 23 shows an example of a wiring layer 820 formed at the first substrate 810A and the main surface side connection electrode 41.

The wiring layer 820 is a conductive layer corresponding to the wiring layer 20 of the multilayer substrate 10, and has a plurality of first wires 821, a plurality of second wires 822, a plurality of third wires 823 and a plurality of fourth wires 824. In addition, the method for forming the wiring layer 820 is the same as the method for forming the wiring layer 720 of the first embodiment. Each of the first wires 821 is a wire corresponding to the first wire 21 of the multilayer substrate 10, each of the second wires 822 is a wire corresponding to the second wire 22 of the multilayer substrate 10, each of the third wires 823 is a wire corresponding to the third wire 23 of the multilayer substrate 10, and each of the fourth wires 824 is the wire corresponding to the fourth wire 24 of the multilayer substrate 10. The wires 821 to 824 are formed in a manner not crossing over the cutting line CL. A plurality of main surface side connection electrodes 41 are formed on the first substrate 810A. The method for forming the main surface side connection electrodes 41 is the same as that of the first embodiment.

FIG. 24 and FIG. 25 show examples of the first conductive layer 831, the second conductive layer 832 and the intermediate connection electrode 42 formed at the third substrate 810C.

The first conductive layer 831 is a conductive layer corresponding to the first conductive layer 31 of the multilayer substrate 10. The method for forming the first conductive layer 31 is the same as the method for forming the first conductive layer 731 of the first embodiment. The first conductive layer 831 has a wiring unit 831U in which a plurality of common wires 831A arranged as separated from each other in the x direction are connected to each other by a pair of connection wires 831B. The wiring unit 831U is formed in plural form in the third substrate 810C. The plurality of wiring units 831U are arranged as separated from each other in the y direction. The pair of connection wires 831B are distributionally disposed on two sides of the common wire 831A in the y direction. The wiring unit 831U has a symmetrical shape respect to an imaginary line extending in the x direction from its center in the y direction.

Each of the common wires 831A includes the first main surface side wire 31A, the second main surface side wire 31B, a connection wire portion 31Ca of the third main surface side wire 31C, and the connection wire portion 31Da of the fourth main surface side wire 31D. The pair of connection wires 831D include the extension portion 31Cb of the third main surface side wire 31C and the extension portion 31db of the fourth main surface side wire 31D.

The third substrate 810C is cut in a manner of coinciding the multilayer substrate 10 (the dotted rectangle) with respective portions of wiring units 831U adjacent in the y direction. Accordingly, with respect to the third substrate 810C that is cut, the main surface side wires 31A to 31D separated from each other are formed. In this case, as shown in FIG. 24, the main surface side wires 31A to 31D are individually formed by four common wires 831A.

When observed in the z direction, each of the intermediate connection electrodes 42 is disposed at a position coinciding with common wire 831A. Both the intermediate connection electrode 42A and the intermediate connection electrode 42B are formed in a manner of crossing over the cut lines CL. Accordingly, when the third substrate 810C is cut, the intermediate connection electrodes 42A and 42B are exposed from a side surface (the mounting surface 13) of the third substrate 810C.

The second conductive layer 832 is a conductive layer corresponding to the second conductive layer 32 of the multilayer substrate 10. The method for forming the second conductive layer 832 is the same as the method for forming the second conductive layer 732 of the first embodiment. The second conductive layer 832 has a wiring unit 832U in which a plurality of common wires 832A arranged as separated from each other in the x direction are connected to each other by a pair of connection wires 832B. The wiring unit 832U is formed in plural form in the second substrate 810B. The plurality of wiring units 832U are arranged as separated from each other in the y direction. The pair of connection wires 832B are distributionally disposed on two sides of the common wire 832A in the y direction. The wiring unit 831U has a symmetrical shape with respect to an imaginary line extended in the x direction from its center in the y direction.

Each of the common wire 832A includes the first back surface side wire 32A, the second back surface side wire 32B, a connection wire portion 32Ca of the third back surface side wire 32C, and the connection wire portion 32Da of the fourth back surface side wire 32D. The pair of connection wires 832B include the extension portion 32Cb of the third back surface side wire 32C and the extension portion 32db of the fourth back surface side wire 32D.

The second substrate 810B is cut in a manner of coinciding the multilayer substrate 10 (the dotted rectangle) with respective portions of wiring units 832U adjacent in the y direction. Accordingly, with respect to the second substrate 810B that is cut, the back surface side wires 32A to 32D separated from each other are formed. In this case, as shown in FIG. 25, the back surface side wires 32A to 32D are individually formed by four common wires 832A.

FIG. 26 shows an example of an external electrode 850 formed at the second substrate 810B.

The external electrode 850 is a conductive layer corresponding to the external electrode 50 of the multilayer substrate 10, and is formed in plural form in the third substrate 810C. The method for forming the external electrode 850 is the same as the method for forming the external electrode 750 of the first embodiment. In the arrangement of the plurality of external electrodes 850, the external electrodes 850 of one row that are disposed apart from each other in the x direction are disposed apart from each other in the y direction. The external electrode 850 includes the first external electrode 51, the second external electrode 52, the third external electrode 53 and the fourth electrode 54. In the external electrode 850 has a shape in which the external electrodes 51 to 54 are integrated.

The second substrate 810B is cut in a manner of coinciding the multilayer substrate 10 (the dotted rectangle) with respective portions of external electrodes 850 adjacent in they direction. Accordingly, with respect to the second substrate 810B that is cut, the external electrodes 51 to 54 separated from each other and the connection wire portions 55 separated from each other are formed.

In the manufacturing method of the semiconductor light emitting device 1, the semiconductor light emitting elements 60A and 60B are mounted on the wiring layer 820 of the base material formed as described. Next, using a lead wire bonding device, the lead wires WA, WB1 and WB2 connecting the semiconductor light emitting elements 60A and 60B to the wiring layer 820 are formed.

Next, the resin layer sealing the semiconductor light emitting elements 60A and 60B and the lead wires WA, WB1 and WB2 is formed. The resin layer corresponds to the sealing resin, and seals the semiconductor light emitting elements 60A and 60B and the lead wires WA, WB1 and WB2.

Finally, the resin layer and the base material of the multilayer substrate are cut along the cutting lines CL shown in FIG. 23 to FIG. 26 by a cutting blade. Accordingly, the semiconductor light emitting device 1 is monolithically formed. The semiconductor light emitting device 1 is manufactured by the steps above.

Moreover, before mounting the semiconductor light emitting devices 60A and 60B, the base material of the multilayer substrate may also be cut along the cutting lines CL using a cutting blade. Accordingly, the multilayer substrate 10 is monolithically formed. In this case, the semiconductor light emitting elements 60A and 60B are mounted on the monolithic multilayer substrate 10.

According to the embodiment, in addition to the effects achieved by the first embodiment, the following effects may be further achieved.

(2-1) Both the intermediate connection electrode 42A connecting the first main surface side wire 31A and the first back surface side wire 32A, and the intermediate connection electrode 42B connecting the second main surface side wire 31B and the second back surface side wire 32B are exposed from the mounting surface 13.

According to the configuration above, the intermediate connection electrodes 42A and 42B can be bonded to the circuit substrate P10 by the electrically conductive bonding material SD. Thus, with the increased bonding ability between the mounting surface 13 and the circuit substrate P10, even in the presence of a force caused to be applied in a direction of the back surface 12 close to the circuit substrate P10 due to the electrically conductive bonding material SD bonding the external electrodes 51 to 54, the mounting surface 13 remains unlikely to be separated from the circuit substrate P10. Therefore, the semiconductor light emitting device 1 can be securely mounted on the circuit substrate P10.

(2-2) The first substrate 10A covers the intermediate connection electrode 42 in the z direction.

According to the configuration above, in the manufacturing steps of the semiconductor light emitting device 1, when the resin layer corresponding to the sealing resin 70 is formed, the resin material forming the resin layer is inhibited from entering the intermediate connection electrode 42 using the first substrate 810A corresponding to the first substrate 10A. According, the intermediate connection electrodes 42 exposed from the mounting surface 13 can be easily bonded to the circuit substrate P10 by the electrically conductive bonding material SD.

Third Embodiment

Referring to FIG. 27 to FIG. 37, a semiconductor light emitting device 1 according to a third embodiment is described below. The semiconductor light emitting device of this embodiment and the semiconductor light emitting device 1 of the first embodiment primarily differs in that, one semiconductor light emitting element 60C is used in substitution for the semiconductor light emitting elements 60A and 60B, and accordingly, the shapes of the wiring layer 100, the conductive layer 110 and the external electrode 130 are then different. In the description below, items different from those of the first embodiment are described, and constituting elements common with those of the first embodiment are represented by the same denotations and associated details thereof omitted for brevity.

Figure 27:
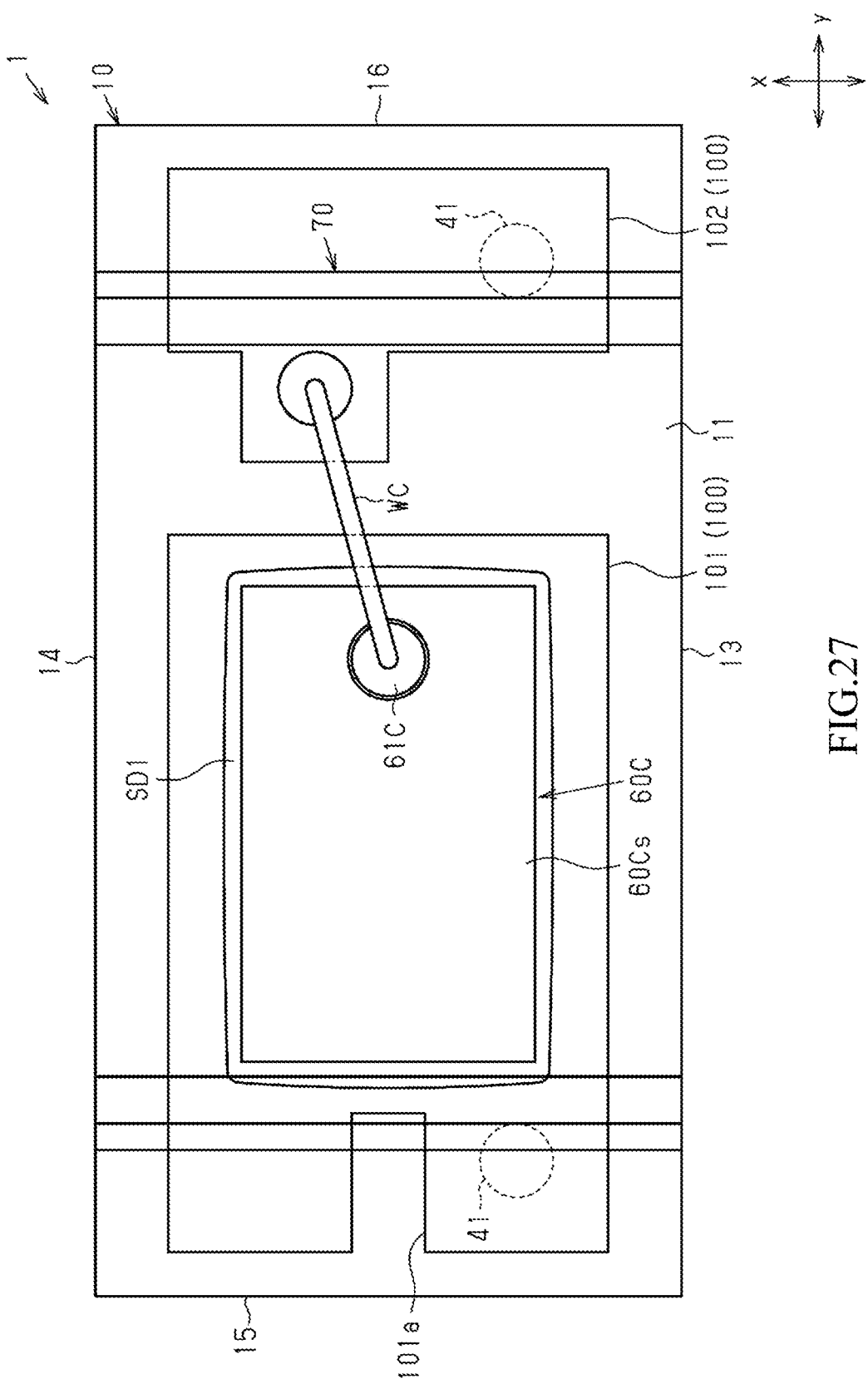
FIG. 27 is a top view of a semiconductor light emitting device according to a third embodiment.

As shown in FIG. 27, the semiconductor light emitting device 1 of this embodiment includes one semiconductor light emitting element 60C. The semiconductor light emitting element 60C is, for example, a vertical cavity surface emitting laser (VCSEL) element. Moreover, the semiconductor light emitting element 60C may also be an LED element or a photosensitive transistor. The semiconductor light emitting element 60C has an element main surface 60Cs and an element back surface 60Cr facing opposite sides in the z direction (referring to FIG. 29). The element main surface 60Cs forms a light emitting surface. A first electrode 61C is formed on the element main surface 60Cs, and a second electrode 62C is formed on the element back surface 60Cs (referring to FIG. 29).

The semiconductor light emitting element 60C is mounted on the wiring layer 100 formed at the main surface 10 of the multilayer substrate 10. The wiring layer 100, for example, includes a material same as that of the wiring layer 20 of the first embodiment, and has a first wire 101 and a second wire 102.

The first wire 101 is a wire on which the semiconductor light emitting element 60C is mounted. The second wire 102 is a wire that is electrically connected to the semiconductor light emitting element 60C. The first wire 101 and the second wire 102 are disposed apart from each other in the y direction in a state of being aligned with each other in the x direction. The second wire 102 is arranged closer to the second side surface 16 than the first wire 101 in the main surface 11.

Figure 29:
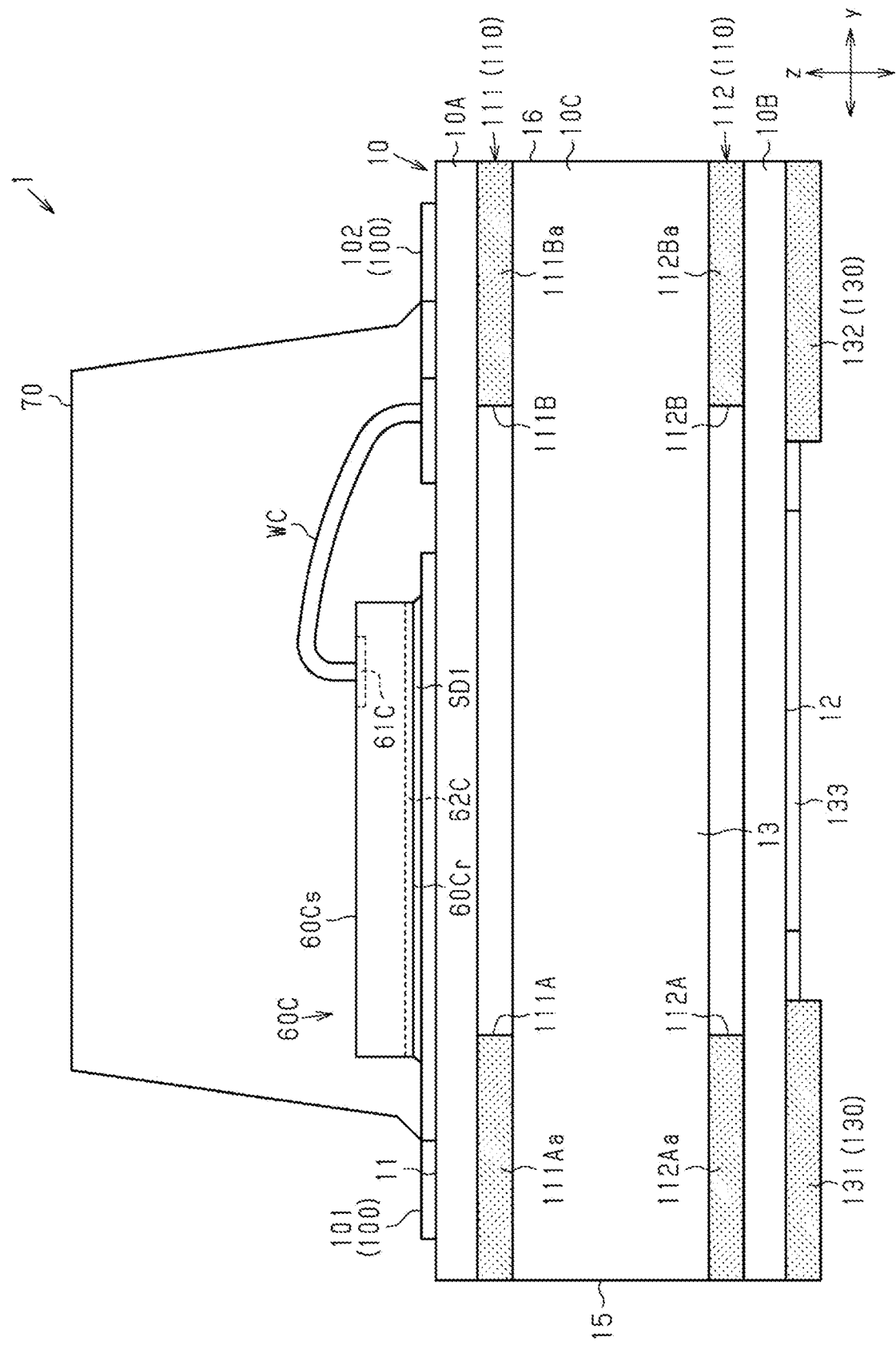
FIG. 29 is a side view of the semiconductor light emitting device in FIG. 27.

As shown in FIG. 29, the semiconductor light emitting element 60C is mounted on the first wire 101 in a manner of having the element main surface 60Cs face the same side as the main surface 11. The element back surface 60Cr of the semiconductor light emitting element 60C is bonded to the first wire 101 by an electrically conductive bonding material SD1. Accordingly, the second electrode 62C of the semiconductor light emitting element 60C is electrically connected to the first wire 101. The first electrode 61C of the semiconductor light emitting element 60C is connected to the second wire 102 by a lead wire WC. Accordingly, the first electrode 61C is electrically connected to the second wire 102.

As shown in FIG. 27, between two end portions of the first wire 101 in the y direction, a recess 101a is formed at the end portion close to the first side surface 15. The recess 101a is recessed in the y direction. The recess 101a indicates the polarity of the semiconductor light emitting device 1 (the connection direction of the semiconductor light emitting device 1).

Figure 28:
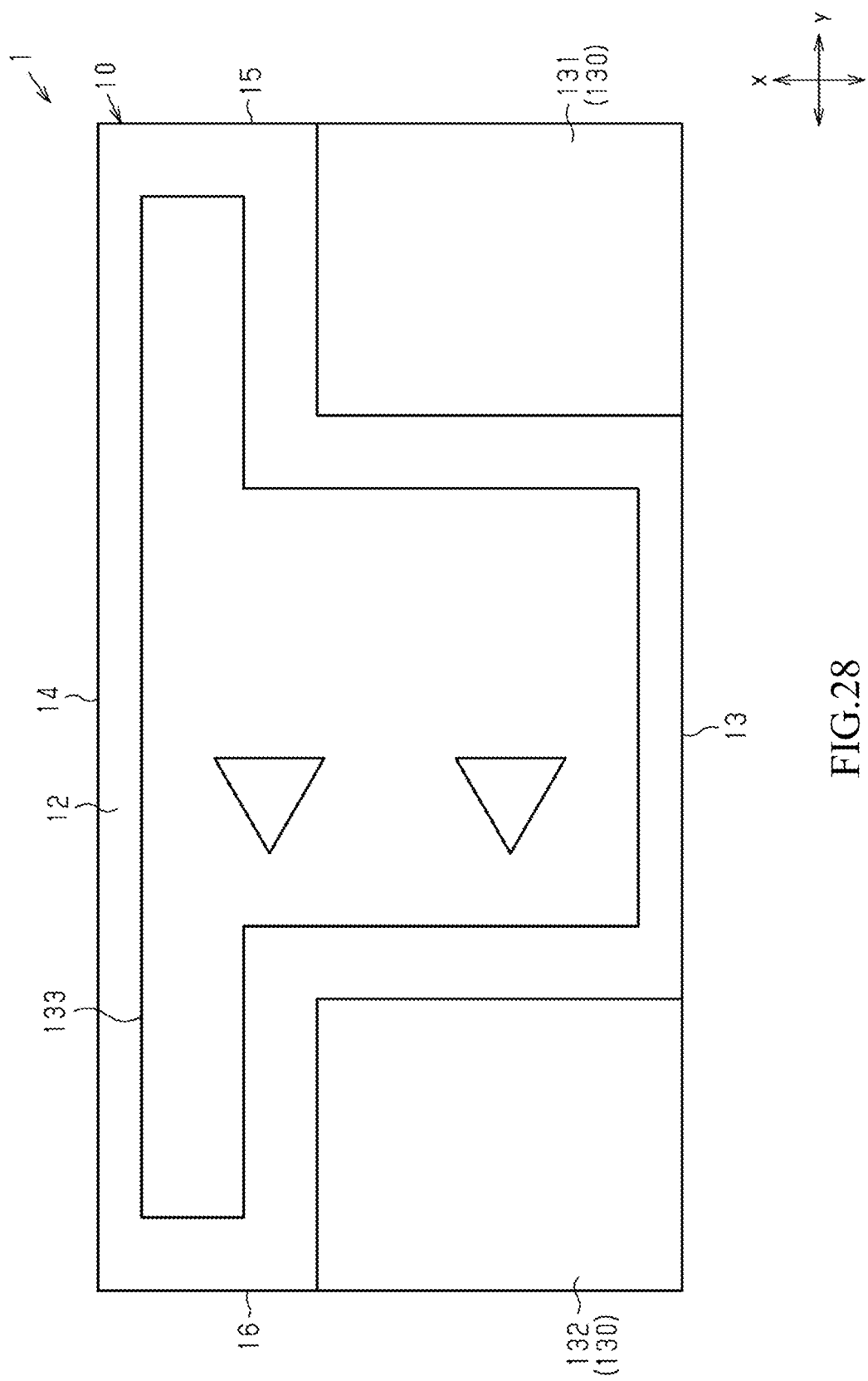
FIG. 28 is a rear view of the semiconductor light emitting device in FIG. 27.

As shown in FIG. 28, the external electrode 130 and a resistor layer 133 are formed on the back surface 12 of the multilayer substrate 10. The external electrode 130 is formed of, for example, a same material as that of the external electrode 50 of the first embodiment. The resist layer 133 is formed of, for example, a same material as that of the resist layer 56 of the first embodiment.

The external electrode 130 has a first external electrode 131 and a second external electrode 132. The first external electrode 131 and the second external electrode 132 arranged apart from each other in the y direction in a state of being aligned with each other in the x direction. The first external electrode 131 is disposed, between two end portions of the back surface 12 in the y direction, the end portion close to the first side surface 15. The second external electrode 132 is disposed, between the two end portions of the back surface 12 in the y direction, the end portion close to the second side surface 16.

The resist layer 133 indicates the polarity of the semiconductor light emitting device 1. When observed in the z direction, the resist layer 133 is shaped as a T shape, and the T shape has a portion between the first external electrode 131 and the second external electrode 132 in the y direction, and a portion closer to the anti-mounting surface 14 with respect to the external electrodes 131 and 132.

As shown in FIG. 29, the semiconductor light emitting device 1 has a conductive layer 110 shaped differently from the conductive layer 30 in substitution for the conductive layer 30. Similar to the conductive layer 30, the conductive layer 110 has a first conductive layer 111 and a second conductive layer 112. The first conductive layer 111 is formed between the first substrate 10A and the third substrate 10C, and the second conductive layer 112 is formed between the third substrate 10C and the second substrate 10B. In the z direction, the first conductive layer 111 and the second conductive layer 112 are disposed apart from both the main surface 11 and the back surface 12. The first conductive layer 111 and the second conductive layer 112 are arranged apart from each other in the x direction. The second conductive layer 112 is disposed closer to the external electrode 130 than the first conductive layer 11 in the z direction.

The structure of the multilayer substrate 10 is described in detail below.

Figure 32:
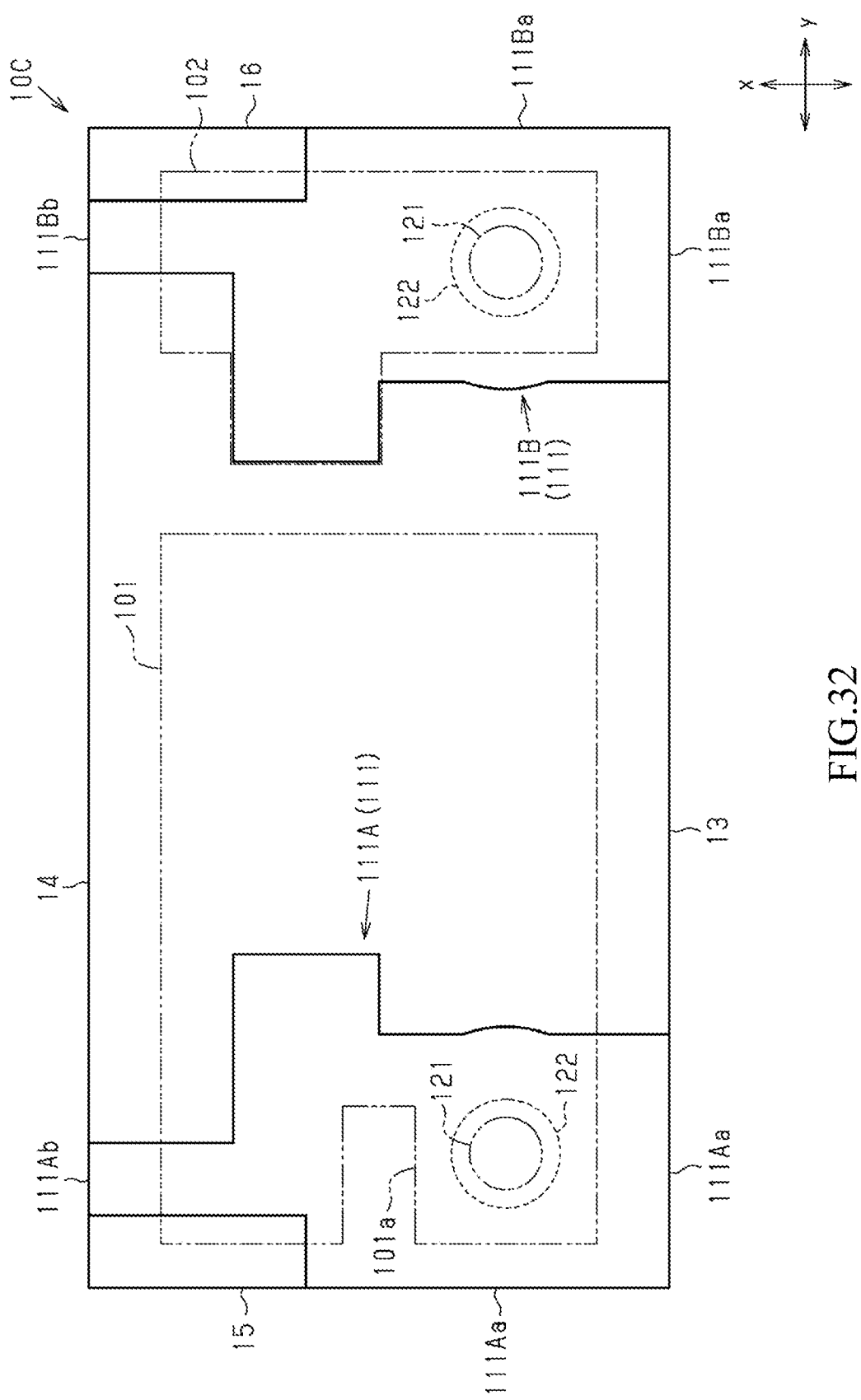
FIG. 32 is a top view of an example of a structure in a multilayer substrate in the semiconductor light emitting device in FIG. 27.

FIG. 32 shows a position relation of the first conductive layer 111 formed on the third substrate 10C and the wiring layer 100. For better illustration, the wiring layer 100 is represented by double-dotted lines.

As shown in FIG. 32, the first conductive layer 111 has a first main surface side wire 111A electrically connected to the first wire 101, and a second main surface side wire 111B electrically connected to the second wire 102. The first wire 101 is connected to the first main surface side wire 111A by the main surface side connection electrode 121 (referring to FIG. 26). The second wire 102 is connected to the second main surface side wire 111B by another main surface side connection electrode 121. When observed in the z direction, the first main surface side wire 111A is disposed at a position coinciding with the first wire 101. When observed in the z direction, the second main surface side wire 111B is disposed at a position coinciding with the second wire 102. In this embodiment, each main surface side connection electrode 121 penetrates the first substrate 10A in the z direction, and is arranged inside with respect to the outer periphery of the multilayer substrate 10. Thus, when observed in the x direction and the y direction, that is, the main surface side connection electrodes 121 are exposed from the multilayer substrate 10. Each of the main surface side connection electrodes 121 is formed similarly as the main surface side connection electrode 41 of the first embodiment.

The first main surface side wire 111A is disposed, between two end portions of the third substrate 10C in the y direction, the end portion close to the first side surface 15. The second main surface side wire 111B is disposed, between the two end portions of the third substrate 10C in the y direction, the end portion close to the second side surface 16. When observed in the z direction, the first main surface side wire 111A and the second main surface side wire 111B are symmetrical with respect to an imaginary line in the x-direction at the center of the third substrate 10C in the y-direction.

The first main surface side wire 111A is formed in the x direction across the mounting surface 13 to the anti-mounting surface 14. The first main surface side wire 111A has a conductive exposed portion 111Aa exposed from the mounting surface 13, and an opposite-side conductive exposed portion 111Ab exposed from the anti-mounting surface 14. In this embodiment, the conductive exposed portion 111Aa corresponds to the first conductive exposed portion.

When observed in the z direction, between two end edges of the conductive exposed portion 111Aa in the y direction, the end edge near the first side surface 15 is formed at the same position as the first side surface 15. That is to say, the conductive exposed portion 111Aa is also exposed from the first side surface 15. The conductive exposed portion 111Aa is continuously exposed across the mounting surface 13 to the first side surface 15. That is to say, a portion of the conductive exposed portion 111Aa exposed from the mounting surface 13 is connected to a portion exposed from the first side surface 15. Thus, as shown in FIG. 28, when observed from the mounting surface 13, the conductive exposed portion 111Aa extends from, between two end edges of the mounting surface 13 in the y direction, the end edge close to the first side surface 15 in the y direction. Moreover, as shown in FIG. 32, the conductive exposed portion 111Aa extends from, between two end edges of the first side surface 15 in the x direction, the end edge close to the mounting surface 13 in the x direction. In this embodiment, a portion of the conductive exposed portion 111Aa exposed from the first side surface 15 corresponds to an exposed portion of a side surface.

When observed in the z direction, between two end edges of the opposite-side conductive exposed portion 111Ab in the y direction, the end edge near the first side surface 15 is formed inside with respect to the first side surface 15. That is to say, the opposite-side conductive exposed portion 111Ab is not exposed from the first side surface 15.

The second main surface side wire 111B, similar to the first main surface side wire 111A, has a conductive exposed portion 111Ba and an opposite-side conductive exposed portion 111Bb. The conductive exposed portion 111Ba is also exposed from the second side surface 16. The conductive exposed portion 111Ba is continuously exposed across the mounting surface 13 to the second side surface 16. That is to say, a portion of the conductive exposed portion 111Ba exposed from the mounting surface 13 is connected to a portion exposed from the second side surface 16. In this embodiment, the conductive exposed portion 111Ba corresponds to the first conductive exposed portion. A portion of the conductive exposed portion 111Ba exposed from the second side surface 16 corresponds to an exposed portion of a side surface.

Figure 33:
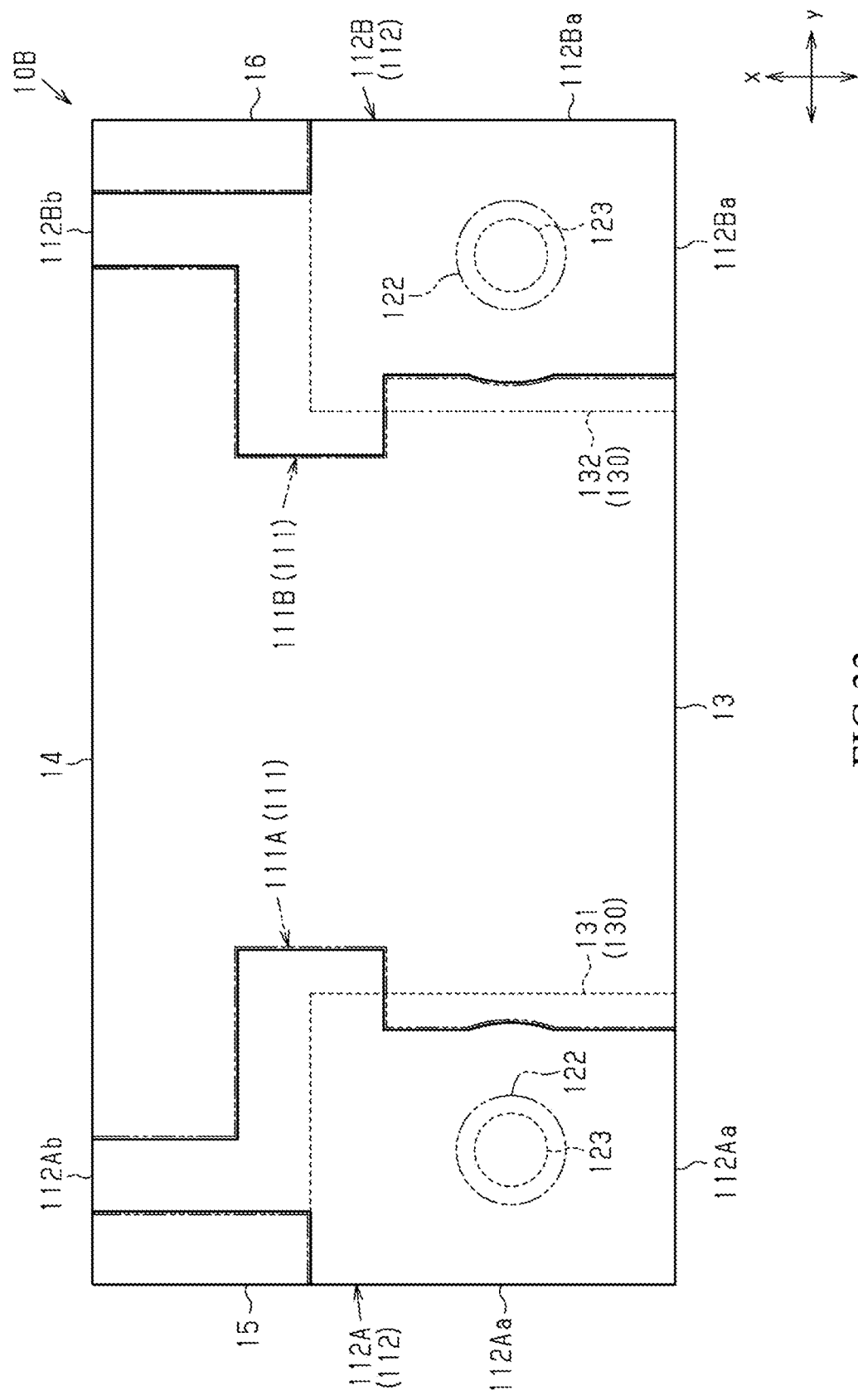
FIG. 33 is a top view of an example of a structure in a multilayer substrate in the semiconductor light emitting device in FIG. 27.

FIG. 33 shows a position relation of the second conductive layer 112 formed on the second substrate 10B and the external electrode 130. For better illustration, the first conductive layer 111 is represented by double-dotted lines.

As shown in FIG. 33, the second conductive layer 112 has a first back surface side wire 112A electrically connected to the first main surface side wire 111A, and a second back surface side wire 112B electrically connected to the second main surface side wire 111B. The first main surface side wire 111A is connected to the back surface side wire 112A by the intermediate connection electrode 122. The intermediate connection electrode 122 penetrates the third substrate 10C in the z direction. The second main surface side wire 111B is connected to the second back surface side wire 112B by another intermediate connection electrode 122. When observed in the z direction, the first back surface side wire 112A is disposed at a position coinciding with the first main surface side wire 111A. When observed in the z direction, the second back surface side wire 112B is disposed at a position coinciding with the second main surface side wire 111B. In this embodiment, each intermediate connection electrode 122 is arranged inside with respect to the outer periphery of the multilayer substrate 10. Thus, when observed in the x direction and the y direction, the intermediate connection electrodes 122 are not exposed from the multilayer substrate 10. Each of the intermediate connection electrodes 122 is formed similarly as the intermediate connection electrodes 42 of the first embodiment.

The first back surface side wire 112A is shaped the same as the first main surface side wire 111A. Thus, the first back surface side wire 112A, similar to the first main surface side wire 111A, has a conductive exposed portion 112Aa and an opposite-side conductive exposed portion 112Ab. In this embodiment, the conductive exposed portion 112Aa corresponds to the second conductive exposed portion. A portion of the conductive exposed portion 112Aa exposed from the first side surface 15 corresponds to an exposed portion of a side surface.

The second back surface side wire 112B is shaped the same as the second main surface side wire 111B. Thus, the second back surface side wire 112B, similar to the second main surface side wire 111B, has a conductive exposed portion 112Ba and an opposite-side conductive exposed portion 112Bb. In this embodiment, the conductive exposed portion 112Ba corresponds to the second conductive exposed portion. A portion of the conductive exposed portion 112Ba exposed from the second side surface 16 corresponds to an exposed portion of a side surface.

The second conductive layer 112 is connected to the external electrode 130 by the back surface side connection electrode 123. More specifically, the first back surface side wire 112A is connected to the first external electrode 131 by the back surface side connection electrode 123. The second back surface side wire 112B is connected to the second external electrode 132 by another back surface side connection electrode 123. As such, the first wire 101 is electrically connected to the first external electrode 131 by the main surface side connection electrode 121, the first main surface side wire 111A, the intermediate connection electrode 122, the first back surface side wire 112A and the back surface side connection electrode 123. The second wire 102 is electrically connected to the second external electrode 132 by the main surface side connection electrode 121, the second main surface side wire 111B, the intermediate connection electrode 122, the second back surface side wire 112B and the back surface side connection electrode 123. Each back surface side connection electrode 123 penetrates the second substrate 10B in the z direction.

Next, the relation of the first conductive layer 111, the second conductive layer 112 and the external electrode 130 is described below.

As shown in FIG. 29, since both the conductive exposed portion 111Aa and the conductive exposed portion 111B are disposed between the first substrate 10A and the third substrate 10C, they are aligned with each other in the z direction. The conductive exposed portion 111Aa and the conductive exposed portion 111Ba are arranged apart from each other in the y direction. That is to say, the y direction corresponds to the arrangement direction of the conductive exposed portions, that is, the first direction.

Since both the conductive exposed portion 112Aa and the conductive exposed portion 112Ba are disposed between the second substrate 10B and the third substrate 10C, they are aligned with each other in the z direction. The conductive exposed portion 112Aa and the conductive exposed portion 112Ba are arranged apart from each other in the y direction. Thus, the y direction may be said as the arrangement direction in which the conductive exposed portions of the conductive exposed portion 112Aa and the conductive exposed portion 112Ba are arranged. In this case, the y direction corresponds to the first direction.

As shown in FIG. 29, the conductive exposed portion 111Aa, the conductive exposed portion 112Aa and the first external electrode 131 are disposed apart in the z direction in a state of being aligned with each in the y direction. The conductive exposed portion 111Ba, the conductive exposed portion 112Ba and the second external electrode 132 are disposed apart in the z direction in a state of being aligned with each other in the y direction.

The length of the conductive exposed portion 111Aa in the y direction is equal to the length of the conductive exposed portion 111Ba in the y direction. The length of the conductive exposed portion 112Aa in the y direction is equal to the length of the conductive exposed portion 112Ba in the y direction. The length of the first external electrode 131 in the y direction is equal to the length of the second external electrode 132 in the y direction. The lengths of the conductive exposed portions 111Aa, 111Ba, 112Aa and 112Ba in they direction are less than the lengths of the external electrodes 131 and 132 in they direction. In this embodiment, the lengths of the conductive exposed portions 111Aa, 111Ba, 112Aa and 112Ba in the y direction are less than the lengths of the external electrodes 131 and 132 in they direction.

Figure 30:
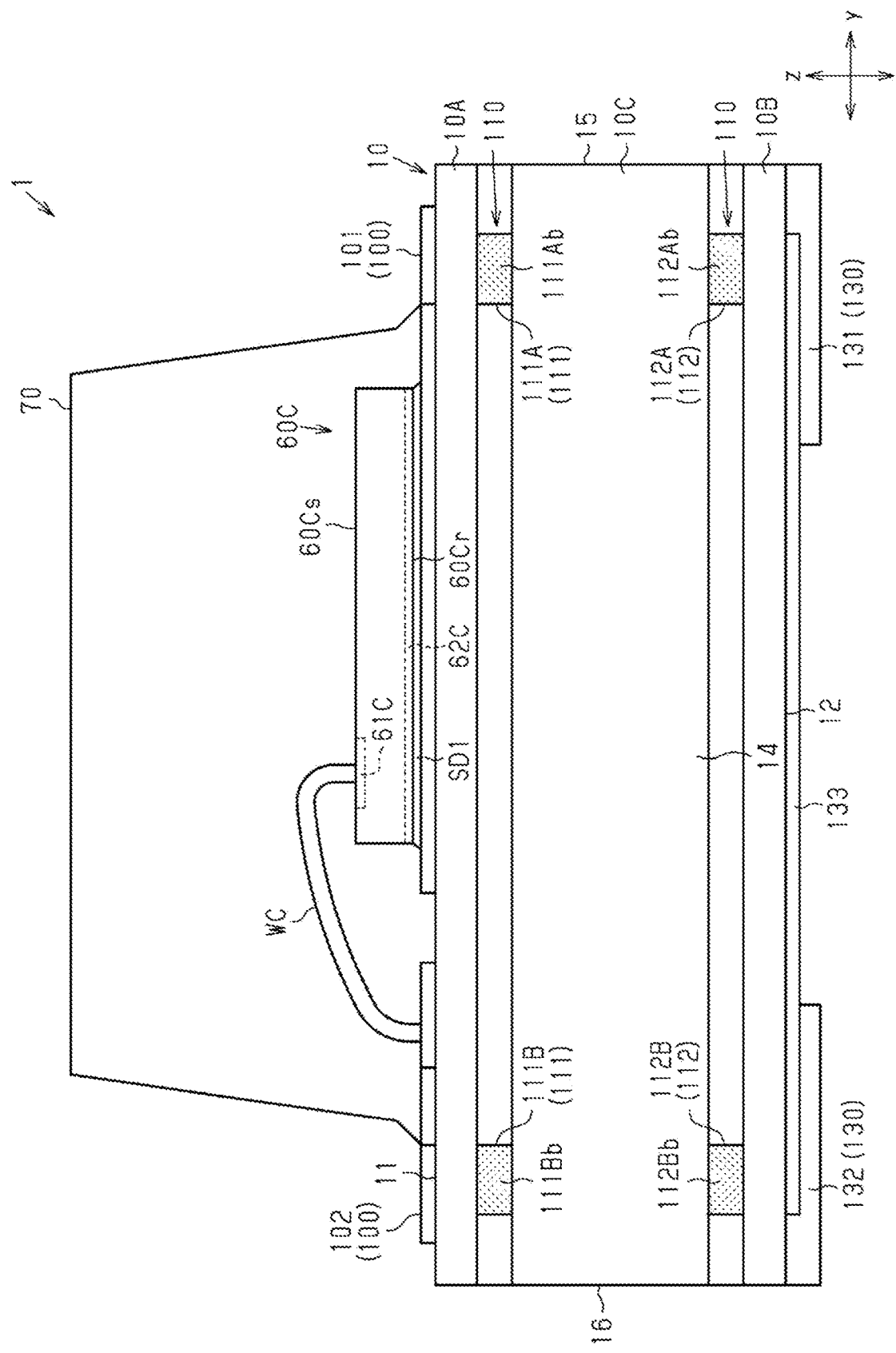
FIG. 30 is a side view of the semiconductor light emitting device in FIG. 27, when observed in an opposite side from that in FIG. 29.

As shown in FIG. 30, since both the opposite-side conductive exposed portion 111Ab and the opposite-side conductive exposed portion 111Bb are disposed between the first substrate 10A and the third substrate 10C, they are aligned with each other in the z direction. The opposite-side conductive exposed portion 111Ab and the opposite-side conductive exposed portion 111Ba are arranged apart from each other in the y direction.

Since both the opposite-side conductive exposed portion 112Ab and the opposite-side conductive exposed portion 112Bb are disposed between the second substrate 10B and the third substrate 10C, they are aligned with each other in the z direction. The opposite-side conductive exposed portion 112Ab and the opposite-side conductive exposed portion 112Bb are arranged apart from each other in the y direction.

As shown in FIG. 30, the opposite-side conductive exposed portion 111Ab and the opposite-side conductive exposed portion 112Ab are disposed apart in the z direction in a state of being aligned with each other in the y direction. The opposite-side conductive exposed portion 111Bb and the opposite-side conductive exposed portion 112Bb are disposed apart in the z direction in a state of being aligned with each other in the y direction.

The length of the opposite-side conductive exposed portion 111Ab in the y direction is equal to the length of the opposite-side conductive exposed portion 111Bb in the y direction. The length of the opposite-side conductive exposed portion 112Ab in the y direction is equal to the length of the opposite-side conductive exposed portion 112Bb in they direction. The lengths of the conductive exposed portion 111Ab and 111Bb in the y direction are equal to the lengths of the conductive exposed portions 112Ab and 112Bb in the y direction.

As shown in FIG. 29 and FIG. 30, the lengths of the conductive exposed portions 111Ab, 111Bb, 112Ab and 112Bb in they direction are less than the lengths of the conductive exposed portions 111Aa, 111Ba, 112Aa and 112Ba in the y direction. Thus, exposing patterns of the wires 111A, 111B, 112A and 112B exposed from the mounting surface 13 are different from exposing patterns of the wires 111A, 111B, 112A and 112B exposed from the anti-mounting surface 14.

Figure 31:
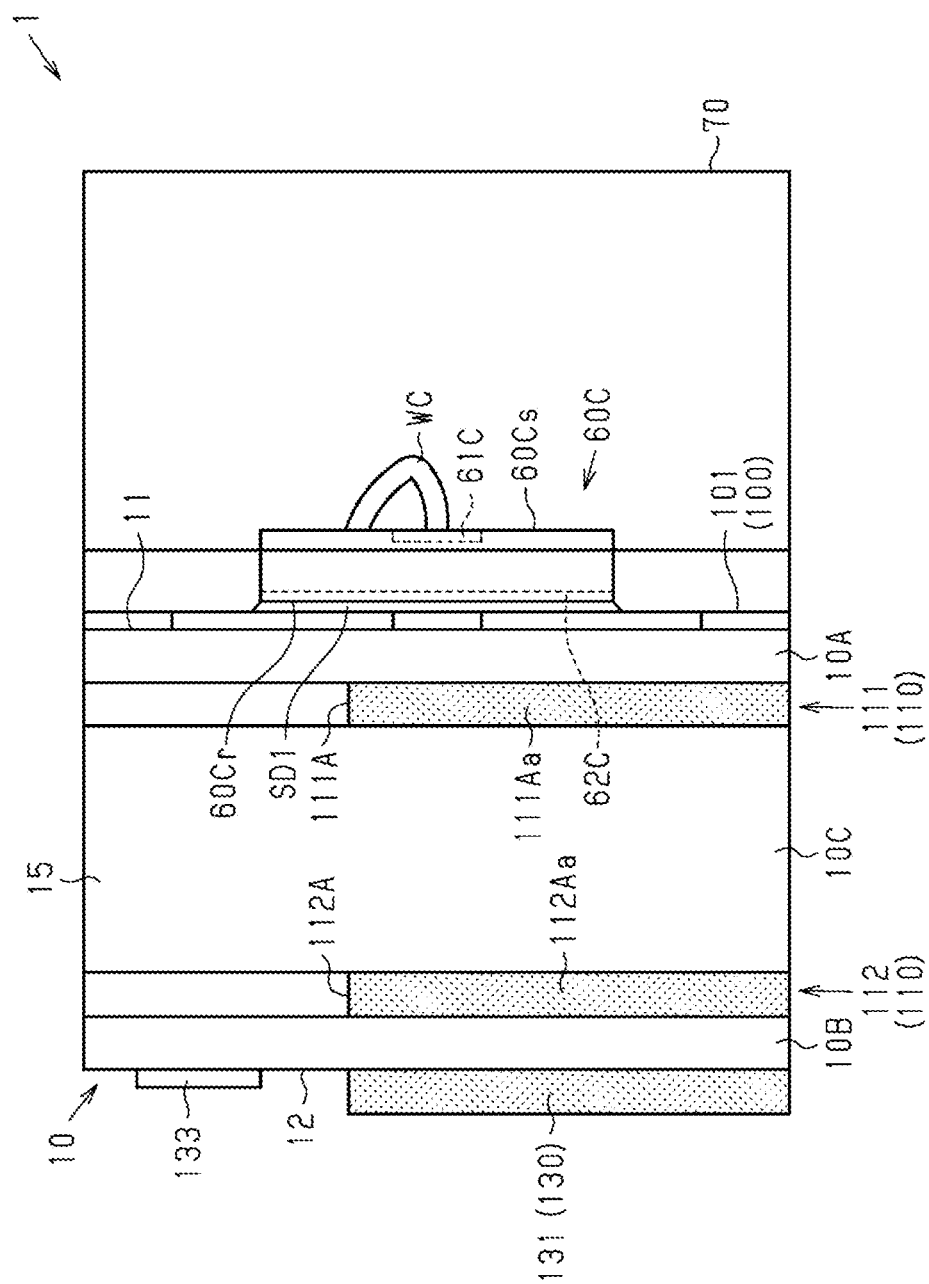
FIG. 31 is a side view of the semiconductor light emitting device in FIG. 27, when observed from different directions from those in FIG. 29 and FIG. 30.

As shown in FIG. 31, the conductive exposed portion 111Aa and the conductive exposed portion 112Aa are disposed apart in the z direction in a state of being aligned with each other in the x direction. The length of the conductive exposed portion 111Aa in the x direction is equal to the length of the conductive exposed portion 112Aa in the x direction. The lengths of the conductive exposed portions 111Aa and 112Aa in the x direction are ½ of the length of the multilayer substrate 10 in the x direction. In this embodiment, the lengths of the conductive exposed portions 111Aa and 112Aa in the x direction are more than ½ of the length of the multilayer substrate 110 in the x direction. That is to say, the conductive exposed portions 111Aa and 112Aa extend from the mounting surface 13 to positions farther away from the mounting surface with respect to the center of the first side surface 15 in the x direction. In this embodiment, the lengths of the conductive exposed portions 111Aa and 112Aa in the x direction are equal to the length of the first external electrode 131 (the external electrode 130) in the x direction. Herein, since the x direction is a direction orthogonal to both the thickness direction of the multilayer substrate 10, that is, the z direction, and the arrangement direction of the conductive exposed portions, that is, the y direction, the x direction corresponds to the second direction.

Moreover, although not shown in the drawing, the lengths of the conductive exposed portions 111Ba and 112Ba in the x direction are equal to the lengths of the conductive exposed portions 111Aa and 112Aa in the x direction. That is to say, the lengths of the conductive exposed portions 111Ba and 112Ba in the x direction are more than ½ of the length of the multilayer substrate 10 in the x direction. In this embodiment, the lengths of the conductive exposed portions 111Ba and 112Ba in the x direction are more than ½ of the length of the multilayer substrate 110 in the x direction. Thus, the conductive exposed portions 111Ba and 112Ba extend from the mounting surface 13 to positions farther away from the mounting surface 13 with respect to the center of the second side surface 16 in the x direction. In this embodiment, the lengths of the conductive exposed portions 111Ba and 112Ba in the x direction are equal to the length of the second external electrode 132 (the external electrode 130) in the x direction.

Next, an example of each wire pattern in a manufacturing process of the multilayer substrate 10 is described in detail below. Moreover, the dotted rectangles in FIG. 34 to FIG. 37 represent dimensions equivalent to those of the multilayer substrate 10. In addition, in FIG. 34 to FIG. 37, an example of a region for manufacturing a plurality of multilayer substrates 10 is depicted. Moreover, the wire patterns shown in FIG. 34 to FIG. 37 are represented as perspective views from the main surface 11 through the multilayer substrate 10. In addition, the manufacturing method of the multilayer substrate 10 is the same as the manufacturing method of the multilayer substrate 10 of the first embodiment.

Figure 34:
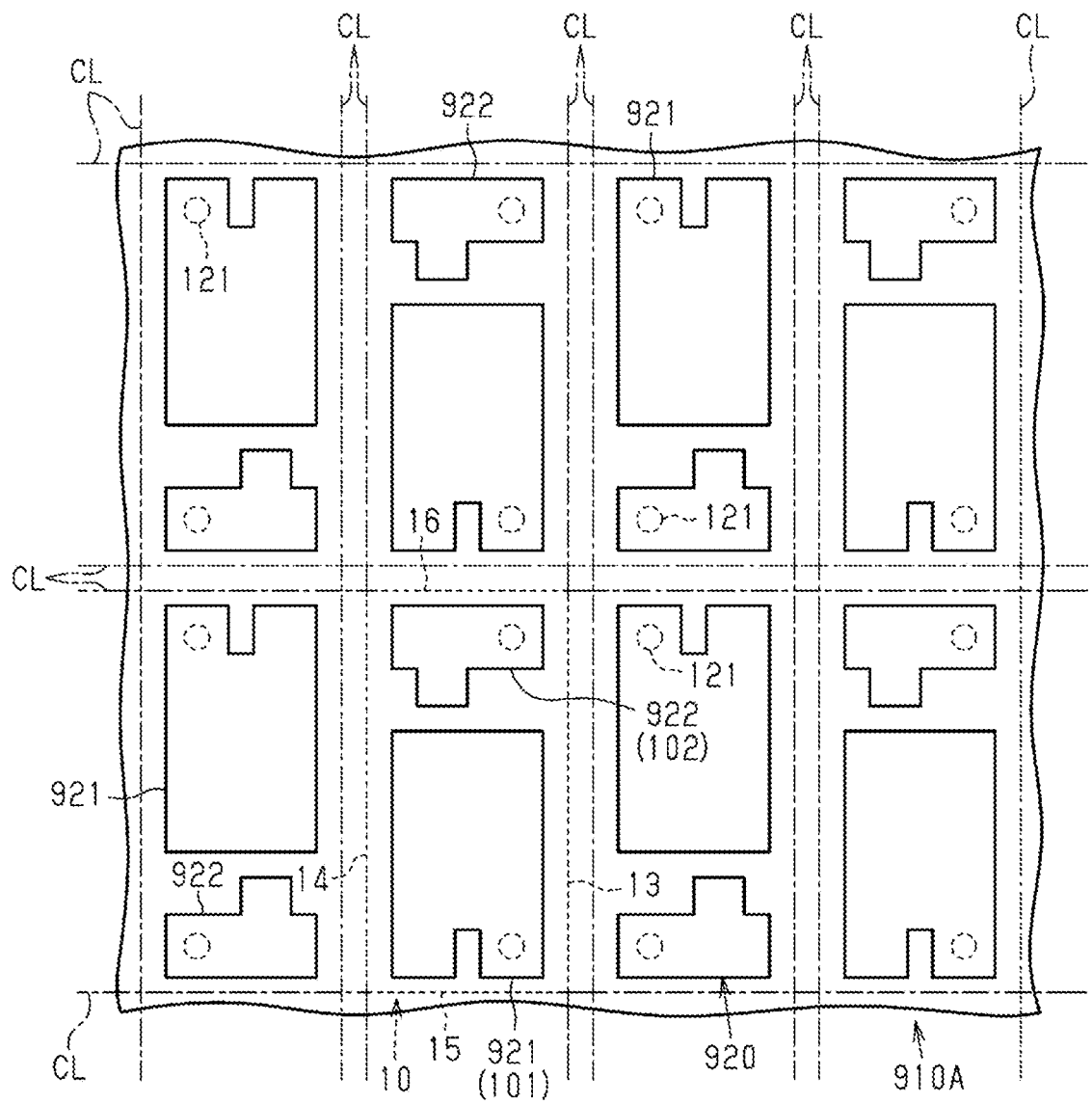
FIG. 34 is an illustration diagram for illustrating an example of a manufacturing process of a multilayer substrate.
Figure 35:
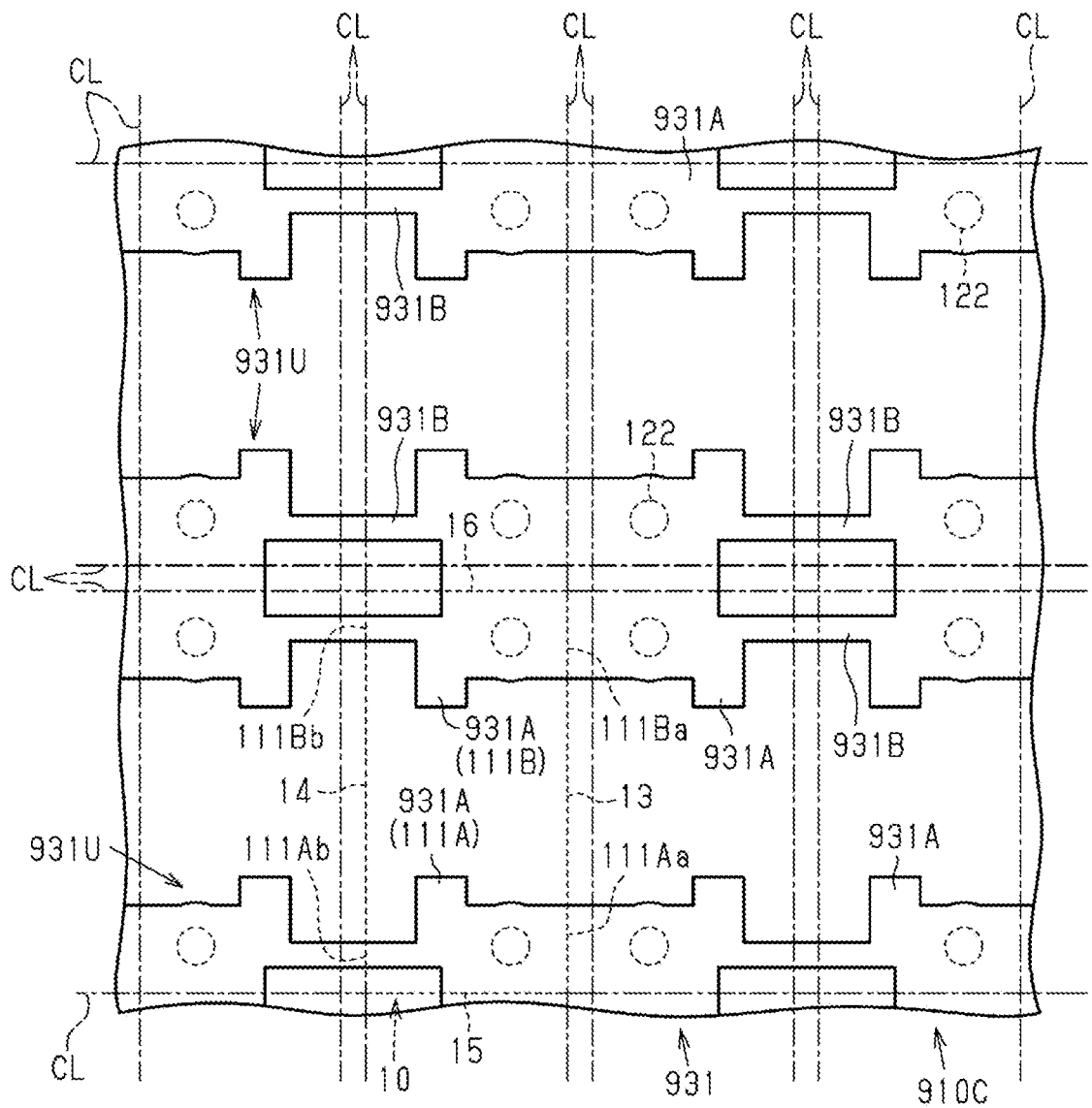
FIG. 35 is an illustration diagram for illustrating an example of a manufacturing process of a multilayer substrate.
Figure 36:
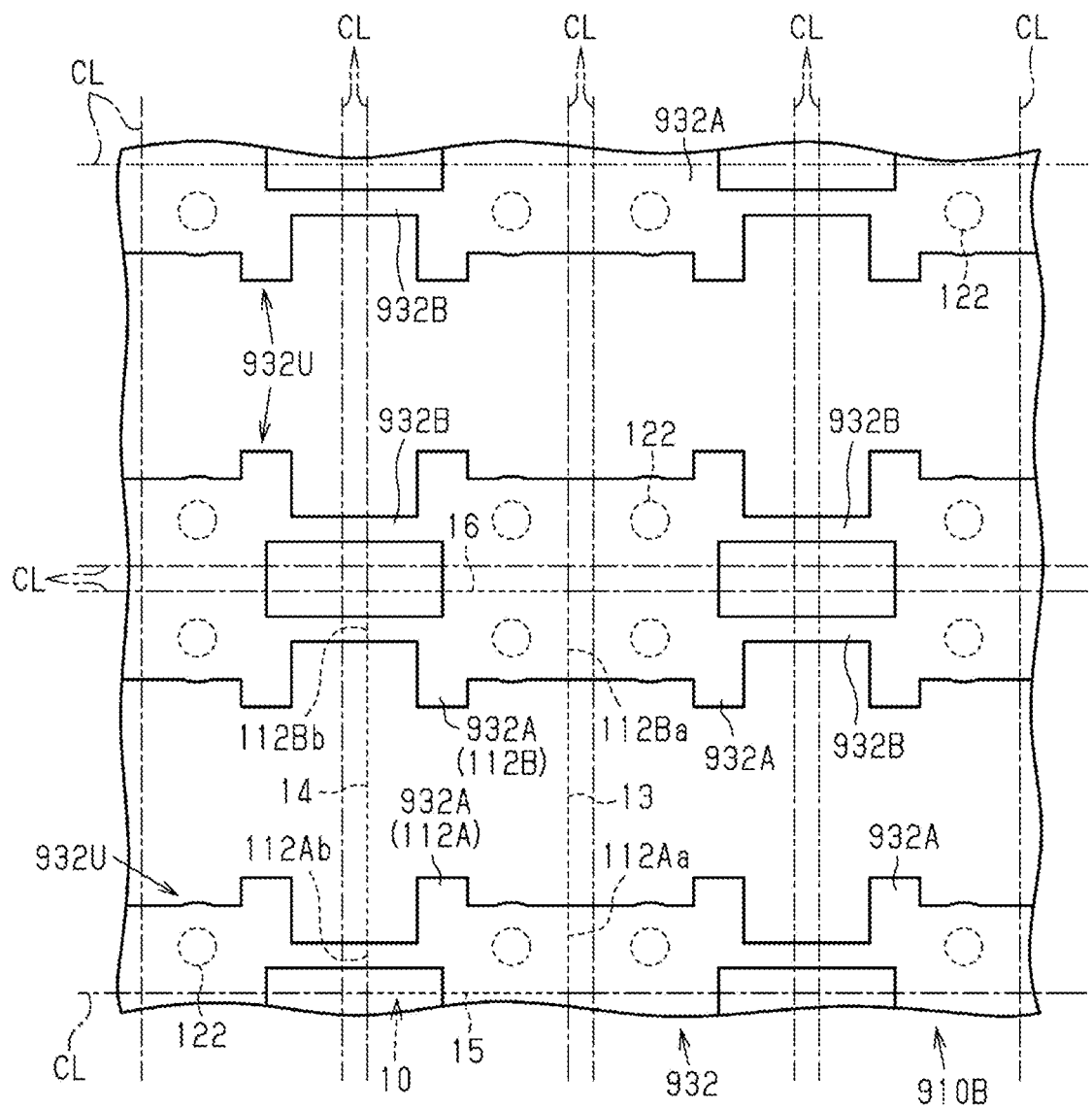
FIG. 36 is an illustration diagram for illustrating an example of a manufacturing process of a multilayer substrate.
Figure 37:
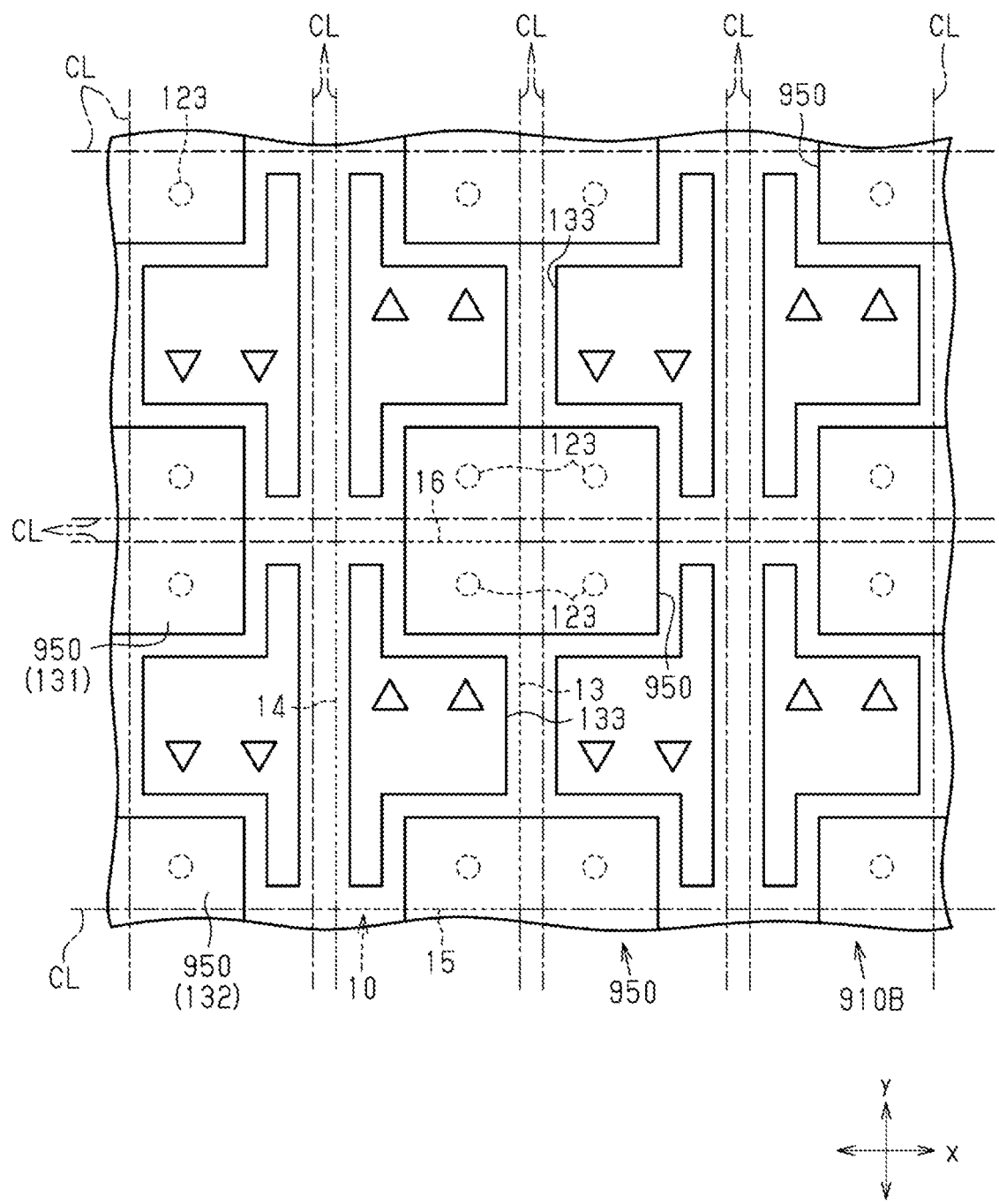
FIG. 37 is an illustration diagram for illustrating an example of a manufacturing process of a multilayer substrate.

The base material of the multilayer substrate 10 includes a first substrate 910A shown in FIG. 34, a third substrate 910C shown in FIG. 35 and FIG. 36, and a second substrate 910B shown in FIG. 37.

The first substrate 910A is a substrate corresponding to the first substrate 10A of the multilayer substrate 10, and is a substrate before being cut into having the dimensions of the multilayer substrate 10 shown in the dotted rectangles in FIG. 34. The first substrate 910A is formed to cover a main surface of the third substrate 910C and a first conductive layer 931 (to be described later) on the main surface of the third substrate 910C.

The third substrate 910C is a substrate corresponding to the third substrate 10C of the multilayer substrate 10, and is a substrate before being cut into having the dimensions of the multilayer substrate 10 shown in the dotted rectangles in FIG. 36.

The second substrate 910B is a substrate corresponding to the second substrate 10B of the multilayer substrate 10, and is a substrate before being cut into having the dimensions of the multilayer substrate 10 shown in the dotted rectangles in FIG. 37. The second substrate 910B is formed to cover a back surface of the third substrate 910C and a second conductive layer 932 (to be described later) on the back surface of the third substrate 910C.

As shown in FIG. 34, a wiring layer 920 is formed on the main surface of the first substrate 910A. Moreover, a plurality of main surface side connection electrodes 121 are formed on the first substrate 910A. As shown in FIG. 35, the first conductive layer 931 is formed on the main surface of the third substrate 910C, and as shown in FIG. 36, the second conductive layer 932 is formed on the back surface of the third substrate 910C. Moreover, a plurality of intermediate connection electrodes 122 are formed on the third substrate 910C. As shown in FIG. 37, an external electrode 950 is formed on the back surface of the second substrate 910B. Moreover, a plurality of back surface side connection electrodes 123 are formed on the second substrate 910B.

FIG. 34 shows an example a wiring layer 920 formed at the first substrate 910A and the main surface side connection electrode 41.

The wiring layer 920 is a conductive layer equivalent to the wiring layer 100 of the multilayer substrate 10, and has a plurality of first wires 921 a plurality of second wires 922. In addition, the method for forming the wiring layer 920 is the same as the method for forming the wiring layer 720. Each first wire 921 is a wire corresponding to the first wire 101 of the wiring layer 100, and each second wire 922 is a wire corresponding to the second wire 102 of the wiring layer 100. A plurality of main surface side connection electrodes 121 are formed on the first substrate 910A. The method for forming the main surface side connection electrodes 121 is the same as the method for forming the main surface side connection electrodes 41 of the first embodiment.

FIG. 35 and FIG. 36 show examples of the first conductive layer 931, the second conductive layer 932 and the connection electrode 122 formed at the third substrate 910C.

The first conductive layer 931 is a conductive layer corresponding to the first conductive layer 111 of the multilayer substrate 10. The method for forming the first conductive layer 931 is the same as the method for forming the first conductive layer 731 of the first embodiment. The first conductive layer 931 includes a wiring unit 931U, which has a plurality of common wires 931A disposed apart in the x direction, and a pair of connection wires 931B for connecting adjacent common wires 931A in the x direction. The first conductive layer 931 has a plurality of wiring units 931U, and the plurality of wiring units 931U are disposed apart from each other in the y direction.

Each common wire 931A includes portions of two first main surface side wires 111A and portions of two second main surface side wires 111B. The pair of connection wires 931B include a portion of the first main surface side wire 111A and a portion of the second main surface side wire 111B. Thus, the common wire 931A and the pair of connection wires 931B on two sides of the common wire 931A in the x direction form two first main surface side wires 111A and two second main surface side wires 111B.

The second conductive layer 932 is a conductive layer equivalent to the second conductive layer 112 of the multilayer substrate 10. The method for forming the second conductive layer 932 is the same as the method for forming the second conductive layer 732 of the first embodiment. When observed in the z direction, the shape of the second conductive layer 932 is the same as the shape of the first conductive layer 931 (referring to FIG. 35). Thus, similar to the first conductive layer 931, the second conductive layer 932 forms a plurality of wiring units 932U having a plurality of common wires 932A and a pair of connection wires 932B.

As shown by the dotted rectangles in FIG. 35, the third substrate 910C is cut along the cutting lines CL in a manner of coinciding the multilayer substrate 10 and respective portions of adjacent wiring units 931U in the y direction. Accordingly, a plurality of third substrates 10C are formed, and at the same time one first main surface side wire 111A and one second main surface side wire 111B are formed on each of the third substrates 10C.

As shown by the dotted rectangles in FIG. 36, the third substrate 910C is cut along the cutting lines CL in a manner of coinciding the multilayer substrate 10 and respective portions of adjacent wiring units 932U in the y direction. Accordingly, a plurality of third substrates 10C are formed, and at the same time one first back surface side wire 112A and one second back surface side wire 112B are formed on each of the third substrates 10C.

In FIG. 35, the cutting lines CL are formed by cutting the common wires 931A for four times in the x direction and the y direction, and by cutting the pair of connection wires 931B in the y direction. Accordingly, the first main surface side wire 111A and the second main surface side wires 111B formed by cutting the third substrate 910C along the cutting lines CL form the conductive exposed portions 111Ab, 111Bb, 111Aa and 111Ba.

In FIG. 36, the cutting lines CL are formed by cutting the common wires 932A for four times in the x direction and the y direction, and by cutting the pair of connection wires 932B in the y direction. Accordingly, the first back surface side wire 112A and the second back surface side wires 112B formed by cutting the third substrate 910C along the cutting lines CL form the conductive exposed portions 112Ab, 112Bb, 112Aa and 112Ba.

FIG. 37 shows an example of an external electrode 950 formed at the second substrate 910B.

The external electrode 950 is a conductive layer corresponding to the external electrode 50 of the multilayer substrate 10, and is formed in plural form in the third substrate 910C. The method for forming the external electrode 950 is the same as the method for forming the external electrode 750 of the first embodiment. In the arrangement of the plurality of external electrodes 950, the external electrodes 950 of one row that are disposed apart from each other in the x direction are disposed apart from each other in the y direction. The external electrode 950 has a shape in which two first external electrodes 131 and two second external electrodes 132 are integrated.

As indicated by the dotted rectangle in FIG. 37, the second substrate 910B is cut in a manner of coinciding the multilayer substrate 10 with respective portions of external electrodes 950 adjacent in the y direction. Accordingly, with respect to the second substrate 910B that is cut, one external electrode 131 and one second external electrode 132 separated from each other are formed.

In the manufacturing method of the semiconductor light emitting device 1, the semiconductor light emitting element 60C mounted on the wiring layer 920 of the base material formed as described. Next, using a lead wire bonding device, a lead wire WC connecting the semiconductor light emitting element 60C to the wiring layer 920 is formed.

Next, a resin layer sealing the semiconductor light emitting element 60C and the lead wire WC is formed. The resin layer corresponds to the sealing resin, and seals the semiconductor light emitting element 60C and the lead wire WC.

Finally, the resin layer and the base material of the multilayer substrate are cut along the cutting lines CL shown in FIG. 34 to FIG. 37 by a cutting blade. Accordingly, the semiconductor light emitting device 1 is monolithically formed. The semiconductor light emitting device 1 is manufactured by the steps above.

Moreover, before mounting the semiconductor light emitting device 60C, the base material of the multilayer substrate may also be cut along the cutting lines CL using a cutting blade. Accordingly, the multilayer substrate 10 is monolithically formed. In this case, the semiconductor light emitting element 60C is mounted on the monolithic multilayer substrate 10.

According to the semiconductor light emitting device 1 of this embodiment, in addition to the effects achieved by the first embodiment, the following effects may be further achieved.

(3-1) The lengths of the conductive exposed portions 111Aa, 112Aa, 111Ba and 112Ba in the x direction are more than ½ of the length of the multilayer substrate 10 in the x direction.

According to the configuration above, the bonding ability between the conductive exposed portions 111Aa, 112Aa, 111Ba and 112Ba and the circuit substrate P10 can be enhanced using the electrically conductive bonding material SD. As a result, the mounting surface 13 is not easily separated from the circuit substrate P10. Therefore, the semiconductor light emitting device 1 can be securely mounted on the circuit substrate P10.

(3-2) Between the two end portions of the first wire 101 in the y direction, the recess 101a is formed at the end portion close to the first side surface 15.

According to the configuration above, the polarity of the semiconductor light emitting device 1 can be determined by means of viewing the recess 101a.

Variation Examples

The embodiments are examples of means to obtain the semiconductor light emitting device related to the disclosure, and are not to be construed as limitations to the means. The semiconductor light emitting device related to the disclosure can adopt different means from those described in the exemplary embodiments. An example thereof is to replace, change, or omit a part of the configuration of each of the embodiments, or to add a new configuration to each of the embodiments. Moreover, given that no technical contradiction is resulted, the following variation examples may be used in combination. In the variation examples below, parts that are common with the embodiment describe above are denoted by the same numerals and symbols, and the related description is omitted.

Figure 38:
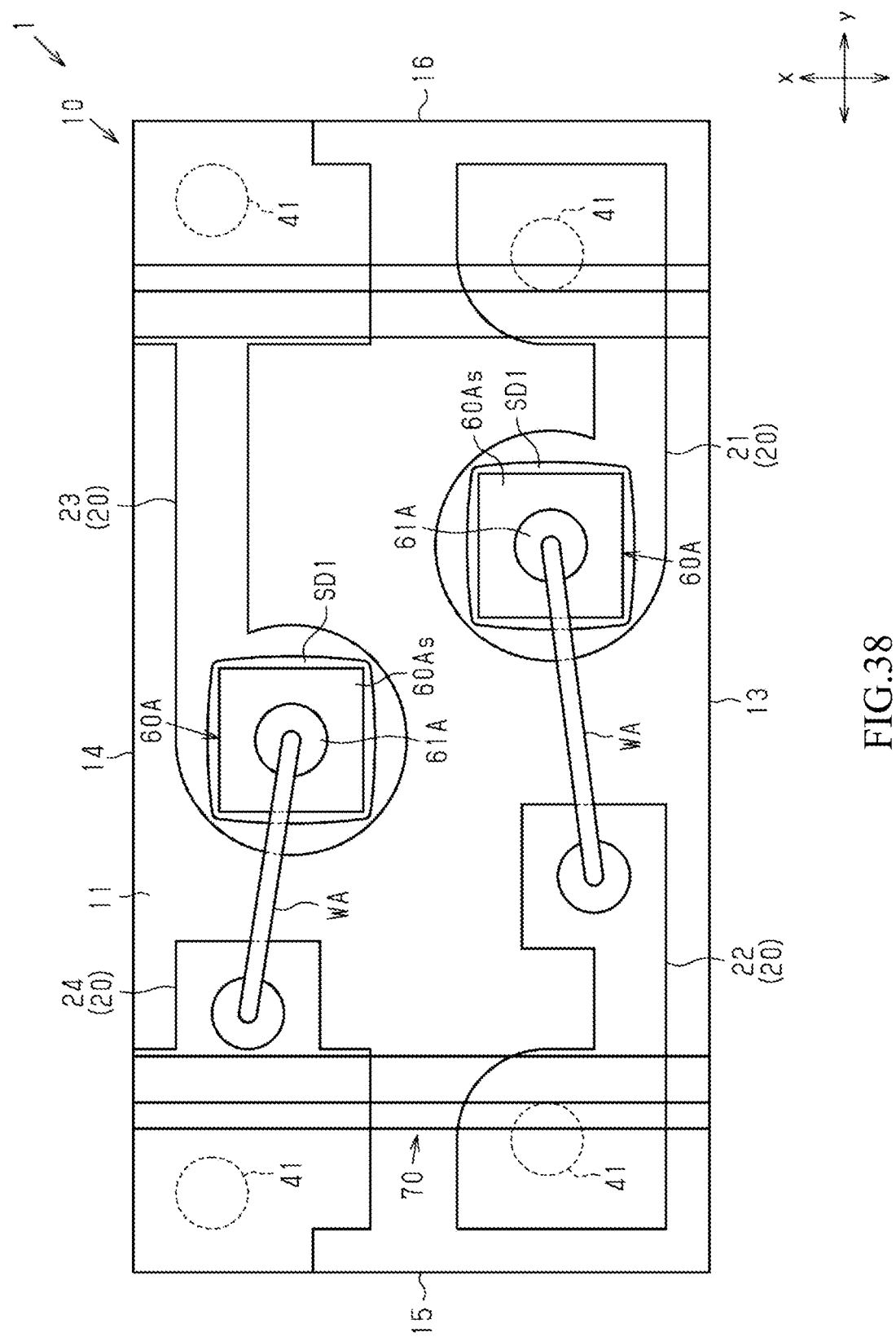
FIG. 38 is a top view of a semiconductor light emitting device according to a variation example.

In the first embodiment, the semiconductor light emitting element 60A may be used in substitution for the semiconductor light emitting element 60B. That is to say, the semiconductor light emitting device 1 may include a plurality of semiconductor light emitting elements of the same type. In this case, the shape of the wiring layer 20 may be modified according to the type of the semiconductor light emitting elements. In one example, as shown in FIG. 38, the wiring layer 20 has the first wire 21, the second wire 22, the third wire 23 and the fourth wire 24.

The first wire 21 is a wire on which one semiconductor light emitting element 60A is mounted. The second wire 22 is a wire that is electrically connected to the semiconductor light emitting element 60A. The third wire 23 is a wire on which another semiconductor light emitting element 60A is mounted. The fourth wire 24 is a wire that is electrically connected to the another semiconductor light emitting element 60A. Similar to the first embodiment, when observed in the z direction, both the first wire 21 and the second wire 22 are arranged inside with respect to the outer periphery of the main surface 11 of the multilayer substrate 10.

A second electrode 62A formed at an element back surface 60Ar of the one semiconductor light emitting element 60A is electrically connected to the first wire 21 by the electrically conductive bonding material SD1. As such, the second electrode 62A is electrically connected to the fourth external electrode 54 by the first wire 21, the main surface side connection electrode 41, the first main surface side wire 31A, the intermediate connection electrode 42, the first back surface side wire 32A and the back surface side connection electrode 43.

A first electrode 61A of the one semiconductor light emitting element 60A is connected to the second wire 22 by the lead wire WA. As such, the first electrode 61A is electrically connected to the first external electrode 51 by the second wire 22, the main surface side connection electrode 41, the second main surface side wire 31B, the intermediate connection electrode 42, the second back surface side wire 32B and the back surface side connection electrode 43.

A second electrode 62A of the another semiconductor light emitting element 60A is electrically connected to the third wire 23 by the electrically conductive bonding material SD1. As such, the second electrode 62A is electrically connected to the third external electrode 53 by the third wire 23, the main surface side connection electrode 41, the third main surface side wire 31C, the intermediate connection electrode 42, the third back surface side wire 32C and the back surface side connection electrode 43.

A first electrode 61A of the another semiconductor light emitting element 60A is connected to the fourth wire 24 by the lead wire WA. As such, the first electrode 61A is electrically connected to the second external electrode 52 by the fourth wire 24, the main surface side connection electrode 41, the fourth main surface side wire 31D, the intermediate connection electrode 42, the fourth back surface side wire 32D and the back surface side connection electrode 43. Moreover, the configuration of the wiring layer 20 in FIG. 38 may also be applied to the second embodiment.

Figure 39:
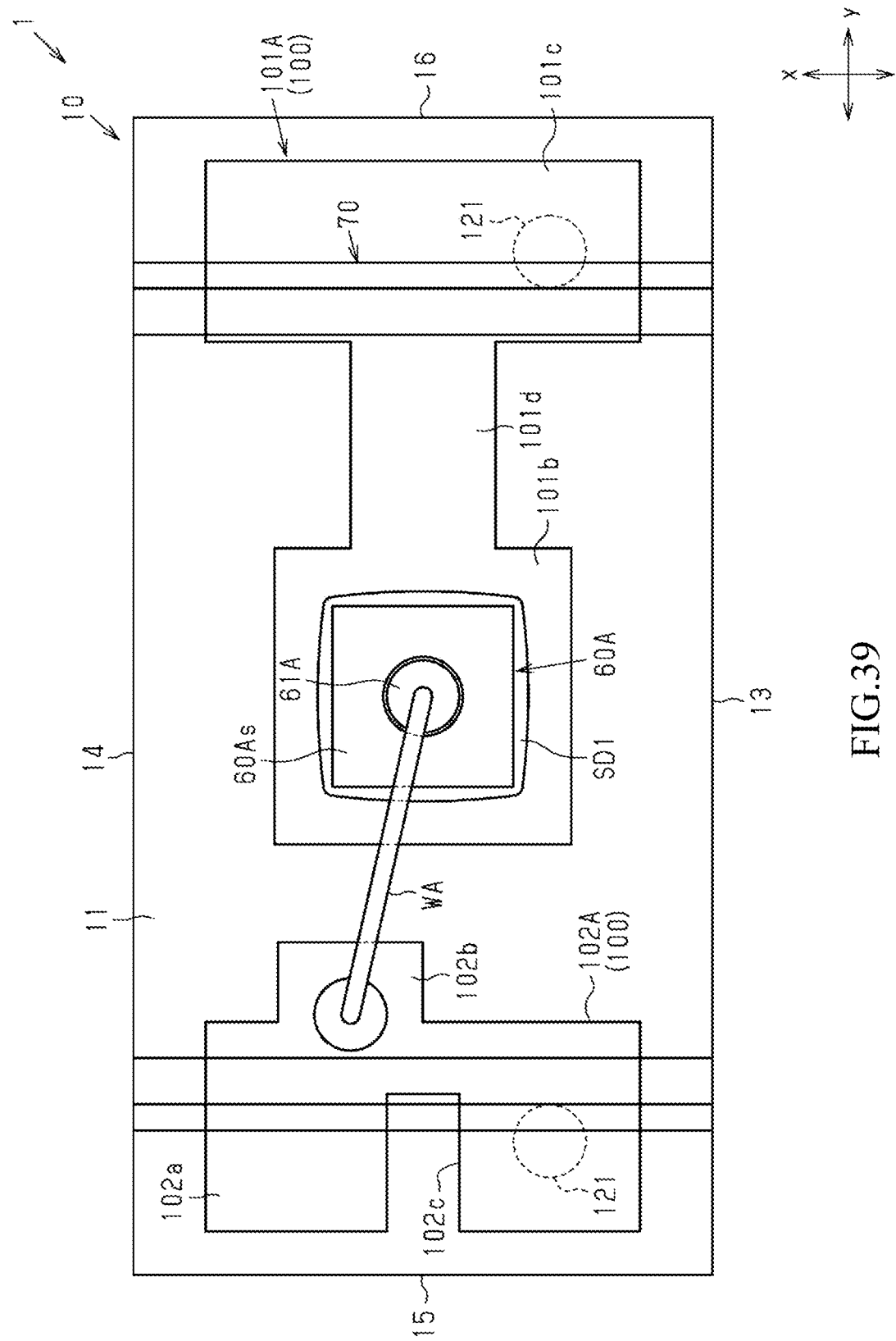
FIG. 39 is a top view of a semiconductor light emitting device according to a variation example.

In the third embodiment, for example, as shown in FIG. 39, the semiconductor light emitting element 60A may be used instead of the semiconductor light emitting element 60C. In this case, the configuration of the wiring layer 100 may be modified, as shown in FIG. 39. More specifically, the wiring layer 100 has a first wire 101A on which the semiconductor light emitting 60A is mounted, and a second wire 102A electrically connected to the semiconductor light emitting element 60A.

The first wire 102 is arranged closer to the second side surface 16 with respect to the second wire 102A in the main surface 11 of the multilayer substrate 10. The first wire 101A has an element mounting portion 101b, a connection wire portion 101c, and a connection portion 101d that connects the element mounting portion 101b and the connection wire portion 101c. The element mounting portion 101b is a portion on which the semiconductor light emitting element 60A is mounted, and is disposed at the center of the main surface 11 in the x direction and in the y direction. The connection wire portion 101c is a portion electrically connected to the first main surface side wire 111A by the main surface side connection electrode 121, and is disposed, between two end portions of the main surface 11 in the y direction, the end portion close to the second side surface 16.

The connection portion 101d is disposed between the element mounting portion 101b and the connection wire portion 101c in they direction, and extends in the y direction.

The second electrode 62A (referring 5) formed at the element back surface 60Ar of the semiconductor light emitting element 60A is electrically connected to the first wire 101A by the electrically conductive bonding material SD1. As such, the second electrode 62A is electrically connected to the first external electrode 131 by the first wire 21, the main surface side connection electrode 121, the first main surface side wire 111A, the intermediate connection electrode 122, the first back surface side wire 112A and the back surface side connection electrode 123.

The second wire 102A is disposed, between two end portions of the main surface 11 in they direction, the end portion close to the first side surface 15. The second wire 102A has a connection wire portion 102a, and a lead wire connection portion 102b extending from the connection wire portion 102a toward the y direction.

The connection wire portion 102a is a portion connected to the second conductive layer 112 by the main surface side connection electrode 121. Similar to the recess 101a of the first wire 101A of the third embodiment, a recess 102c is formed at the connection wire portion 102a.

The first electrode 61A of the semiconductor light emitting element 60A is connected to the lead wire connection portion 102b by the lead wire WA. As such, the first electrode 61A is electrically connected to the second external electrode 132 by the second wire 102A, the main surface side connection electrode 121, the second main surface side wire 111B, the intermediate connection electrode 122, the second back surface side wire 112B and the back surface side connection electrode 123. In addition, the semiconductor light emitting element 60B may be used instead of the semiconductor light emitting element 60C.

In the second embodiment, the positions of the intermediate connection electrodes 42A and 42B of the multilayer substrate 10 may be modified as desired. In one example, when observed in the z direction, if the intermediate connection electrode 42A is located at a position coinciding with the fourth external electrode 54, it may also be disposed apart from the second side surface 16. Moreover, when observed in the z direction, if the intermediate connection electrode 42B is located at a position coinciding with the first external electrode 51, it may also be disposed apart from the first side surface 15. Moreover, in one example, the intermediate connection electrode 42A may further be configured as also being exposed from the second side surface 16. The intermediate connection electrode 42B may further be configured as also being exposed from the first side surface 15.

In the third embodiment, the lengths of the conductive exposed portions 111Aa and 112Aa in the x direction may also be less than ½ of the length of the multilayer substrate 10 in the x direction. Moreover, the lengths of the conductive exposed portions 111Ba and 112Ba in the x direction may also be less than ½ of the length of the multilayer substrate 10 in the x direction.

In the third embodiment, both the length of the conductive exposed portion 111Aa in the y direction and the length of the conductive exposed portion 112Aa in the y direction may also be more than the length of the first external electrode 131 in the y direction. Moreover, both the length of the conductive exposed portion 111Ba in the y direction and the length of the conductive exposed portion 112Ba in the y direction may also be more than the length of the second external electrode 132 in the y direction.

In the third embodiment, the length of the conductive exposed portion 111Aa in the x direction and the length of the conductive exposed portion 112Aa in the x direction may be modified as desired. In one embodiment, the length of the conductive exposed portion 111Aa in the x direction may be different from the length of the conductive exposed portion 112Aa in the x direction. Moreover, the length of the conductive exposed portion 111Ba in the x direction and the length of the conductive exposed portion 112Ba in the x direction may be modified as desired. In one example, the length of the conductive exposed portion 111Ba in the x direction may be different from the length of the conductive exposed portion 112Ba in the x direction.

In the third embodiment, the length of the conductive exposed portion 111Aa in the y direction and the length of the conductive exposed portion 112Aa in the y direction may be modified as desired. In one example, the length of the conductive exposed portion 111Aa in the y direction may be different from the length of the conductive exposed portion 112Aa in the y direction. Moreover, the length of the conductive exposed portion 111Ba in the y direction and the length of the conductive exposed portion 112Ba in the y direction may be modified as desired. In one example, the length of the conductive exposed portion 111Ba in the y direction may be different from the length of the conductive exposed portion 112Ba in they direction. As such, the length of the conductive exposed portion 111Aa in the y direction may also be different from the length of the conductive exposed portion 112Aa in the y direction. The length of the conductive exposed portion 111Ba in the y direction may also be different from the length of the conductive exposed portion 112Ba in they direction.

In the embodiments, at least one of the first conductive layer 31 (111) and the second conductive layer 32 (112) may be not exposed from the anti-mounting surface 14.

In the embodiments, at least one of the first conductive layer 31 (111) and the second conductive layer 32 (112) may be not exposed from both the first side surface 15 and the second side surface 16.

In the first and second embodiments, at least one of the inner conductive exposed portions 35sb, 35rb, 36sb and 36rb may be omitted. Moreover, at least one of the portions of the outer conductive exposed portions 33s, 33r, 34s and 34 r exposed from the mounting surface 13 may be omitted. For example, the conductive layers 31 and 32 may be the multilayer substrate not exposed from the mounting surface 13. In this case, the conductive layers 31 and 32 are exposed from the first side surface 15 and the second side surface 16. That is to say, each of the conductive layers 15 and 16 has a conductive exposed portion exposed from the first side surface 15 and the second side surface 16. The end edge of the conductive, at the side of the mounting surface 13, exposed portion exposed from the first side surface 15 and the second side surface 16 extends in a direction away from the mounting surface 13. In addition, one of the conductive layers 31 and 32 may be omitted.

In the second embodiment, the outer conductive exposed portions 33s, 33r, 34s and 34r, and the inner conductive exposed portions 35sb, 35rb, 36sb and 36rb may be omitted. In this case, the intermediate connection electrodes 42A and 42B exposed from the mounting surface 13 are bonded to the upper surface P11 of the circuit substrate P10 by the electrically conductive bonding material SD1. Similar to the second embodiment, the intermediate connection electrode 42A and 42B are covered by the first substrate 10A in the z direction. Moreover, the intermediate connection electrode 42A and 42B are covered by the second substrate 10B in the z direction.

In the third embodiment, the conductive exposed portions 111Aa and 112Aa and the conductive exposed portions 111Ba and 112Ba may also be not exposed from the mounting surface 13. The conductive exposed portions 111Aa and 112Aa are exposed from the first side surface 15, and the conductive exposed portions 111Ba and 112Ba are exposed from the second side surface 16.

In the embodiments, one of the first conductive layer 31 (111) and the second conductive layer 32 (112) may be omitted.

In the embodiments, the number of the substrates and the number of conductive layers of the multilayer substrate 10 may be modified as desired. In an example, the multilayer substrate 10 may be a layered structure of the first substrate 10A, the second substrate 10B, and the conductive layer formed between the first substrate 10A and the second substrate 10B.

Figure 40:
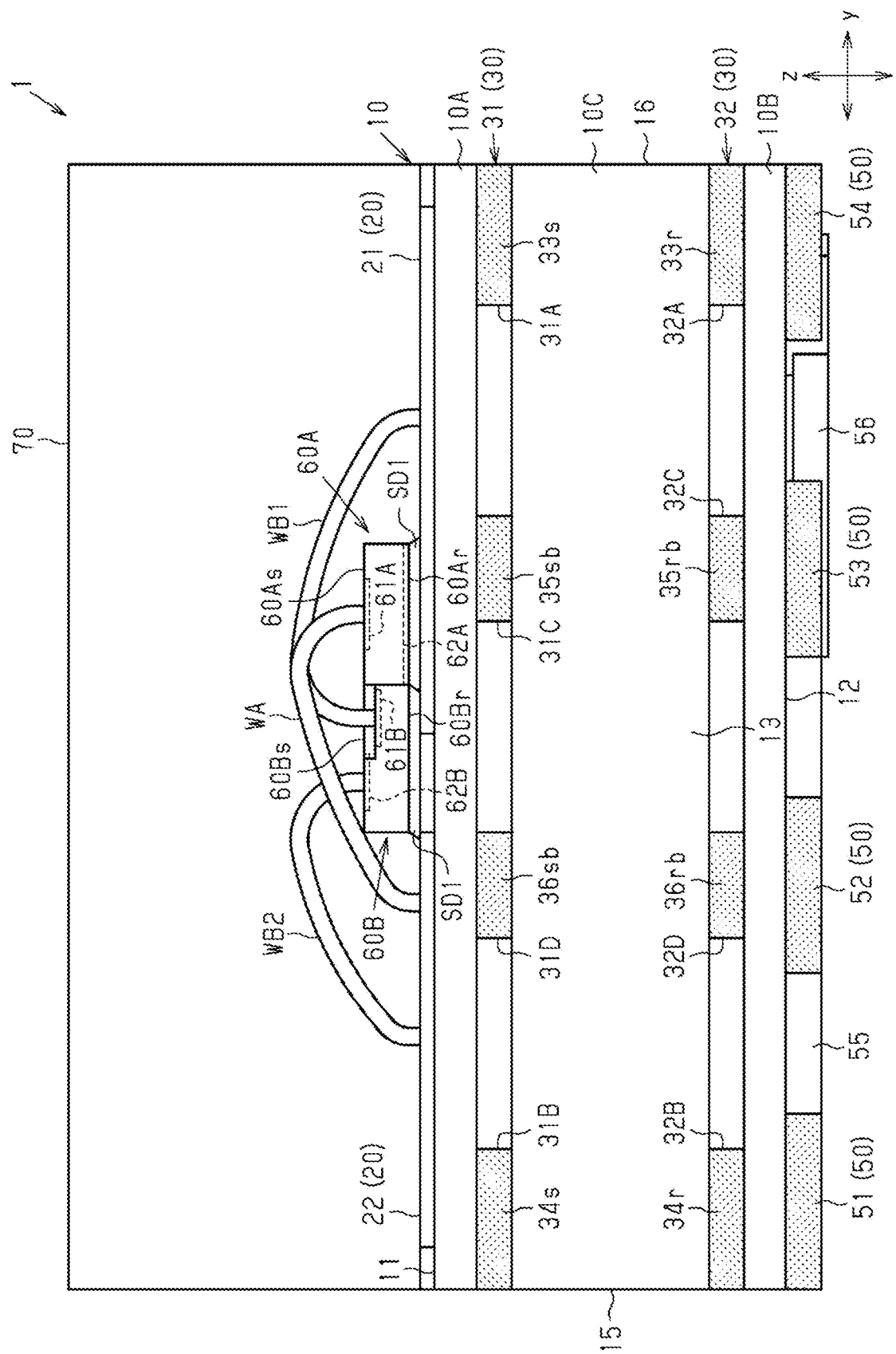
FIG. 40 is a side view of a semiconductor light emitting device according to a variation example.

In the embodiments, when observed in the z direction, the sealing resin is formed separately from both the first side surface 15 and the second side surface 16, that is to say, the sealing resin 70 is formed, for example but not limited to, to cover a portion of the main surface 11. In one example, as shown in FIG. 40, the sealing resin 70 may be formed to cover the entire main surface 11. In the example shown, when observed from the mounting plane 13, the shape of sealing resin 70 is a rectangle regarding the y direction as the lengthwise direction and the z direction as the widthwise direction.

In the first and second embodiments, the semiconductor light emitting element 60B is mounted on the second mounting portion 21b by an adhesive including such as an epoxy resin. The adhesive may be electrically conductive or non-electrically conductive.

[Notes]

The technical concepts that are conceivable based on the embodiments and the variation examples are recoded in the description below.

(Note A1)

A semiconductor light emitting device, comprising:
a multilayer substrate having a plurality of substrates and a conductive layer; and
a semiconductor light emitting element;
wherein the multilayer substrate has:
  a main surface on which the semiconductor light emitting element is mounted;
  a back surface facing an opposite side of the main surface and having an external electrode formed thereon; and
  a mounting surface intersecting both the main surface and the back surface;
wherein the conductive layer includes a conductive exposed portion exposed from the mounting surface and disposed apart from the main surface and the back surface in the thickness direction of the multilayer substrate.

(Note A2)

The semiconductor light emitting device of note A1, wherein the multilayer substrate has a side surface that intersects the main surface, the back surface, and the mounting surface,
- the conductive exposed portion is exposed from the mounting surface and the side surface, and
- a portion of the conductive exposed portion exposed from the mounting surface is connected to a portion exposed from the side surface.

(Note A3)

The semiconductor light emitting device of note A2, wherein the portion of the conductive exposed portion exposed from the side surface is flush with the side surface.

(Note A4)

The semiconductor light emitting device of note A2 or A3, wherein the multilayer substrate includes a first substrate having the main surface, a second substrate having the back surface, and a third substrate arranged between the first substrate and the second substrate in the thickness direction of the multilayer substrate, and
- the conductive layer includes a first conductive layer formed between the first substrate and the second substrate, and a second conductive layer formed between the second substrate and the third substrate,
- the first conductive layer has a first conductive exposed portion exposed from the mounting surface and the side surface, and
- the second conductive layer has a second conductive exposed portion exposed from the mounting surface and the side surface.

(Note B1)

A semiconductor light emitting device including a multilayer substrate having a plurality of substrates and a conductive layer; and
- a semiconductor light emitting element;
- wherein the multilayer substrate has:
  - a main surface on which the semiconductor light emitting element is mounted;
  - a back surface facing an opposite side of the main surface and having an external electrode formed thereon; and
  - a mounting surface intersecting both the main surface and the back surface;
  - a side surface intersecting the main surface, the back surface and the mounting surface;
- the plurality of conductive layers have a conductive exposed portion exposed from the side surface, and
- the conductive exposed portion extends from an end edge of the side surface on a side of the mounting surface in a direction away from the mounting surface.

(Note B2)

The semiconductor light emitting device of note B1, wherein the conductive exposed portion is flush with the side surface.

(Note B3)

The semiconductor light emitting device of note B1 or B2, wherein the multilayer substrate includes a first substrate having the main surface, a second substrate having the back surface, and a third substrate arranged between the first substrate and the second substrate in the thickness direction of the multilayer substrate,
- the conductive layer includes a first conductive layer formed between the first substrate and the second substrate, and a second conductive layer formed between the second substrate and the third substrate,
- the first conductive layer has a first conductive exposed portion exposed from the side surface, and
- the second conductive layer has a second conductive exposed portion exposed from the side surface.

(Note C1)

A semiconductor light emitting device, being a side-type view semiconductor light emitting device, including a multilayer substrate having the plurality of substrates and a conductive layer formed between the plurality of substrates; and a semiconductor light emitting element; wherein,
- the conductive layer is formed in plural and disposed apart in a thickness direction of the multilayer substrate;
- wherein the multilayer substrate has:
  - a main surface on which the semiconductor light emitting element is mounted;
  - a back surface facing an opposite side of the main surface and having an external electrode formed thereon; and
  - a mounting surface intersecting both the main surface and the back surface;
  - a connection electrode connecting the plurality of conductive layers in the thickness direction of the multilayer substrate; and wherein the connection electrode is covered by the substrate of the plurality of substrates that forms the main surface in the thickness direction of the multilayer substrate, and is exposed from the mounting surface.

(Note C2)

The semiconductor light emitting device of note C1, wherein the connection electrode is semi-circular when observed in the thickness direction of the multilayer substrate.

(Note C3)

The semiconductor light emitting device of note C1 or C2, wherein the connection electrode is covered by the substrate of the plurality of substrates that forms the back surface in the thickness direction of the multilayer substrate.

The invention claimed is:

1. A semiconductor light emitting device, comprising:
a multilayer substrate having a plurality of substrates and a conductive layer; and
a semiconductor light emitting element,
wherein the multilayer substrate has:
a main surface on which the semiconductor light emitting element is mounted;
a back surface facing an opposite side of the main surface and having an external electrode formed thereon; and
a mounting surface intersecting the main surface and the back surface,
wherein the conductive layer includes a conductive exposed portion exposed from the mounting surface and disposed apart from the main surface and the back surface in a thickness direction of the multilayer substrate,
wherein the conductive exposed portion, when viewed from the mounting surface, is arranged in plural form, and the plurality of conductive exposed portions are arranged in rows that are aligned with each other in the thickness direction of the multilayer substrate.

2. The semiconductor light emitting device of claim 1, wherein the conductive exposed portion are separated from each other in a direction orthogonal to the thickness direction of the multilayer substrate.

3. The semiconductor light emitting device of claim 2, wherein the external electrode is arranged in plural form, and when an arrangement direction of the plurality of conductive exposed portions is defined as a first direction, the plurality of external electrodes are arranged apart from each other in the first direction, and wherein the first direction is viewed from the mounting surface, the plurality of conductive exposed portions and the plurality of external electrodes are aligned with each other.

4. The semiconductor light emitting device of claim 3, wherein a length of each of the plurality of conductive exposed portions in the first direction is less than a length of each of the plurality of external electrodes in the first direction.

5. The semiconductor light emitting device of claim 4, wherein the plurality of conductive exposed portions include an outer conductive exposed portion arranged at an end portion of the mounting surface in the first direction and an inner conductive exposed portion arranged inside of the mounting surface with respect to the outer conductive exposed portion, and wherein a length of the inner conductive exposed portion in the first direction is less than a length of the outer conductive exposed portion in the first direction.

6. The semiconductor light emitting device of claim 5, wherein the multilayer substrate has a side surface that intersects the main surface, the back surface, and the mounting surface, and the outer conductive exposed portion is exposed from both the mounting surface and the side surface.

7. The semiconductor light emitting device of claim 1, wherein a surface facing an opposite side to the mounting surface is designated as an anti-mounting surface, and the conductive layer has an opposite conductive exposed portion exposed from the anti-mounting surface, and wherein an exposing pattern of the opposite conductive exposed portion is different from an exposing pattern of the conductive exposed portion.

8. The semiconductor light emitting device of claim 1, wherein the multilayer substrate includes a first substrate having the main surface, a second substrate having the back surface, and a third substrate arranged between the first substrate and the second substrate in the thickness direction of the multilayer substrate, and wherein the conductive layer is at least formed between the first substrate and the second substrate or between the second substrate and the third substrate.

9. The semiconductor light emitting device of claim 8, wherein the conductive layer includes a first conductive layer formed between the first substrate and the second substrate, and a second conductive layer formed between the second substrate and the third substrate, and wherein the first conductive layer has a first conductive exposed portion exposed from the mounting surface, and the second conductive layer has a second conductive exposed portion exposed from the mounting surface.

10. The semiconductor light emitting device of claim 9, wherein when viewed from the mounting surface, each of the plurality of first conductive exposed portions and each of the plurality of second conductive exposed portions are aligned with each other in the thickness direction of the multilayer substrate and separated from each other in the direction orthogonal to the thickness direction of the multilayer substrate, and when an arrangement direction of the plurality of first conductive exposed portions is defined as the first direction, the external electrode, the plurality of first conductive exposed portions, and the plurality of second conductive exposed portions are aligned with each other in the first direction.

11. The semiconductor light emitting device of claim 9, wherein the multilayer substrate includes a connection electrode that penetrates the third substrate in the thickness direction of the multilayer substrate and connects the first conductive layer and the second conductive layer, and wherein an end portion of the connection electrode in the thickness direction of the multilayer substrate is formed at a position away from the main surface, and the first substrate is provided to cover the connection electrode in the thickness direction of the multilayer substrate.

12. The semiconductor light emitting device of claim 11, wherein the connection electrode is exposed from the mounting surface.

13. The semiconductor light emitting device of claim 1, wherein a wiring layer to which the semiconductor light emitting elements is electrically connected is formed on the main surface, and the wiring layer is arranged at a position of the main surface away from the mounting surface when viewed from the thickness direction of the multilayer substrate.

14. The semiconductor light emitting device of claim 1, wherein the conductive exposed portion is formed to be flush with the mounting surface.

15. The semiconductor light emitting device of claim 1, wherein when the semiconductor light emitting element is in singular form, the conductive exposed portion is provided at both ends of the mounting surface in a first direction orthogonal to the thickness direction of the multilayer substrate in a state of being aligned with each other in the thickness direction of the multilayer substrate when viewed from the mounting surface,
  wherein when a surface intersecting the main surface, the back surface, and the mounting surface is a side surface, the conductive exposed portion is exposed from the mounting surface and the side surface, and a portion of the respective conductive exposed portion exposed from the side surface is designated as a side surface exposed portion,
  and wherein when a direction orthogonal to both the thickness direction of the multilayer substrate and the first direction is defined as a second direction, the side surface exposed portion extends from the mounting surface to a position away from the mounting surface from a center of the side surface in the second direction.

16. The semiconductor light emitting device of claim 1, wherein the semiconductor light emitting element is arranged in plural form, and each of the semiconductor light emitting elements is mounted on the main surface.

17. A semiconductor light emitting device, comprising:
  a multilayer substrate having a plurality of substrates and a conductive layer; and
  a semiconductor light emitting element,
    wherein the multilayer substrate has:
      a main surface on which the semiconductor light emitting element is mounted;
      a back surface facing an opposite side of the main surface and having an external electrode formed thereon; and
      a mounting surface intersecting the main surface and the back surface,
      wherein the conductive layer includes a conductive exposed portion exposed from the mounting surface and disposed apart from the main surface and the back surface in a thickness direction of the multilayer substrate, wherein the multilayer substrate has a side surface that intersects the main surface, the back surface, and the mounting surface, and at least one conductive exposed portion is exposed from both the mounting surface and the side surface.

\* \* \* \* \*